(12) United States Patent
An et al.

(10) Patent No.: US 12,057,066 B2
(45) Date of Patent: Aug. 6, 2024

(54) DISPLAY APPARATUS

(71) Applicant: Samsung Display Co., Ltd., Yongin-si (KR)

(72) Inventors: Jinsung An, Yongin-si (KR); Sungho Kim, Yongin-si (KR); Seokje Seong, Yongin-si (KR); Minwoo Woo, Yongin-si (KR); Wangwoo Lee, Yongin-si (KR); Jiseon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 33 days.

(21) Appl. No.: 17/581,975

(22) Filed: Jan. 23, 2022

(65) Prior Publication Data

US 2022/0366847 A1 Nov. 17, 2022

(30) Foreign Application Priority Data

May 12, 2021 (KR) .......................... 10-2021-0061641

(51) Int. Cl.
*G09G 3/3233* (2016.01)
*G09G 3/3266* (2016.01)
*G09G 3/3283* (2016.01)
*H10K 59/131* (2023.01)

(52) U.S. Cl.
CPC .......... *G09G 3/3233* (2013.01); *H10K 59/131* (2023.02); *G09G 3/3266* (2013.01); *G09G 3/3283* (2013.01); *G09G 2300/0842* (2013.01); *G09G 2310/08* (2013.01); *G09G 2340/0407* (2013.01)

(58) Field of Classification Search
None
See application file for complete search history.

(56) References Cited

U.S. PATENT DOCUMENTS

| 8,711,138 B2 | 4/2014 | Kawabe |
| 10,964,771 B2 * | 3/2021 | Lee ...................... G09G 3/3233 |

(Continued)

FOREIGN PATENT DOCUMENTS

| KR | 10-2016-0052943 | 5/2016 |
| KR | 10-2020-0066502 | 6/2020 |
| KR | 10-2020-0097371 | 8/2020 |

*Primary Examiner* — Andre L Matthews
(74) *Attorney, Agent, or Firm* — KILE PARK REED & HOUTTEMAN PLLC

(57) ABSTRACT

A display apparatus that prevents visual recognition of flickering in each of display areas having different resolutions includes a first pixel circuit, a first display element, a second pixel circuit, and a second display element. The first pixel circuit includes: a first driving transistor configured to control a first current that flows to the first display element; and a first initializing transistor configured to apply a first initializing voltage to a gate of the first driving transistor in response to a first scan signal. The second pixel circuit includes: a second driving transistor configured to control a second current that flows to the second display element; and a second initializing transistor configured to apply a second initializing voltage having a level different from a level of the first initializing voltage to a gate of the second driving transistor in response to the first scan signal.

35 Claims, 25 Drawing Sheets

(56) References Cited

U.S. PATENT DOCUMENTS

| | | | |
|---|---|---|---|
| 11,641,769 B2* | 5/2023 | Cha | H01L 29/7869 |
| | | | 257/40 |
| 11,706,957 B2* | 7/2023 | Kim | H10K 59/131 |
| | | | 257/40 |
| 2016/0125809 A1 | 5/2016 | Hwang | |
| 2018/0075804 A1* | 3/2018 | Kim | G09G 3/3233 |
| 2019/0114966 A1* | 4/2019 | Park | G09G 3/3233 |
| 2020/0176527 A1 | 6/2020 | An et al. | |
| 2020/0258967 A1 | 8/2020 | Kim et al. | |
| 2021/0305349 A1* | 9/2021 | Kwon | H10K 59/131 |
| 2021/0391407 A1* | 12/2021 | Yoon | G06F 3/0412 |
| 2022/0173205 A1* | 6/2022 | Cha | H10K 59/131 |

\* cited by examiner

DISPLAY APPARATUS

CROSS-REFERENCE TO RELATED APPLICATION

This application claims priority from and the benefit of Korean Patent Application No. 10-2021-0061641, filed on May 12, 2021, which is hereby incorporated by reference for all purposes as if fully set forth herein.

BACKGROUND

Field

Embodiments of the invention relate generally to a display apparatus.

Discussion of the Background

General display apparatuses include a display element and electronic devices for controlling an electrical signal applied to the display element. Electronic devices include a thin-film transistor (TFT), a storage capacitor, and a plurality of lines for providing voltage and current to various components within the electronic devices.

Applications of display apparatuses have recently diversified. Moreover, since display apparatuses have become smaller, thinner and lighter, their range of use has expanded. As the usage of display apparatuses has diversified, various methods of designing the shapes of display apparatuses have been studied.

The above information disclosed in this Background section is only for understanding of the background of the inventive concepts, and, therefore, it may contain information that does not constitute prior art.

SUMMARY

Devices constructed according to illustrative implementations of the invention are capable of improving the display quality of a display apparatus having plural display areas having different image resolution capabilities.

One or more embodiments include a display apparatus that prevents visual recognition of flickering in each of plural display areas having different resolutions.

Additional features of the inventive concepts will be set forth in the description that follows, and in part will be apparent from the description, or may be learned by practice of the inventive concepts.

According to one or more embodiments, a display apparatus includes a first pixel circuit, a first display element connected to the first pixel circuit, a second pixel circuit, and a second display element connected to the second pixel circuit. The first pixel circuit includes a first driving transistor configured to control a first current that flows to the first display element, and a first initializing transistor configured to apply a first initializing voltage to a gate of the first driving transistor in response to a first scan signal. The second pixel circuit includes a second driving transistor configured to control a second current that flows to the second display element, and a second initializing transistor configured to apply a second initializing voltage having a level different from a level of the first initializing voltage to a gate of the second driving transistor in response to the first scan signal.

A level of the first initializing voltage may be higher than a level of the second initializing voltage.

The first pixel circuit may further include a third initializing transistor configured to apply a third initializing voltage to an anode of the first display element in response to a second scan signal, and the second pixel circuit may further include a fourth initializing transistor configured to apply a fourth initializing voltage to an anode of the second display element in response to the second scan signal.

A level of the third initializing voltage may be higher than a level of the fourth initializing voltage.

The first pixel circuit may further include a first scan transistor configured to transmit a first data voltage to the first driving transistor in response to a third scan signal, a first storage capacitor having a first electrode and a second electrode, the second electrode being connected to the gate of the first driving transistor, and a first compensating transistor configured to connect a drain of the first driving transistor to the gate of the first driving transistor in response to a fourth scan signal. The second pixel circuit may further include a second scan transistor configured to transmit a second data voltage to the second driving transistor in response to the third scan signal, a second storage capacitor having a third electrode and a fourth electrode, the fourth electrode being connected to the gate of the second driving transistor, and a second compensating transistor configured to connect a drain of the second driving transistor to the gate of the second driving transistor in response to the fourth scan signal.

Conductivity types of the first compensating transistor and the second compensating transistor may be opposite to conductivity types of the first scan transistor and the second scan transistor, and may be identical to conductivity types of the first initializing transistor and the second initializing transistor.

The third scan signal and the fourth scan signal may be substantially synchronized with each other.

Conductivity types of the first initializing transistor and the second initializing transistor may be opposite to conductivity types of the first driving transistor and the second driving transistor.

An emission area of the second display element may be greater than an emission area of the first display element.

The first display element and the second display element may each be provided in plurality, and the number of first display elements per unit area may be greater than the number of second display elements per unit area.

The display apparatus may further include a substrate in which a first area and a second area are defined, the second area being at least partially surrounded by the first area, a first voltage line at least partially overlapping the first area and configured to transmit the first initializing voltage to the first pixel circuit, and a second voltage line at least partially overlapping the first area and the second area and configured to transmit the second initializing voltage to the second pixel circuit. The first voltage line may extend in a row direction and may have a first portion and a second portion physically spaced apart from each other by the second area.

The second voltage line may include a first portion surrounding at least a portion of the second area, and a second portion connected to the first portion and extending in a row direction. The first portion of the second voltage line may overlap the first area, and the second portion of the second voltage line may overlap the second area.

The display apparatus may further include a third pixel circuit and a third display element connected to the third pixel circuit. The third pixel circuit may include a third driving transistor configured to control a third current that flows to the third display element, and a third initializing transistor configured to apply the second initializing voltage to a gate of the third driving transistor in response to the first scan signal. In a plan view, the second pixel circuit and the second display element may be spaced apart from each other, and the third pixel circuit and the third display element may at least partially overlap each other.

The display apparatus may further include a substrate in which a first area and a second area at least partially surrounded by the first area are defined. The second area may include a component area and a middle area, the middle area being located between the first area and the component area. The first pixel circuit and the first display element may be arranged on the first area. The second display element may be arranged on the component area of the second area. The second pixel circuit, the third pixel circuit, and the third display element may be arranged on the middle area of the second area.

The first pixel circuit may further include a fourth initializing transistor configured to apply a third initializing voltage to an anode of the first display element in response to a second scan signal. The second pixel circuit may further include a fifth initializing transistor configured to apply a fourth initializing voltage to an anode of the second display element in response to the second scan signal. The third pixel circuit may further include a sixth initializing transistor configured to apply the fourth initializing voltage to an anode of the third display element in response to the second scan signal.

The level of the third initializing voltage may be higher than the level of the fourth initializing voltage.

An emission area of the third display element may be equal to an emission area of the second display element, and the emission area of the third display element may be greater than an emission area of the first display element.

The first display element, the second display element, and the third display element may each be provided in plurality. The number of second display elements per unit area may be equal to the number of third display elements per unit area, and the number of first display elements per unit area may be greater than the number of second display elements per unit area.

The display apparatus may further include a substrate in which a first display area, second display areas located on both sides of the first display area in a row direction, and a peripheral area around the first and second display areas are defined, a pad portion arranged in the peripheral area and including a plurality of first pads and a plurality of second pads, a plurality of first data lines each extending on the first display area in a column direction and connected to the plurality of first pads, respectively, a plurality of second data lines each extending on the second display areas in the column direction, a plurality of auxiliary row lines each extending on the first display area and the second display areas in the row direction, and a plurality of auxiliary column lines each extending on the first display area and the second display areas in the column direction. A first set of the plurality of auxiliary column lines may have first column connection portions respectively connected to the plurality of second pads. A first set of the plurality of auxiliary row lines may have first row connection portions respectively connecting the first column connection portions of the first auxiliary column lines to the plurality of second data lines. The second initializing voltage may be applied to at least a second set of the plurality of auxiliary row lines, and a driving voltage may be applied to a second set of the plurality of auxiliary column lines.

The second initializing voltage may be applied to a first subset (i.e., 2-1)$^{st}$ of the second set of the plurality of auxiliary row lines and the driving voltage may be applied to a second subset (i.e., 2-2)$^{nd}$ of the second set of the plurality of auxiliary row lines.

The first set of the plurality of auxiliary column lines may have second column connection portions to which the driving voltage is applied, respectively, and the second column connection portions of the first set of the plurality of auxiliary column lines may be spaced apart from the first column connection portions of the first set of the plurality of auxiliary column lines, respectively.

The first set of the plurality of auxiliary row lines may have second row connection portions to which the driving voltage is applied, respectively, and the second row connection portions of the first set of the plurality of auxiliary row lines may be spaced apart from the first row connection portions of the first set of the plurality of auxiliary row lines, respectively.

According to one or more embodiments, a display apparatus includes a first pixel circuit, a first display element connected to the first pixel circuit, a second pixel circuit, and a second display element connected to the second pixel circuit. The first pixel circuit may include a first initializing transistor configured to apply a first initializing voltage to an anode of the first display element in response to a first scan signal, and the second pixel circuit may include a second initializing transistor configured to apply a second initializing voltage to an anode of the second display element in response to the first scan signal.

A level of the first initializing voltage may be higher than a level of the second initializing voltage.

The first pixel circuit may further include a first driving transistor configured to control a first current that flows to the first display element, a first scan transistor configured to transmit a first data voltage to the first driving transistor in response to a second scan signal, and a first storage capacitor having a first electrode and a second electrode, the second electrode being connected to a gate of the first driving transistor. The second pixel circuit may further include a second driving transistor configured to control a second current that flows to the second display element, a second scan transistor configured to transmit a second data voltage to the second driving transistor in response to the second scan signal, and a second storage capacitor having a third electrode and a fourth electrode, the fourth electrode being connected to a gate of the second driving transistor.

An emission area of the second display element may be greater than an emission area of the first display element.

The first display element, the second display element, and the third display element may each be provided in plurality, and the number of first display elements per unit area is greater than the number of second display elements per unit area.

The display apparatus may further include a substrate in which a first area and a second area at least partially surrounded by the first area are defined, a first voltage line at least partially overlapping the first area and configured to transmit the first initializing voltage to the first pixel circuit, and a second voltage line at least partially overlapping the first area and the second area and configured to transmit the second initializing voltage to the second pixel circuit. The first voltage line may extend in a row direction and may have a first portion and a second portion physically spaced apart from each other by the second area.

The second voltage line may include a first portion surrounding at least a portion of the second area, and a second portion connected to the first portion and extending in a row direction. The first portion of the second voltage line may overlap the first area, and the second portion of the second voltage line may overlap the second area.

The display apparatus may further include a third pixel circuit, and a third display element connected to the third pixel circuit. The third pixel circuit may include a third initializing transistor configured to apply the second initializing voltage to an anode of the third display element in response to the first scan signal. In a plan view, the second pixel circuit and the second display element may be spaced apart from each other, and the third pixel circuit and the third display element may at least partially overlap each other.

The display apparatus may further include a substrate in which a first area and a second area at least partially surrounded by the first area are defined. The second area may include a component area and a middle area, the middle area being located between the first area and the component area. The first pixel circuit and the first display element may be arranged on the first area. The second display element may be arranged on the component area of the second area. The second pixel circuit, the third pixel circuit, and the third display element may be arranged on the middle area of the second area.

An emission area of the third display element may be equal to an emission area of the second display element, and the emission area of the third display element may be greater than an emission area of the first display element.

The first display element, the second display element, and the third display element may each be provided in plurality. The number of second display elements per unit area may be equal to the number of third display elements per unit area, and the number of first display elements per unit area may be greater than the number of second display elements per unit area.

The display apparatus may further include a substrate in which a first display area, second display areas located on both sides of the first display area in a row direction, and a peripheral area around the first and second display areas are defined, a pad portion arranged in the peripheral area and including a plurality of first pads and a plurality of second pads, a plurality of first data lines each extending on the first display area in a column direction and connected to the plurality of first pads, respectively, a plurality of second data lines each extending on the second display areas in the column direction, a plurality of auxiliary row lines each extending on the first display area and the second display areas in the row direction, and a plurality of auxiliary column lines each extending on the first display area and the second display areas in the column direction. A first set of the plurality of auxiliary column lines may have first column connection portions respectively connected to the plurality of second pads. A first set of the plurality of auxiliary row lines may have first row connection portions respectively connecting the first column connection portions of the first set of the plurality of auxiliary column lines to the plurality of second data lines. The second initializing voltage may be applied to at least a second set of the plurality of auxiliary row lines, and a driving voltage may be applied to a second set of the plurality of auxiliary column lines.

The second initializing voltage may be applied to a first subset of the second set of the plurality of auxiliary row lines, and the driving voltage may be applied to a second subset of the second set of the plurality of auxiliary row lines.

The first set of the plurality of auxiliary column lines may have second column connection portions to which the driving voltage is applied, respectively, and the second column connection portions of the first set of the plurality of auxiliary column lines may be spaced apart from the first column connection portions of the first set of the plurality of auxiliary column lines, respectively.

The first set of the plurality of auxiliary row lines may have second row connection portions to which the driving voltage is applied, respectively, and the second row connection portions of the first set of the plurality of auxiliary row lines may be spaced apart from the first row connection portions of the first set of the plurality of auxiliary row lines, respectively.

These general and specific embodiments may be implemented by using a system, a method, a computer program, or a combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
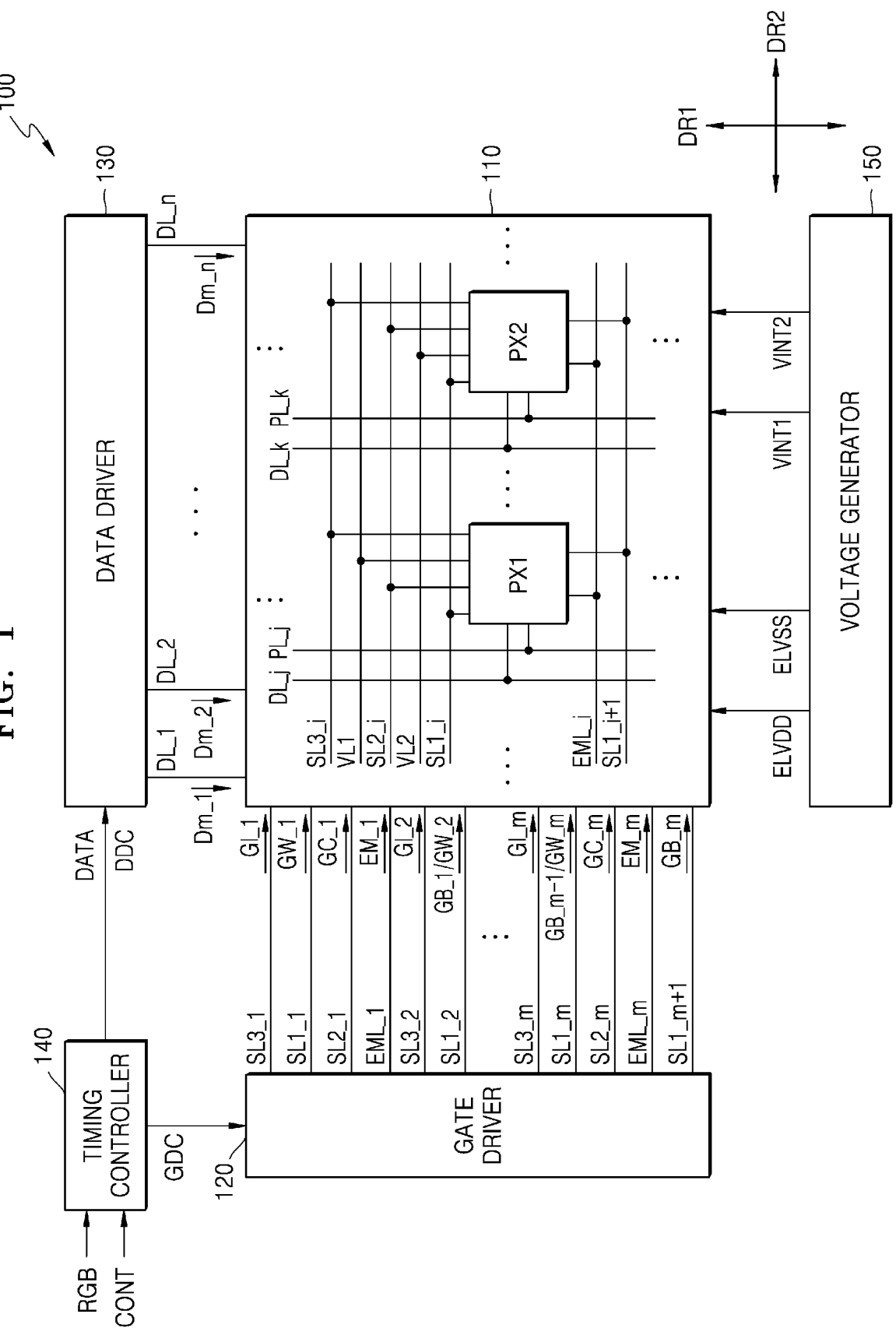
FIG. 1 is a schematic block diagram of a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic block diagram of a display apparatus according to an embodiment that is constructed according to principles of the invention.

The display apparatus may be an organic light-emitting display including a display element of which luminance varies according to a current, for example, an organic light-emitting diode. Alternatively, the display apparatus may be an inorganic light-emitting display or a quantum dot light-emitting display. In other words, an emission layer of the display element of the display apparatus may include an organic material, include an inorganic material, include quantum dots, include an organic material and quantum dots, include an inorganic material and quantum dots, or include an organic material and an inorganic material. A case where the display apparatus is an organic light-emitting display will now be focused on and described.

Referring to FIG. 1, the organic light emitting display 100 includes a display unit 110, a gate driver 120, a data driver 130, a timing controller 140, and a voltage generator 150.

The display unit 110 includes pixels PX including a first pixel PX1 located on an i-th row and a j-th column and a second pixel PX2 located on the i-th row and a k-th column. FIG. 1 illustrates the first pixel PX1 and the second pixel PX2 located on the same row, but m×n pixels PX may be arranged in, for example, a matrix form. Herein, i is a natural number (i.e., a positive integer) in the range of 1 to m, j is a natural number in the range of 1 to n, and k is a natural number in the range of 1 to n.

Each pixel PX including seven transistors and one capacitor is illustrated as an example in FIG. 1. However, the disclosure is equally applicable to not only pixels PX employing this specific pixel circuit but also pixels PX employing another pixel circuit, for example, a pixel circuit including two transistors and one capacitor.

The pixels PX are connected to first scan lines SL1_1 through SL1_$m$+1, second scan lines SL2_1 through SL2_$m$, third scan lines SL3_1 through SL3_$m$, light-emission control lines EML_1 through EML_m, and data lines DL_1 through DL_n. The pixels PX are connected to power lines PL_1 through PL_n and are connected to first voltage lines VL1 or second voltage lines VL2.

For example, as shown in FIG. 1, the first pixel PX1 may be connected to a first scan line SL1_$i$, a second scan line SL2_$i$, a third scan line SL3_$i$, a light-emission control line EML_i, a first data line DL_j, a first power line PL_j, a first voltage line VL1, and a first scan line SL1_$i$+1. The second pixel PX2 may be connected to the first scan line SL1_$i$, the second scan line SL2_$i$, the third scan line SL3_$i$, the light-emission control line EML_i, a second data line DL_k, a second power line PL_k, a second voltage line VL2, and the first scan line SL1_$i$+1. The first scan line SL1_$i$+1 may be referred to as a fourth scan line for the first pixel PX1 and the second pixel PX2.

As another example, the first pixel PX1 may be connected to some of the first scan line SL1_$i$, the second scan line SL2_$i$, the third scan line SL3_$i$, the light-emission control line EML_i, the first data line DL_j, the first power line PL_j, the first voltage line VL1, and the first scan line SL1_$i$+1. For example, the first pixel PX1 may be connected to the first scan line SL1_$i$, the first data line DL_j, and the first power line PL_j. The second pixel PX2 may be connected to some of the first scan line SL1_$i$, the second scan line SL2_$i$, the third scan line SL3_$i$, the light-emission control line EML_i, the second data line DL_k, a second power line PL_k, the second voltage line VL2, and the first scan line SL1_$i$+1. For example, the second pixel PX2 may be connected to the first scan line SL1_$i$, the second data line DL_k, and the second power line PL_k.

The data lines DL_1 through DL_n and the power lines PL_1 through PL_n may each extend in a first direction (or a column direction) DR1 and may be connected to pixels PX located on the same column. The first scan lines SL1_1 through SL1_$m$+1, the second scan lines SL2_1 through SL2_$m$, the third scan lines SL3_1 through SL3_$m$, and the light-emission control lines EML_1 through EML_m may each extend in a second direction (or a row direction) DR2 and may be connected to pixels PX located on the same row.

The first voltage lines VL1 may each extend in the second direction DR2 and may be connected to at least some of the pixels PX located on the same row. The second voltage lines VL2 may each extend in the second direction DR2 and may be connected to at least some of the pixels PX located on the same row. For example, the pixels PX located on the same row may be connected to the first voltage line VL1, or some of the pixels PX located on the same row may be connected to the first voltage line VL1 and the others may be connected to the second voltage line VL2.

According to an embodiment, the pixels PX located on some of the first through m-th rows may be connected to the first voltage lines VL1 each extending in the second direction DR2. Some of the pixels PX located on the others of the first through m-th rows may be connected to the first voltage lines VL1 and the others may be connected to the second voltage lines VL2. In this case, a size (for example, an emission area) of each of the some pixels may be different from a size (for example, an emission area) of each of the other pixels.

The first scan lines SL1_1 through SL1_m transmit first scan signals GW_1 through GW_m output by the gate driver 120 to the pixels PX on the same row, respectively, the second scan lines SL2_1 through SL2_m transmit second scan signals GC_1 through GC_m output by the gate driver 120 to the pixels PX on the same row, respectively, the third scan lines SL3_1 through SL3_m transmit third scan signals GI_1 through GI_m output by the gate driver 120 to the pixels PX on the same row, respectively, and the first scan lines SL1_2 through SL1_m+1 transmit fourth scan signals GB_1 through GB_m output by the gate driver 120 to the pixels PX on the same row, respectively. A first scan signal GW_i and a fourth scan signal GB_i−1 may be identical signals that are transmitted through a first scan line SL1_i.

The light-emission control lines EML_1 through EML_m transmit the light-emission control signals EM_1 through EM_m output by the gate driver 120 to the pixels PX on the same row. The data lines DL_1 through DL_n transmit the data voltage Dm_1 through Dm_n output by the data driver 130 to the pixels PX on the same column. The first pixel PX1 located on an i-th row and a j-th column receives first through fourth scan signals GW_i, GC_i, GI_i, and GB_i, a first data voltage Dm_j, and a light-emission control signal EM_i. The second pixel PX2 located on an i-th row and a k-th column receives the first through fourth scan signals GW_i, GC_i, GI_i, and GB_i, a second data voltage Dm_k, and the light-emission control signal EM_i.

Each of the power lines PL_1 through PL_n transmits a first driving voltage ELVDD output by the voltage generator 150 to the pixels PX on the same column. As another example, the first driving voltage ELVDD may be transmitted to the pixels PX on the same row through power lines each extending in the second direction DR2.

Each of the first voltage lines VL1 transmits a first initializing voltage VINT1 output by the voltage generator 150 to at least some of the pixels PX on the same row. Each of the second voltage lines VL2 transmits a second initializing voltage VINT2 output by the voltage generator 150 to at least some of the pixels PX on the same row.

The first pixel PX1 includes a first display element, and a first driving transistor that controls the magnitude of a first current flowing to the first display element, based on the first data voltage Dm_j. The first data voltage Dm_j is output to the data driver 130 and is received by the first pixel PX1 through the first data line DL_j. The first display element may be, for example, an organic light-emitting diode. The first display element emits light with brightness corresponding to the magnitude of the first current received from the first driving transistor, so that the first pixel PX1 may represent grayscale corresponding to the first data voltage Dm_j.

The second pixel PX2 includes a second display element, and a second driving transistor that controls the magnitude of a second current flowing to the second display element, based on the second data voltage Dm_k. The second data voltage Dm_k is output to the data driver 130 and is received by the second pixel PX2 through the second data line DL_k. The second display element may be, for example, an organic light-emitting diode. The second display element emits light with brightness corresponding to the magnitude of the second current received from the second driving transistor, so that the second pixel PX2 may represent grayscale corresponding to the second data voltage Dm_k.

Each of the first pixel PX1 and the second pixel PX2 may correspond to a portion of a unit pixel capable of displaying a full color, for example, a subpixel. Each of the first pixel PX1 and the second pixel PX2 may further include at least one switching transistor and at least one capacitor.

For example, the first pixel PX1 may include a first gate initializing transistor applying the first initializing voltage VINT1 to a gate of the first driving transistor in response to the third scan signal GI_i. The second pixel PX2 may include a second gate initializing transistor applying the second initializing voltage VINT2 to a gate of the second driving transistor in response to the third scan signal GI_i. Alternatively, the first pixel PX1 may include a first anode initializing transistor applying the first initializing voltage VINT1 to an anode of the first display element in response to the fourth scan signal GB_i. The second pixel PX2 may include a second anode initializing transistor applying the second initializing voltage VINT2 to an anode of the second display element in response to the fourth scan signal GB_i. The first pixel PX1 and the second pixel PX2 will be described in detail below.

The voltage generator 150 may generate voltages necessary for driving the pixels PX. For example, the voltage generator 150 may generate the first driving voltage ELVDD, the second driving voltage ELVSS, the first initializing voltage VINT1, and the second initializing voltage VINT2.

The voltage generator 150 may generate a first gate voltage VGH and a second gate voltage VGL for controlling a switching transistor of each of the pixels PX and may provide the first gate voltage VGH and the second gate voltage VGL to the gate driver 120. A level of the first gate voltage VGH may be higher than that of the second gate voltage VGL. When the switching transistor is a p-type MOSFET, the switching transistor may be turned off when the first gate voltage VGH is applied to a gate of the switching transistor, and the switching transistor may be turned on when the second gate voltage VGL is applied to the gate of the switching transistor. The first gate voltage VGH may be referred to as a turn-off voltage, and the second gate voltage VGL may be referred to as a turn-on voltage. On the other hand, when the switching transistor is an n-type MOSFET, the switching transistor may be turned on when the first gate voltage VGH is applied to the gate of the switching transistor, and the switching transistor may be turned off when the second gate voltage VGL is applied to the gate of the switching transistor. The first gate voltage VGH may be referred to as a turn-on voltage, and the second gate voltage VGL may be referred to as a turn-off voltage. The voltage generator 150 may generate gamma reference voltages and provide the gamma reference voltages to the data driver 130.

The timing controller 140 may control the display unit 110 by controlling operational timings of the gate driver 120 and the data driver 130. The pixels PX of the display unit 110 may receive a new data voltage Dm for each a frame period, and may display an image corresponding to image source data RGB of one frame by emitting light with luminance corresponding to the data voltage Dm.

According to an embodiment, one frame period may include a gate initialization period, a data write and anode initialization period, and an emission period. In the gate initialization period, the first initializing voltage VINT1 or the second initializing voltage VINT2 may be applied to the pixels PX by synchronizing with the third scan signal GI_i. For example, the first initializing voltage VINT1 may be applied to the first pixel PX1 in synchronization with the third scan signal GI_i, and the second initializing voltage VINT2 may be applied to the second pixel PX2. In the data write and anode initialization period, the data voltage Dm may be provided to the pixels PX in synchronization with the first scan signal GW and the second scan signal GC, and the first initializing voltage VINT1 or the second initializing voltage VINT2 may be applied to the pixels PX in synchronization with the fourth scan signal GB. For example, the first data voltage Dm_j and the second data voltage Dm_k may be provided to the first pixel PX1 and the second pixel PX2, respectively, in synchronization with the first scan signal GW_i and the second scan signal GC_i, and the first initializing voltage VINT1 and the second initializing voltage VINT2 may be applied to the first pixel PX1 and the second pixel PX2, respectively, in synchronization with the fourth scan signal GB_i. In the emission period, the pixels PX of the display unit 110 emit light.

The timing controller 140 receives image source data RGB and a control signal CONT from an external source. The timing controller 140 may convert the image source data RGB into image data DATA, based on characteristics of the display unit 110 and the pixels PX. The timing controller 140 may provide the image data DATA to the data driver 130.

The control signal CONT may include a vertical synchronization signal Vsync, a horizontal synchronization signal Hsync, a data enable signal DE, and a clock signal CLK. The timing controller 140 may control the operational timings of the gate driver 120 and the data driver 130 by using the control signal CONT. The timing controller 140 may determine the frame period by counting the data enable signal DE of a horizontal scanning period. In this case, the vertical synchronization signal Vsync and the horizontal synchronization signal Hsync supplied from an external source may be omitted. The image source data RGB includes luminance information of the pixels PX. Luminance may have a determined brightness number, for example, $1024(=2^{10})$, $256(=2^8)$, or $64(=2^6)$ grays.

The timing controller 140 may generate control signals including a gate timing control signal GDC for controlling the operational timing of the gate driver 120, and a data timing control signal DDC for controlling the operational timing of the data driver 130.

The gate timing control signal GDC may include a gate start pulse (GSP), a gate shift clock (GSC), and a gate output enable (GOE) signal. The GSP is provided to the gate driver 120 generating a first scan signal at a start time point of a scanning period. The GSC is a clock signal that is commonly input to the gate driver 120, and thus shifts the GSP. The GOE signal controls an output of the gate driver 120.

The data timing control signal DDC may include a source start pulse (SSP), a source sampling clock (SSC), and a source output enable (SOE) signal. The SSP controls a data sampling start time point of the data driver 130 and is provided to the data driver 130 at the start time point of the scanning period. The SSC is a clock signal that controls a sampling operation of data within the data driver 130, based on a rising or falling edge. The SOE signal controls an output of the data driver 130. The SSP provided to the data driver 130 may be omitted according to data transmission methods.

The gate driver 120 sequentially generates the first scan signals GW_1 through GW_m, the second scan signals GC_1 through GC_m, the third scan signals GI_1 through GI_m, and the fourth scan signals GB_1 through GB_m in response to the gate timing control signal GDC supplied by the timing controller 140 by using the first and second gate voltages VGH and VGL provided by the voltage generator 150.

The data driver 130 samples and latches the image data DATA supplied by the timing controller 140 in response to the data timing control signal DDC supplied from the timing controller 140 to convert the image data DATA into data of a parallel data system. When converting the image data DATA into data of a parallel data system, the data driver 130 converts the image data DATA into a gamma reference signal, namely, an analog data voltage. The data driver 130 provides the data voltage Dm_1 through Dm_n to the pixels PX through the data lines DL_1 through DL_n. The pixels PX receive the data voltage Dm_1 through Dm_n in response to the first scan signals GW_1 through GW_m.

Figure 2:
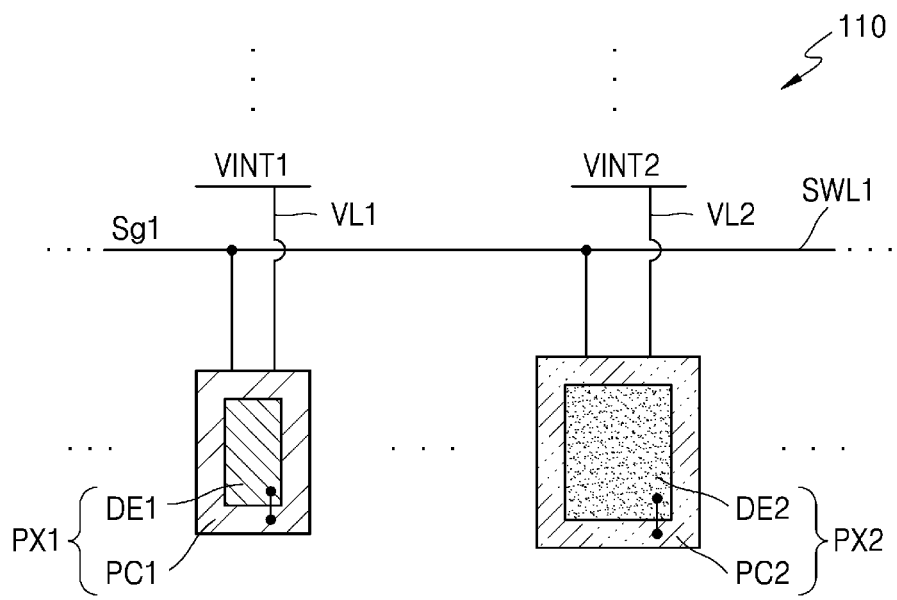
FIG. 2 is a schematic view of a first pixel and a second pixel, according to an embodiment.
Figure 3:
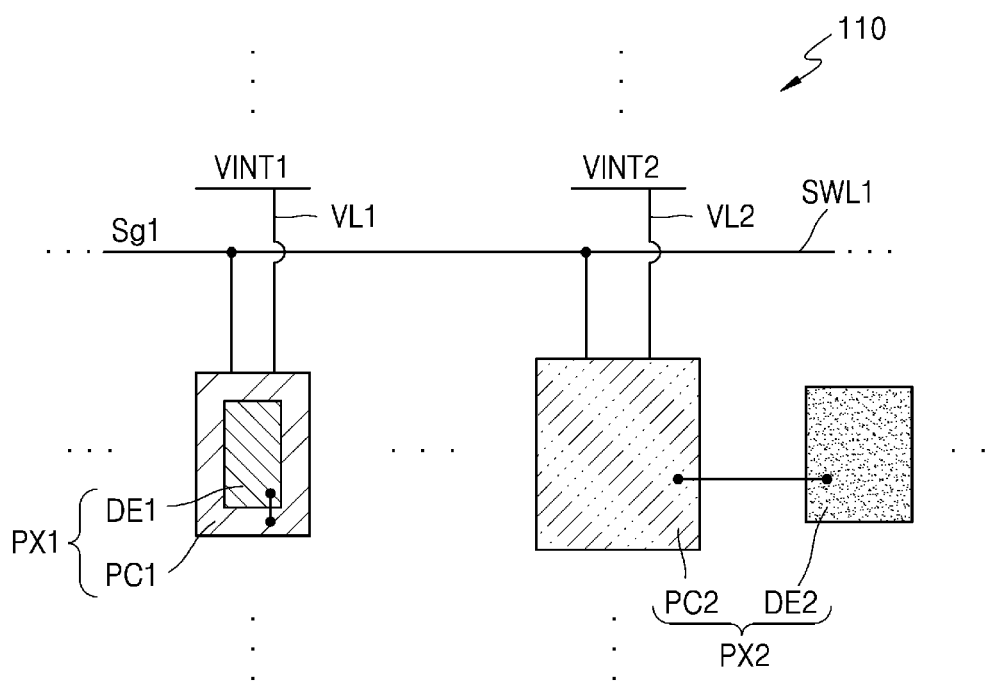
FIG. 3 is a schematic view of a first pixel and a second pixel, according to another embodiment.

FIG. 2 schematically illustrates a first pixel and a second pixel according to an embodiment, and FIG. 3 schematically illustrates a first pixel and a second pixel according to another embodiment. FIG. 3 corresponds to a modification of the embodiment of FIG. 2, and thus will be described by focusing on differences from FIG. 2.

Referring to FIG. 2, the display unit 110 of the organic light-emitting display may include the first pixel PX1 and the second pixel PX2. The first pixel PX1 may include a first pixel circuit PC1 and a first display element DE1 connected to the first pixel circuit PC1, and the second pixel PX2 may include a second pixel circuit PC2 and a second display element DE2 connected to the second pixel circuit PC2.

Although a planar shape of each of the first pixel circuit PC1, the first display element DE1, the second pixel circuit PC2, and the second display element DE2 is rectangular in FIG. 2, the planar shape of each of the first pixel circuit PC1, the first display element DE1, the second pixel circuit PC2, and the second display element DE2 may be changed to any of various shapes such as a diamond, a circle, an oval, and a polygon.

According to an embodiment, as shown in FIG. 2, an emission area of the second display element DE2 may be greater than that of the first display element DE1.

Figure 4:
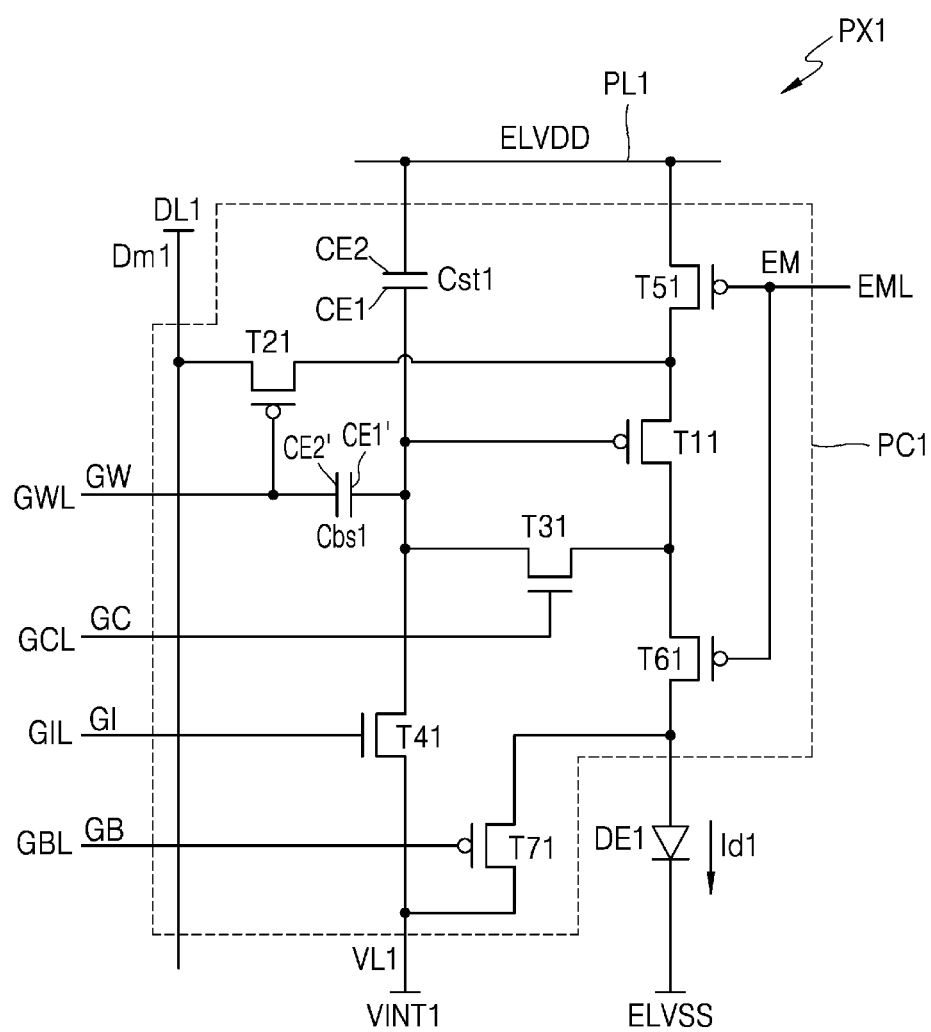
FIG. 4 is an equivalent circuit diagram of a first pixel according to an embodiment.
Figure 5:
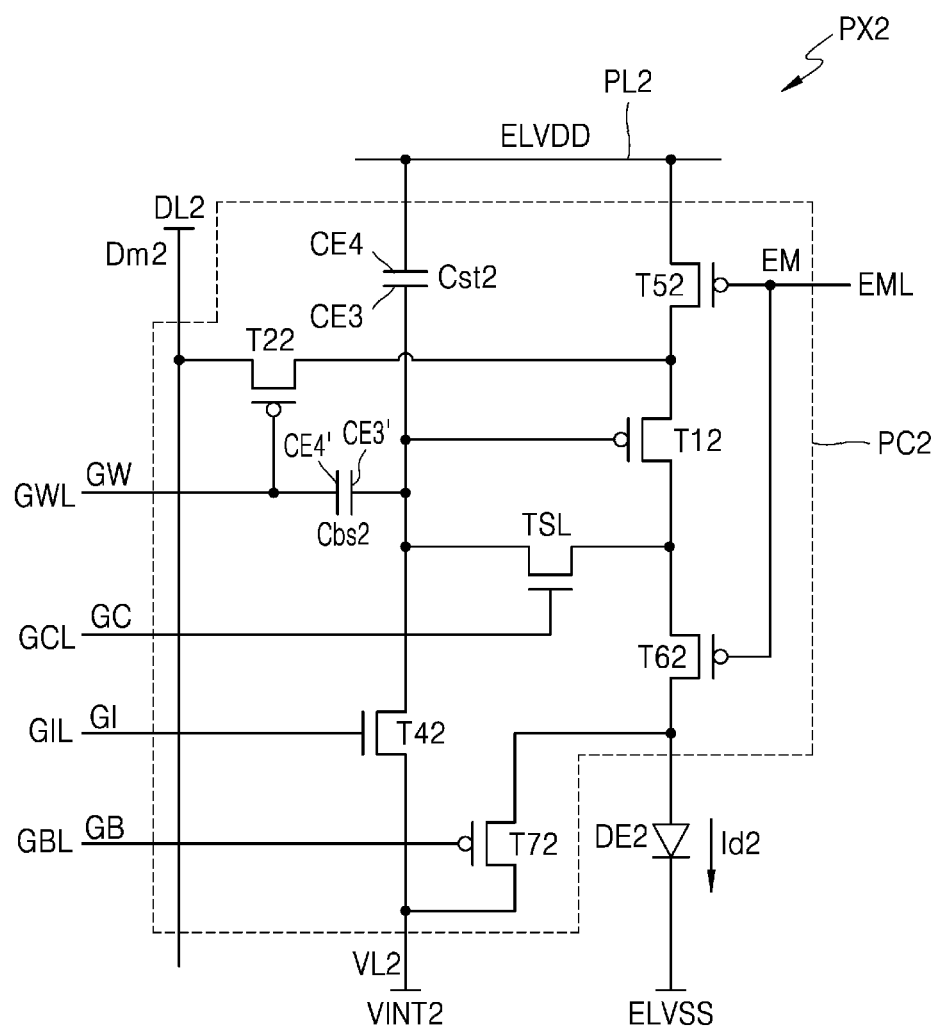
FIG. 5 is an equivalent circuit diagram of a second pixel according to an embodiment.

According to an embodiment, a size (or an area) of the second pixel circuit PC2 may be greater than that of the first pixel circuit PC1. For example, as shown in FIGS. 4 and 5 to be described later, the first pixel circuit PC1 may include a first driving transistor T11 and a first storage capacitor Cst1, and the second pixel circuit PC2 may include a second driving transistor T12 and a second storage capacitor Cst2. In this case, a channel length of the second driving transistor T12 may be greater than that of the first driving transistor T11. Alternatively, a channel width of the second driving transistor T12 may be greater than that of the first driving transistor T11. Alternatively, a capacitance of the second storage capacitor Cst2 may be greater than that of the first storage capacitor Cst1.

Referring back to FIG. 2, the first pixel circuit PC1 and the second pixel circuit PC2 may be connected to a first scan line SWL1 that transmits a first scan signal Sg1. The first pixel circuit PC1 may be connected to the first voltage line VL1 transmitting the first initializing voltage VINT1, and the second pixel circuit PC2 may be connected to the second voltage line VL2 transmitting the second initializing voltage VINT2. In this case, a level of the first initializing voltage VINT1 may be different from that of the second initializing voltage VINT2. For example, the level of the first initializing voltage VINT1 may be higher than that of the second initializing voltage VINT2. Alternatively, the level of the second initializing voltage VINT2 may be higher than that of the first initializing voltage VINT1.

The first scan line SWL1 may correspond to a third scan line GIL or a fourth scan line GBL of FIGS. 4 and 5, which will be described later in more detail. When the first scan line SWL1 corresponds to the third scan line GIL, the first initializing voltage VINT1 may be applied to a gate of the first driving transistor T11 of the first pixel circuit PC1 in synchronization with the first scan signal Sg1, and the second initializing voltage VINT2 may be applied to a gate of the second driving transistor T12 of the second pixel circuit PC2 in synchronization with the first scan signal Sg1. When the first scan line SWL1 corresponds to the fourth scan line GBL, the first initializing voltage VINT1 may be applied to an anode of the first display element DE1 in synchronization with the first scan signal Sg1, and the second initializing voltage VINT2 may be applied to an anode of the second display element DE2 in synchronization with the first scan signal Sg1.

According to a comparative example, the same initializing voltage may be applied to a first pixel circuit and a second pixel circuit having different sizes. In this case, flickering may be visually recognized due to occurrence of a luminance difference between frames in one of a first pixel and a second pixel during low-frequency driving in which a data voltage is not written at some frames.

According to an embodiment, the first initializing voltage VINT1 and the second initializing voltage VINT2 having different levels are applied to the first pixel circuit PC1 and the second pixel circuit PC2 having different sizes, so that luminance differences between frames in both the first pixel PX1 and the second pixel PX2 are reduced, thereby preventing visual recognition of flickering.

According to an embodiment, as shown in FIG. 2, when viewed in a plan view, the first pixel circuit PC1 and the first display element DE1 may at least partially overlap each other and the second pixel circuit PC2 and the second display element DE2 may at least partially overlap each other.

According to another embodiment, as shown in FIG. 3, when viewed in a plan view, the second pixel circuit PC2 and the second display element DE2 may be spaced apart from each other. In other words, the second pixel circuit PC2 and the second display element DE2 may not overlap each other.

FIG. 4 is an equivalent circuit diagram of a first pixel according to an embodiment.

Referring to FIG. 4, a first pixel PX1 is connected to first through fourth scan lines GWL, GCL, GIL, and GBL respectively transmitting first through fourth scan signals GW, GC, GI, and GB, a first data line DL1 transmitting a first data voltage Dm1, and a light-emission control line EML transmitting a light-emission control signal EM. The first pixel PX1 is connected to a first power line PL1 transmitting the first driving voltage ELVDD, and the first voltage line VL1 transmitting the first initializing voltage VINT1. The first pixel PX1 is connected to a common electrode to which the second driving voltage ELVSS is applied.

The first scan line GWL corresponds to the first scan line SL1_i of FIG. 1, the second scan line GCL corresponds to the second scan line SL2_i of FIG. 1, the third scan line GIL corresponds to the third scan line SL3_i of FIG. 1, the fourth scan line GBL corresponds to the first scan line SL1_i+1 of FIG. 1, and the light-emission control line EML corresponds to the light-emission control line EML_i of FIG. 1. The first data line DL1 corresponds to the first data line DL_j of FIG. 1, and the first power line PL1 corresponds to the first power line PL_j of FIG. 1.

Devices included in the first pixel PX1 will now be described.

The first pixel PX1 includes the first display element DE1, first through seventh transistors T11 through T71, the first storage capacitor Cst1, and a first boosting capacitor Cbs1. The first display element DE1 may be an organic light-emitting diode having an anode and a cathode. The cathode may be a common electrode to which the second driving voltage ELVSS is applied.

Some of the first through seventh transistors T11 through T71 may be NMOS (n-channel MOSFET), and the others may be PMOS (p-channel MOSFET). For example, the third transistor T31 and the fourth transistor T41 from among the first through seventh transistors T11 through T71 may be NMOS (n-channel MOSFET), and the rest may be PMOS (p-channel MOSFET).

According to another embodiment, the third transistor T31, the fourth transistor T41, and the seventh transistor T71 from among the first through seventh transistors T11 through T71 may be NMOS, and the rest may be PMOS. Alternatively, only one of the first through seventh transistors T11 through T71 may be NMOS, and the others may be PMOS. Alternatively, all of the first through seventh transistors T11 through T71 may be NMOS or PMOS.

The first transistor T11 may be a driving transistor in which the magnitude of a drain current is determined according to a gate-source voltage, and the second through seventh transistors T21 through T71 may be switching transistors that are turned on/off according to gate-source voltages, substantially, gate voltages.

The first transistor T11 may be referred to as a first driving transistor, the second transistor T21 may be referred to as a first scan transistor, the third transistor T31 may be referred to as a first compensating transistor, the fourth transistor T41 may be referred to as a first gate initializing transistor, the fifth transistor T51 may be referred to as a first operation control transistor, the sixth transistor T61 may be referred to as a first light-emission control transistor, and the seventh transistor T71 may be referred to as a first anode initializing transistor.

The first storage capacitor Cst1 is connected between the first power line PL1 and the gate of the first driving transistor T11. The first storage capacitor Cst1 may have a second electrode CE2 connected to the first power line PL1, and a first electrode CE1 connected to the gate of the first driving transistor T11.

The first driving transistor T11 may control the magnitude of a first current Id1 flowing from the first power line PL1 to the first display element DE1 according to the gate-source voltage. The first driving transistor T11 may include the gate connected to the first electrode CE1 of the first storage capacitor Cst1, a source connected to the first power line PL1 through the first operation control transistor T51, and a drain connected to the first display element DE1 through the first light-emission control transistor T61.

The first driving transistor T11 may output the first current Id1 to the first display element DE1 according to the gate-source voltage. The magnitude of the first current Id1 is determined based on a difference between the gate-source voltage and a threshold voltage of the first driving transistor T11. The first display element DE1 may receive the first current Id1 from the first driving transistor T11, and emit light with a brightness based on the magnitude of the first current Id1.

The first scan transistor T21 transmits the first data voltage Dm1 to the source of the first driving transistor T11 in response to the first scan signal GW. The first scan transistor T21 may have a gate connected to the first scan line GWL, a source connected to the first data line DL1, and a drain connected to the source of the first driving transistor T11.

The first compensating transistor T31 connects the drain and the gate of the first driving transistor T11 to each other in response to the second scan signal GC. The first compensating transistor T31 may have a gate connected to the second scan line GGL, a source connected to the gate of the first driving transistor T11, and a drain connected to the drain of the first driving transistor T11.

The first gate initializing transistor T41 applies the first initializing voltage VINT1 to the gate of the first driving transistor T11 in response to the third scan signal GI. The first gate initializing transistor T41 may have a gate connected to the third scan line GIL, a source connected to the first voltage line VL1, and a drain connected to the gate of the first driving transistor T11.

The first anode initializing transistor T71 applies the first initializing voltage VINT1 to the anode of the first display element DE1 in response to the fourth scan signal GB. The first anode initializing transistor T71 may have a gate connected to the fourth scan line GBL, a source connected to the anode of the first display element DE1, and a drain connected to the first voltage line VL1.

In FIG. 4, the first gate initializing transistor T41 and the first anode initializing transistor T71 are connected to the first voltage line VL1. However, according to another embodiment, the first gate initializing transistor T41 and the first anode initializing transistor T71 may be connected to different voltage lines. This will be described later with reference to FIG. 7.

The first operation control transistor T51 may connect the driving voltage line PL to the source of the first driving transistor T11 in response to the light-emission control signal EM. The first operation control transistor T51 may have a gate connected to the light-emission control line EML, a source connected to the first power line PL1, and a drain connected to the source of the first driving transistor T11.

The first light-emission control transistor T61 may connect the drain of the first driving transistor T11 to the anode of the first display element DE1 in response to the light-emission control signal EM. The first light-emission control transistor T61 may have a gate connected to the light-emission control line EML, a source connected to the drain of the first driving transistor T11, and a drain connected to the anode of the first display element DE1.

The first scan signal GW may be substantially synchronized with the second scan signal GC. The third scan signal GI may be substantially synchronized with a first scan signal GW on a previous row. The fourth scan signal GB may be substantially synchronized with the first scan signal GW. According to another example, the fourth scan signal GB may be substantially synchronized with a first scan signal GW on a next row.

The first boosting capacitor Cbs1 may include a first electrode CE1' connected to the first electrode CE1 of the first storage capacitor Cst1, and a second electrode CE2' connected to the gate of the first scan transistor T21. The second electrode CE2' of the first boosting capacitor Cbs1 may provide the first scan signal GW. The first boosting capacitor Cbs1 may compensate for a voltage drop of the gate by increasing a voltage of the gate of the first driving transistor T11 at a time point when provision of the first scan signal GW is stopped.

A detailed operation process of the first pixel PX1, which is one pixel of an organic light-emitting display according to an embodiment will now be described in detail.

First, in response to a light-emission control signal EM of a high level, the first operation control transistor T51 and the first light-emission control transistor T61 are turned off, and the first driving transistor T11 stops outputting the first current Id1 and the first display element DE1 stops emitting light.

Thereafter, during a gate initialization period when a third scan signal GI of a high level is received, the first gate initializing transistor T41 is turned on, and the first initializing voltage VINT1 is applied to the gate of the first driving transistor T11, namely, to the first electrode CE1 of the first storage capacitor Cst1. The first storage capacitor Cst1 stores a difference (ELVDD−VINT1) between the first driving voltage ELVDD and the first initializing voltage VINT1.

Then, during a data write period when a first scan signal GW of a low level and a second scan signal GC of a high level are received, the first scan transistor T21 and the first compensating transistor T31 are turned on, and the first data voltage Dm1 is received by the source of the first driving transistor T11. The first driving transistor T11 is diode-connected by the first compensating transistor T31 and is biased in a forward direction. The gate voltage of the first driving transistor T11 increases from the first initializing voltage VINT1. When the gate voltage of the first driving transistor T11 becomes equal to a data compensating voltage (Dm1−|Vth|) obtained by reducing a threshold voltage Vth of the first driving transistor T11 from the first data voltage Dm1, the first driving transistor T11 is turned off and at the same time the gate voltage of the first driving transistor T11 stops increasing. Accordingly, the first storage capacitor Cst1 stores a difference (ELVDD−Dm1+|Vth|) between the first driving voltage ELVDD and the data compensating voltage (Dm1−|Vth|).

During an anode initialization period when a fourth scan signal GB of a low level is received, the anode initializing transistor T71 is turned on, and the first initializing voltage VINT1 is applied to the anode of the first display element DE1. By allowing the first display element DE1 to completely emit no light by applying the first initializing voltage VINT1 to the anode of the first display element DE1, minute light emission of the first display element DE1 in correspondence with a black grayscale in a next frame may be prevented.

The first scan signal GW and the fourth scan signal GB may be substantially synchronized with each other. In this case, the data write period and the anode initialization period may be the same periods.

Thereafter, in response to a light-emission control signal EM of a low level, the first operation control transistor T51 and the first light-emission control transistor T61 may be turned on, the first driving transistor T11 may output the first current Id1 corresponding to a voltage (ELVDD−Dm1) obtained by subtracting the threshold voltage |Vth| of the first driving transistor T11 from a voltage stored in the first storage capacitor Cst1, namely, the source-gate voltage (ELVDD−Dm1+|Vth|) of the first driving transistor T11, and the first display element DE1 may emit light with a luminance corresponding to the magnitude of the first current Id1.

According to an embodiment, at least one of the first through seventh transistors T11 through T71 includes a semiconductor layer including oxide, and the others include a semiconductor layer including silicon.

In detail, the first driving transistor T11 directly affecting the brightness of the display device includes a semiconductor layer including polycrystalline silicon having high reliability, and thus a high-resolution display device may be realized.

Because an oxide semiconductor has high carrier mobility and a low leakage current, a voltage drop is not big even when a driving time is long. In other words, because a change in the color of an image according to a voltage drop is not big even during low frequency driving, low frequency driving is possible.

Because an oxide semiconductor has a small leakage current as described above, at least one of the first compensating transistor T31, the first gate initializing transistor T41, and the first anode initializing transistor T71 connected to the gate of the first driving transistor T11 employs an oxide semiconductor, so that flowing of a leakage current to the gate of the first driving transistor T11 may be prevented and also power consumption may be reduced.

FIG. 5 is an equivalent circuit diagram of a second pixel according to an embodiment.

Referring to FIG. 5, a second pixel PX2 is connected to the first through fourth scan lines GWL, GCL, GIL, and GBL respectively transmitting the first through fourth scan signals GW, GC, GI, and GB, a first data line DL2 transmitting a second data voltage Dm2, and the light-emission control line EML transmitting the light-emission control signal EM. The second pixel PX2 is connected to a second power line PL2 transmitting the first driving voltage ELVDD, and the second voltage line VL2 transmitting the second initializing voltage VINT2. The second pixel PX2 is connected to the common electrode to which the second driving voltage ELVSS is applied.

The first scan line GWL corresponds to the first scan line SL1_i of FIG. 1, the second scan line GCL corresponds to the second scan line SL2_i of FIG. 1, the third scan line GIL corresponds to the third scan line SL3_i of FIG. 1, the fourth scan line GBL corresponds to the first scan line SL1_i+1 of FIG. 1, and the light-emission control line EML corresponds to the light-emission control line EML_i of FIG. 1. The second data line DL2 corresponds to the second data line DL_k of FIG. 1, and the second power line PL2 corresponds to the second power line PL_k of FIG. 1.

The second pixel PX2 includes the second display element DE2, first through seventh transistor T12 through T72, and a second storage capacitor Cst2. The second display element DE2 may be an organic light-emitting diode having an anode and a cathode. The cathode may be a common electrode to which the second driving voltage ELVSS is applied.

The second transistor T12 may be a driving transistor in which the magnitude of a drain current is determined according to a gate-source voltage, and the second through seventh transistors T22 through T72 may be switching transistors that are turned on/off according to gate-source voltages, substantially, gate voltages.

The first transistor T12 may be referred to as a second driving transistor, the second transistor T22 may be referred to as a second scan transistor, the third transistor T32 may be referred to as a second compensating transistor, the fourth transistor T42 may be referred to as a second gate initializing transistor, the fifth transistor T52 may be referred to as a second operation control transistor, the sixth transistor T62 may be referred to as a second light-emission control transistor, and the seventh transistor T72 may be referred to as a second anode initializing transistor.

The second storage capacitor Cst1 may have a fourth electrode CE4 connected to the second power line PL2, and a third electrode CE3 connected to the gate of the second driving transistor T12.

A second boosting capacitor Cbs2 may include a third electrode CE3' connected to the third electrode CE3 of the second storage capacitor Cst2, and a fourth electrode CE4' connected to the gate of the second scan transistor T22.

The second driving transistor T12 may output a second current Id2 to the second display element DE2 according to the gate-source voltage. The magnitude of the second current Id2 is determined based on a difference between the gate-source voltage and a threshold voltage of the first driving transistor T11. The second display element DE2 may receive the second current Id2 from the second driving transistor T12, and emit light with a brightness based on the magnitude of the second current Id2.

The second gate initializing transistor T42 applies the second initializing voltage VINT2 to the gate of the second driving transistor T12 in response to the third scan signal GI. The second gate initializing transistor T42 may have a gate connected to the third scan line GIL, a source connected to the second voltage line VL2, and a drain connected to the gate of the second driving transistor T12.

The second anode initializing transistor T72 applies the second initializing voltage VINT2 to the anode of the second display element DE2 in response to the fourth scan signal GB. The second anode initializing transistor T72 may have a gate connected to the fourth scan line GBL, a source connected to the anode of the second display element DE2, and a drain connected to the second voltage line VL2.

In FIG. 5, the second gate initializing transistor T42 and the second anode initializing transistor T72 are connected to the second voltage line VL2. However, according to another embodiment, the second gate initializing transistor T42 and the second anode initializing transistor T72 may be connected to different voltage lines. This will be described later with reference to FIG. 8.

The same operation process is equally applicable to the first pixel PX1 and the second pixel PX2 of FIGS. 4 and 5, except that the first pixel PX1 and the second pixel PX2 are connected to the first voltage line VL1 and the second voltage line VL2, respectively.

The second driving transistor T12 may correspond to the first driving transistor T11 of FIG. 4, the second scan transistor T22 may correspond to the first scan transistor T21 of FIG. 4, the second compensating transistor T32 may correspond to the first compensating transistor T31 of FIG. 4, the second gate initializing transistor T42 may correspond to the first gate initializing transistor T41 of FIG. 4, the second operation control transistor T52 may correspond to the first operation control transistor T51 of FIG. 4, the second light-emission control transistor T62 may correspond to the first light-emission control transistor T61 of FIG. 4, and the second anode initializing transistor T72 may correspond to the first anode initializing transistor T71 of FIG. 4. The second storage capacitor Cst2 may correspond to the first storage capacitor Cst1 of FIG. 4, and the second boosting capacitor Cbs2 may correspond to the first boosting capacitor Cbs1 of FIG. 4.

Figure 6:
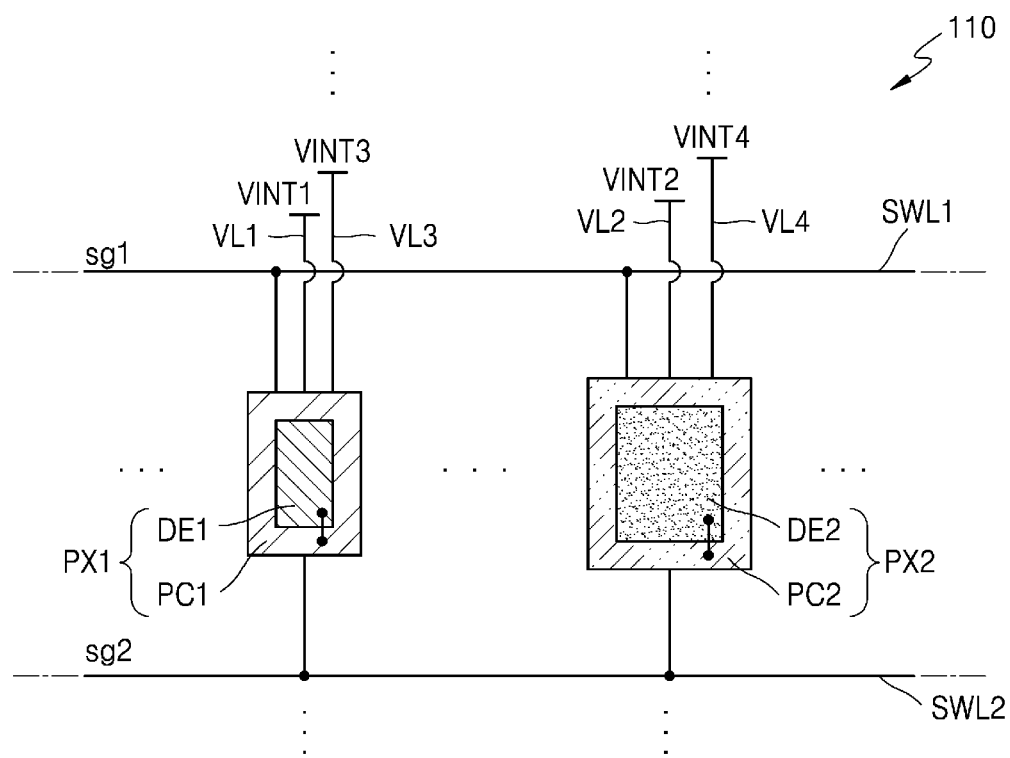
FIG. 6 is a schematic view of a first pixel and a second pixel, according to another embodiment.

FIG. 6 is a schematic view of a first pixel and a second pixel according to another embodiment. FIG. 6 is a modification of FIG. 2, and is thus different therefrom in the structures of voltage wiring and an initializing voltage. Overlapping contents therebetween will be replaced with the description of FIG. 2, and the differences will now be mainly described.

Referring to FIG. 6, the first pixel circuit PC1 and the second pixel circuit PC2 may be connected to a first scan line SWL1 transmitting a first scan signal Sg1 and a second scan line SWL2 transmitting a second scan signal Sg2.

The first pixel circuit PC1 may be connected to a first voltage line VL1 transmitting a first initializing voltage VINT1, and a third voltage line VL3 transmitting a third initializing voltage VINT3. The second pixel circuit PC2 may be connected to a second voltage line VL2 transmitting a second initializing voltage VINT2, and a fourth voltage line VL4 transmitting a fourth initializing voltage VINT4.

In this case, a level of the first initializing voltage VINT1 may be different from that of the second initializing voltage VINT2. A level of the third initializing voltage VINT3 may be different from that of the fourth initializing voltage VINT4. For example, the level of the third initializing voltage VINT3 may be higher than that of the fourth initializing voltage VINT4. Alternatively, the level of the fourth initializing voltage VINT4 may be higher than that of the third initializing voltage VINT3.

The first scan line SWL1 may correspond to a third scan line GIL of FIGS. 7 and 8, which will be described later, and the second scan line SWL2 may correspond to a fourth scan line GBL of FIGS. 7 and 8. The first initializing voltage VINT1 may be applied to a gate of a first driving transistor T11 (see FIG. 7) of the first pixel circuit PC1 in synchronization with the first scan signal Sg1, and the second initializing voltage VINT2 may be applied to a gate of a second driving transistor T12 (see FIG. 8) of the second pixel circuit PC2 in synchronization with the first scan signal Sg1. The second initializing voltage VINT3 may be applied to the anode of the first display element DE1 in synchronization with the second scan signal Sg2, and the fourth initializing voltage VINT4 may be applied to an anode of the second display element DE2 in synchronization with the second scan signal Sg2.

According to an embodiment, the first and second initializing voltages VINT1 and VINT2 and the third and fourth initializing voltage VINT3 and VINT4 having different levels are applied to the first pixel circuit PC1 and the second pixel circuit PC2 having different sizes, so that luminance differences between frames in both the first pixel PX1 and the second pixel PX2 are reduced, thereby preventing visual recognition of flickering.

According to an embodiment, as shown in FIG. 6, when viewed in a plan view, the first pixel circuit PC1 and the first display element DE1 may at least partially overlap each other and the second pixel circuit PC2 and the second display element DE2 may at least partially overlap each other.

According to another embodiment, as shown in FIG. 3, when viewed in a plan view, the second pixel circuit PC2 and the second display element DE2 may be spaced apart from each other. In other words, the second pixel circuit PC2 and the second display element DE2 may not overlap each other.

Figure 7:
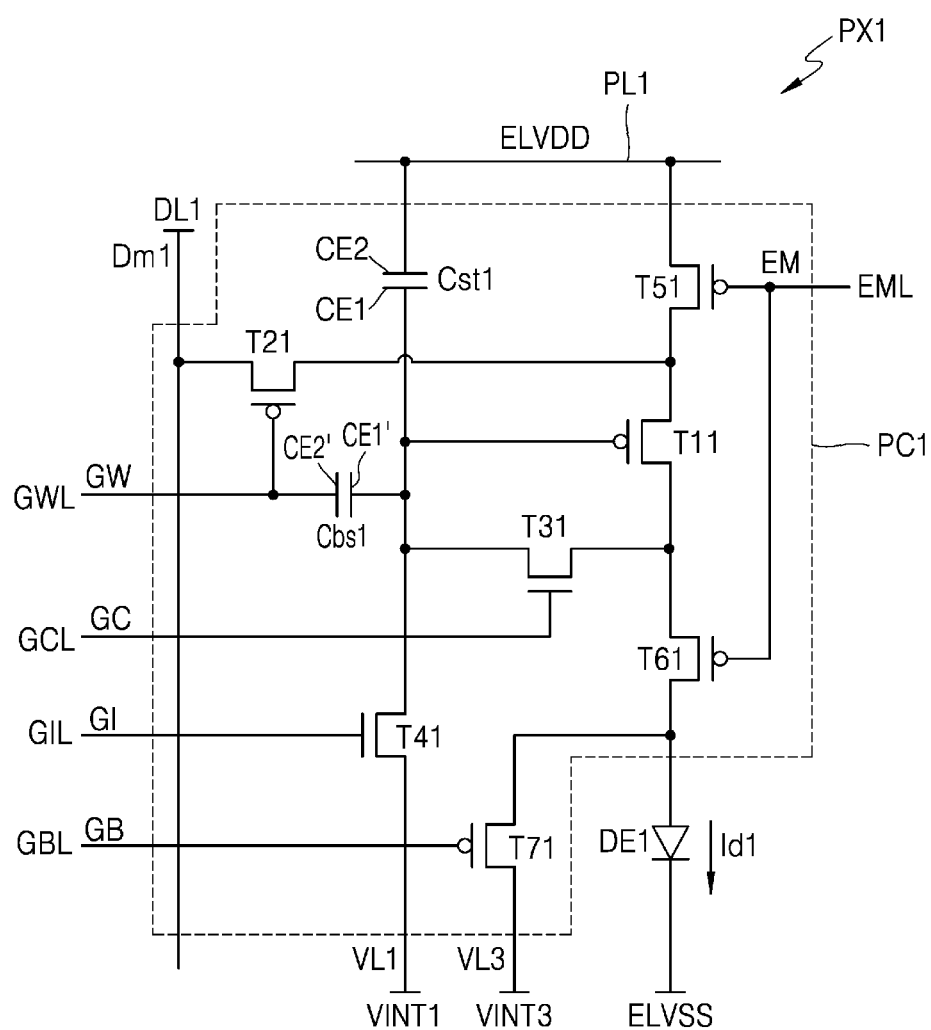
FIG. 7 is an equivalent circuit diagram of a first pixel according to another embodiment.

FIG. 7 is an equivalent circuit diagram of a first pixel according to another embodiment. FIG. 7 is a modification of FIG. 4, and is thus different therefrom in the structures of voltage wiring and an initializing voltage. Hereinafter, overlapping contents therebetween will be replaced with the description of FIG. 4, and the differences will be mainly described.

Referring to FIG. 7, the first pixel PX1 is connected to a first voltage line VL1 transmitting the first initializing voltage VINT1, and a third voltage line VL3 transmitting the third initializing voltage VINT3.

The first gate initializing transistor T41 and the first anode initializing transistor T71 may be connected different voltage lines from each other. For example, as shown in FIG. 7, the first gate initializing transistor T41 may be connected to the first voltage line VL1, and the first anode initializing transistor T71 may be connected to the third voltage line VL3.

The first gate initializing transistor T41 may apply the first initializing voltage VINT1 to the gate of the first driving transistor T11 in response to the third scan signal GI, and the first anode initializing transistor T71 may apply the third initializing voltage VINT3 to the anode of the first display element DE1 in response to the fourth scan signal GB.

A level of the third initializing voltage VINT3 may be higher than that of the first initializing voltage VINT1, and may be lower than a voltage level that is higher than the second driving voltage ELVSS by a threshold voltage of the first display element DE1. Because the first display element DE1 has a relatively large size, the first display element DE1 has a significantly large capacitance. In addition, because the level of the first initializing voltage VINT1 is too low, the first display element DE1 starts emitting light after a considerable delay time in the next frame. However, according to an embodiment, the anode of the first display element DE1 is initialized with the third initializing voltage VINT3 having a higher level than the level of the first initializing voltage VINT1, so that the first display element DE1 may start emitting light within a short time period. In other words, light emission delay may be addressed.

Figure 8:
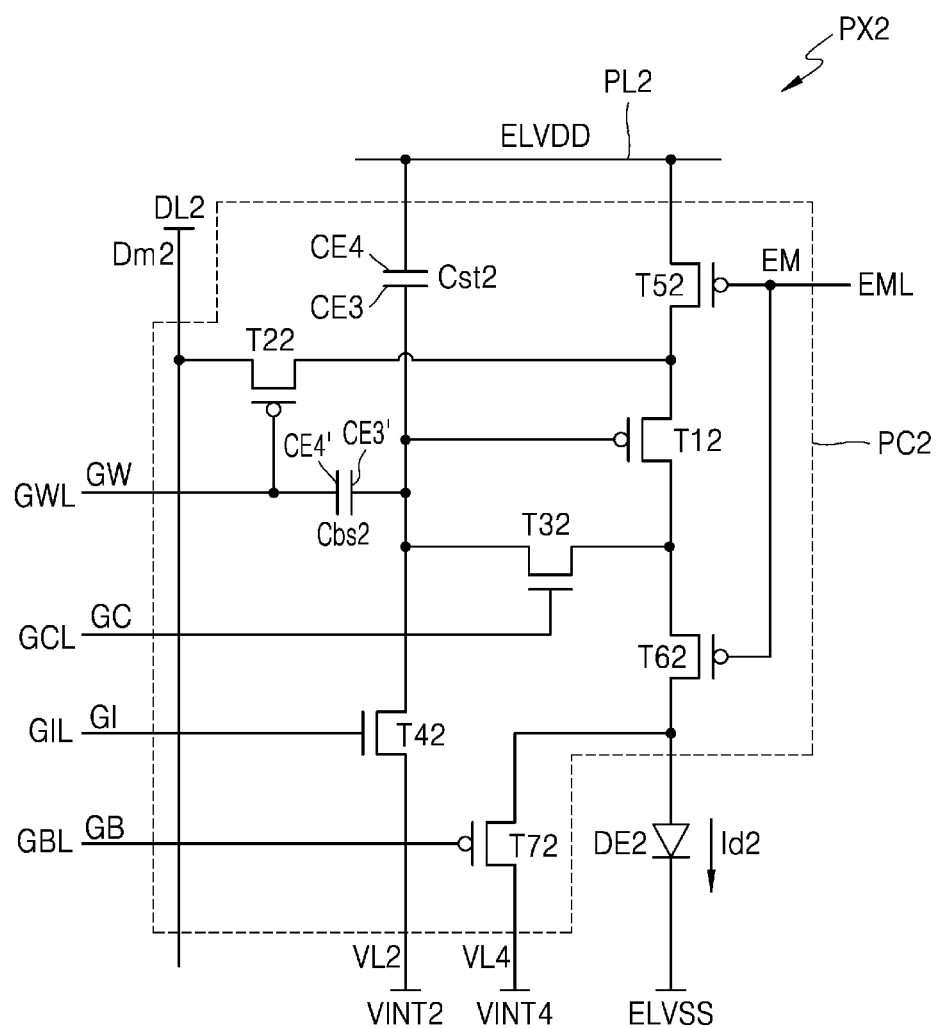
FIG. 8 is an equivalent circuit diagram of a second pixel according to another embodiment.

FIG. 8 is an equivalent circuit diagram of a second pixel according to another embodiment. FIG. 8 is a modification of FIG. 5, and is thus different therefrom in the structures of voltage wiring and an initializing voltage. Hereinafter, overlapping contents therebetween will be replaced with the description of FIG. 5, and the differences will be mainly described.

Referring to FIG. 8, the second pixel PX2 is connected to the second voltage line VL2 transmitting the second initializing voltage VINT2, and the fourth voltage line VL4 transmitting the fourth initializing voltage VINT4.

The second gate initializing transistor T42 and the second anode initializing transistor T72 may be connected to different voltage lines. For example, as shown in FIG. 8, the second gate initializing transistor T42 may be connected to the second voltage line VL2, and the second anode initializing transistor T72 may be connected to the fourth voltage line VL4.

The second gate initializing transistor T42 may apply the second initializing voltage VINT2 to the gate of the second driving transistor T12 in response to the third scan signal GI, and the second anode initializing transistor T72 may apply the fourth initializing voltage VINT4 to the anode of the second display element DE2 in response to the fourth scan signal GB.

A level of the fourth initializing voltage VINT4 may be higher than that of the second initializing voltage VINT2, and may be lower than a voltage level that is higher than the second driving voltage ELVSS by a threshold voltage of the second display element DE2. Because the second display element DE2 has a relatively large size, the second display element DE2 has a significantly large capacitance. In addition, because the level of the second initializing voltage VINT2 is too low, the second display element DE2 starts emitting light after a considerable delay time in the next frame. However, according to an embodiment, the anode of the second display element DE2 is initialized with the fourth initializing voltage VINT4 having a higher level than the level of the second initializing voltage VINT2, so that the second display element DE2 may start emitting light within a short time period. In other words, light emission delay may be addressed.

Figure 9:
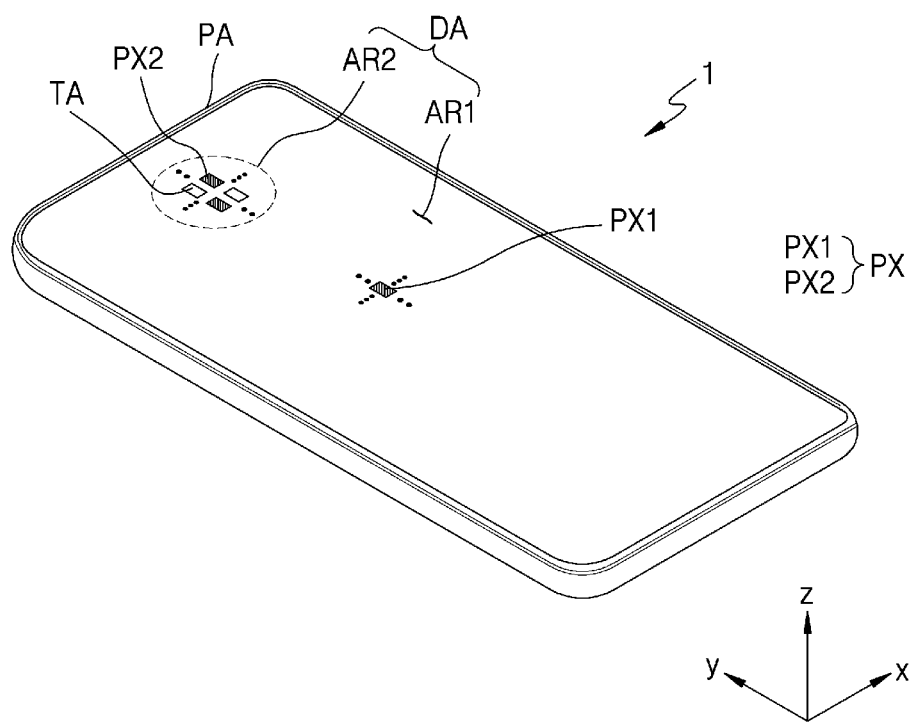
FIG. 9 is a schematic perspective view of a display apparatus according to an embodiment.

FIG. 9 is a schematic perspective view of a display apparatus according to an embodiment.

Referring to FIG. 9, a display apparatus 1 may include a display area DA, and a peripheral area PA around the display area DA. The display area DA may include a second area AR2, and a first area AR1 surrounding at least a portion of the second area AR2. In other words, the second area AR2 and the first area AR1 may individually display images or together display an image. The peripheral area PA may be a non-display area including no display elements arranged therein. The display area DA may be entirely surrounded by the peripheral area PA.

FIG. 9 illustrates positioning of one second area AR2 within the first area AR1. According to another embodiment, the display apparatus 1 may have two or more second areas AR2, and a plurality of second areas AR2 may have different shapes and different sizes. When viewed in a direction approximately perpendicular to an upper surface of the display apparatus 1, the second area AR2 may have any of various shapes such as a circular shape, an oval shape, a polygonal shape (e.g., a rectangular shape), a star shape, or a diamond shape. In FIG. 9, when viewed in the direction approximately perpendicular to the upper surface of the display apparatus 1, the second area AR2 is arranged at the center of an upper portion (in a +y direction) of the first area AR1 having an approximately rectangular shape, but the second area AR2 may be arranged on one side, for example, a right upper side or left upper side, of the first area AR1.

The display apparatus 1 may provide an image by using a plurality of pixels PX arranged in the display area DA. The display apparatus 1 may provide an image by using a plurality of first pixels PX1 arranged in the first area AR1 and a plurality of second pixels PX2 arranged in the second area AR2. Each of the plurality of first pixels PX1 and the plurality of second pixels PX2 may include a display element. Each of the plurality of first pixels PX1 and the plurality of second pixels PX2 may include a display element such as a light-emitting diode (OLED). Each of the plurality of pixels PX may emit, for example, red light, green light, blue light, or white light, via the OLED. Each of the plurality of pixels PX refers to subpixels that emit light beams of different colors, and may be one of, for example, a red subpixel, a green subpixel, and a blue subpixel.

In the second area AR2, as will be described later with reference to FIG. 10, a component 30, which is an electronic element, may be arranged below a display panel to correspond to the second area AR2. The component 30 is a camera using infrared light, visible light, or the like, and may include a photographing device. Alternatively, the component 30 may be a solar battery, a flash, an illuminance sensor, a proximity sensor, or an iris sensor. Alternatively, the component 30 may have a function of receiving sound.

In order to minimize restrictions on the function of the component 30, the second area AR2 may include a transmission area TA capable of transmitting light or/and sound that is output from the component 30 to the outside or travels from the outside toward the component 30. In a display panel and a display device including the same, according to an embodiment, when light is transmitted through the second area AR2, a light transmittance in the second area AR2 may be about 10% or greater, for example, 40% or greater, 25% or greater, 50% or greater, 85% or greater, or 90% or greater.

The plurality of second pixels PX2 may be arranged in the second area AR2. The plurality of second pixels PX2 may emit light to provide a certain image. An image displayed by the second area AR2 is an auxiliary image and thus may have lower resolution than an image displayed by the first area AR1. In other words, when the second area AR2 includes the transmission area TA capable of transmitting light and sound and no pixels are arranged in the transmission area TA, the number of second pixels PX2 that may be arranged on a unit area in the second area AR2 may be less than the number of first pixels PX1 arranged on a unit area in the first area AR1.

Figure 10:
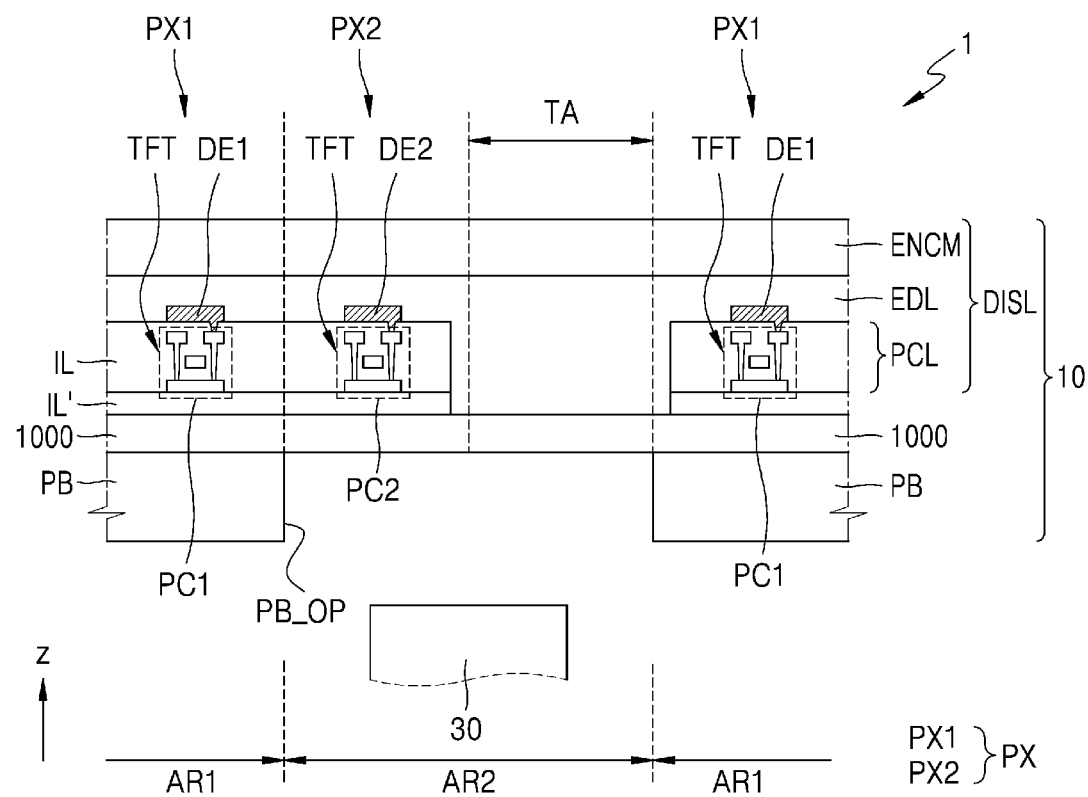
FIG. 10 is a schematic cross-sectional view of a portion of a cross-section of a display apparatus according to an embodiment.

FIG. 10 is a schematic cross-sectional view of a portion of a cross-section of the display apparatus 1 according to an embodiment.

Referring to FIG. 10, the display apparatus 1 may include a display panel 10 and the component 30 overlapped by the display panel 10. A cover window may be further over the display panel 10 to protect the display panel 10.

The display panel 10 includes the second area AR2, which overlaps the component 30, and the first area AR1, on which a main image is displayed. The display panel 10 may include a substrate 1000, a display layer DISL on the substrate 1000, and a panel protection member PB below the substrate 1000. Because the display panel 10 includes the substrate 1000, it may be understood that the second area AR2 and the first area AR1 are defined in the substrate 1000.

The display layer DISL may include a circuit layer PCL including transistors TFT, a display element layer EDL including the first display elements DE1 and the second display elements DE2, and an encapsulation member ENCM such as an encapsulation substrate. Insulating layers IL and IL' may be arranged between the substrate 1000 and the display layer DISL and within the display layer DISL.

The substrate 1000 may include an insulating material, such as glass, quartz, and polymer resin. The substrate 1000 may be a rigid substrate or a flexible substrate that is bendable, foldable, or rollable.

The display panel 10 may provide an image by using the plurality of pixels PX. A first pixel PX1 from among the pixels PX may be arranged in the first area AR1, and a second pixel PX2 from among the pixels PX may be arranged in the second area AR2. The first pixel PX1 may include a first pixel circuit PC1 including a transistor and a first display element DE1 connected to the first pixel circuit PC1, and the second pixel PX2 may include a second pixel circuit PC2 including a transistor and a second display element DE2 connected to the second pixel circuit PC2.

A transmission area TA having no second pixels PX2 arranged therein may be arranged in the second area AR2. The transmission area TA may transmit a light/signal emitted by the component 30 arranged to correspond to the second area AR2 or a light/signal incident upon the component 30. The second pixel PX2 and the transmittance area TA may be arranged alternately with each other within the second area AR2.

Each of the insulating layers IL and IL' arranged between the substrate 1000 and the display layer DISL and within the display layer DISL may have at least one opening. Light emitted from or directed to the component 30 may pass through the opening of each of the insulating layers IL and IL'. The opening of each of the insulating layers IL and IL' may be located in the transmittance area TA and may allow the light directed to or emitted from the component 30 to move.

The display element layer DEL may be covered by the encapsulation member ENCM. The encapsulation member ENCM may be an encapsulation substrate or a thin-film encapsulation layer.

According to an embodiment, the encapsulation member ENCM may be an encapsulation substrate. The encapsulation substrate may be arranged to face the substrate 1000 with the display element layer EDL therebetween. A gap may exist between the encapsulation substrate and the display element layer EDL. The encapsulation substrate may include glass. A sealant including frit or the like may be arranged between the substrate 1000 and the encapsulation substrate, and may be arranged in the peripheral area PA described above with reference to FIG. 9. The sealant arranged in the peripheral area PA may surround the display area DA and prevent moisture from permeating through the side surfaces of the display panel 10.

According to another embodiment, the encapsulation member ENCM may be a thin-film encapsulation layer. The thin-film encapsulation layer may include at least one inorganic encapsulation layer and at least one organic encapsulation layer. For example, the thin-film encapsulation layer may include a first inorganic encapsulation layer, a second inorganic encapsulation layer, and an organic encapsulation layer therebetween.

The protection member PB may be attached to a lower surface of the substrate 1000 and may support and protect the substrate 1000. The protection member PB may include an opening PB_OP corresponding to the second area AR2. The inclusion of the opening PB_OP in the protection member PB may improve the light transmittance of the second area AR2. The protection member PB may include polyethylene terephthalate (PET) or polyimide (PI).

The second area AR2 may have a larger area than an area where the component 30 is arranged. Accordingly, the area of the opening PB_OP included in the protection member PB may not be identical with the area of the second area AR2.

A plurality of components 30 may be arranged in the second area AR2. The plurality of components 30 may perform different functions. For example, the plurality of components 30 may include at least two of a camera (imaging device), a solar cell, a flash, a proximity sensor, an illuminance sensor, and an iris sensor.

Figure 11:
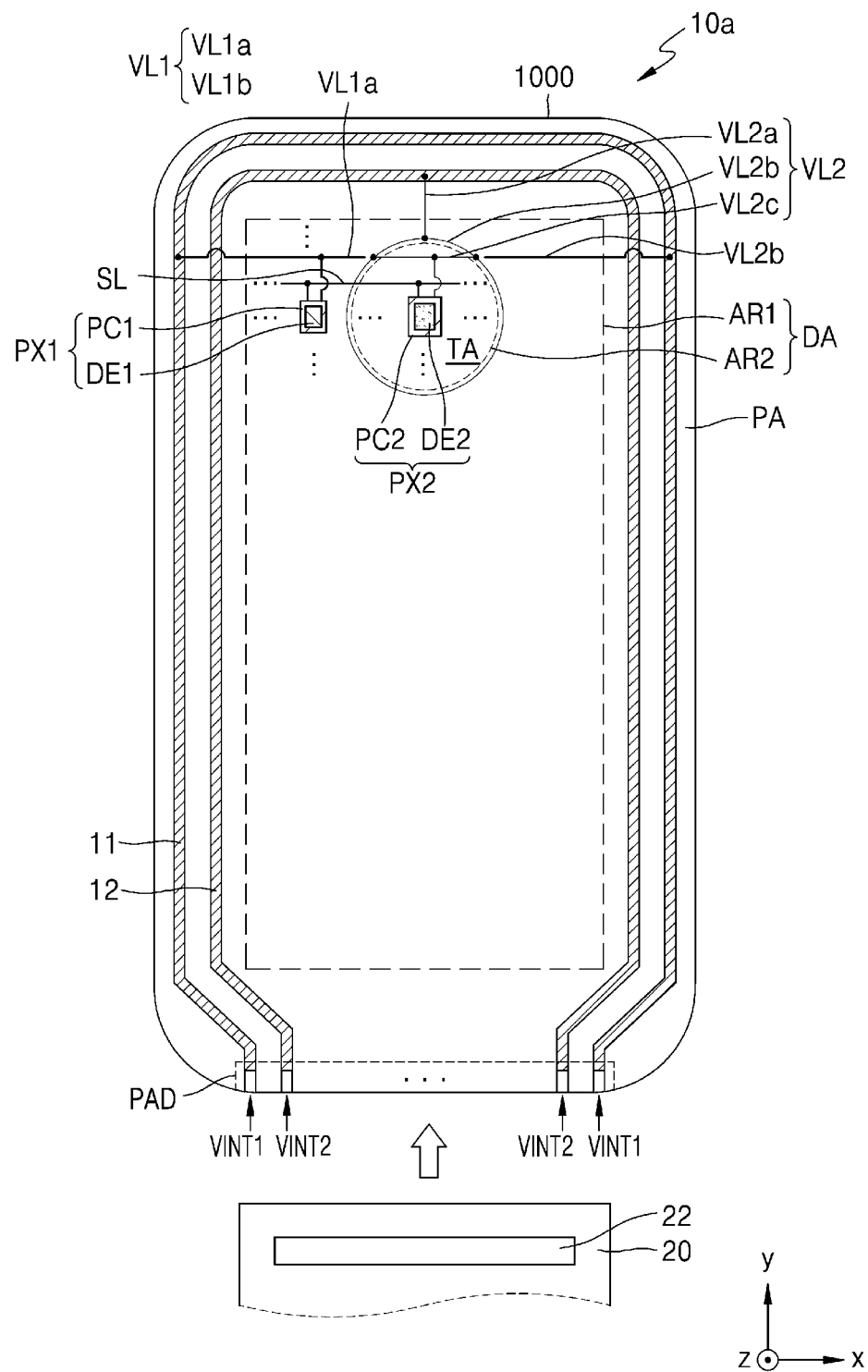
FIG. 11 is a schematic plan view of a display panel that may be included in the display apparatus of FIG. 9, according to an embodiment.

FIG. 11 is a schematic plan view of a display panel 10a that may be included in the display apparatus 1 of FIG. 9, according to an embodiment.

Referring to FIG. 11, various components that constitute the display panel 10a may be arranged on the substrate 1000. The display panel 10a may include a display area DA, and a peripheral area PA surrounding the display area DA. The display area DA may include a first area AR1 on which a main image is displayed, and a second area AR2 which includes a transmission area TA and on which an auxiliary image is displayed. The auxiliary image may form a single entire image together with the main image, or may be an image independent from the main image.

Because the second area AR2 has the transmission areas TA, a resolution of the second area AR2 may be lower than a resolution of the first area AR1. For example, the resolution of the second area AR2 may be about ½, ⅜, ⅓, ¼, ⅖, ⅛, ⅑, 1/12.25, or 1/16 of the resolution of the first area AR1. For example, the resolution of the first area AR1 may be about 400 ppi or greater, and the resolution of the second area AR2 may be about 200 ppi or about 100 ppi.

As described above with reference to FIGS. 9 and 10, the first pixels PX1 may be arranged in the first area AR1, and the second pixels PX2 may be arranged in the second area AR2. FIG. 11 illustrates a first pixel PX1 and a second pixel PX2 on the same row from among the first pixels PX1 and the second pixels PX2.

The first pixel PX1 may include a first pixel circuit PC1 and a first display element DE1, and the second pixel PX2 may include a second pixel circuit PC2 and a second display element DE2.

According to an embodiment, as shown in FIG. 11, an emission area of the second display element DE2 may be greater than that of the first display element DE1. A size (or an area) of the second pixel circuit PC2 may be greater than that of the first pixel circuit PC1. In other words, the emission area of the first display element DE1 and the emission area of the second display element DE2 may be different from each other, and the size of the first pixel circuit PC1 and the size of the second pixel circuit PC2 may be different from each other.

The first pixel circuit PC1 and the second pixel circuit PC2 may be electrically connected to outer circuits arranged in the peripheral area PA. A pad portion PAD, a first initializing voltage supply line 11, and a second initializing voltage supply line 12 may be arranged in the peripheral area PA. Each of the first initializing voltage supply line 11 and the second initializing voltage supply line 12 may have a loop shape of which one side is open, and may partially surround the display area DA. Although it is illustrated in FIG. 11 that each of the first initializing voltage supply line 11 and the second initializing voltage supply line 12 has a loop shape of which one side is open, each of the first initializing voltage supply line 11 and the second initializing voltage supply line 12 may have any of various other shapes. A gate driving circuit, a first driving voltage supply line, and a second driving voltage supply line may be arranged in the peripheral area PA.

The pad portion PAD may be on one side of the substrate 1000. The pad portion PAD may be exposed without being covered by an insulating layer, and may be connected to a display circuit board 20. A display driving unit 22 may be on the display circuit board 20.

The display driving unit 22 may generate a control signal that is transmitted to the gate driving circuit. The display driving unit 22 may generate a data signal, and the generated data signal may be transmitted to pixels located on the same column via fanout wiring and data lines connected to the fanout wiring.

The display driving unit 22 may supply the first initializing voltage VINT1 to the first initializing voltage supply line 11, and may supply the second initializing voltage VINT2 to the second initializing voltage supply line 12. The first initializing voltage VINT1 may be applied to the first pixel circuit PC1 of the first pixel PX1 via the first voltage line VL1 connected to the first initializing voltage supply line 11, and the second initializing voltage VINT2 may be applied to the second pixel circuit PC2 of the second pixel PX2 via the second voltage line VL2 connected to the second initializing voltage supply line 12. In this case, the level of the first initializing voltage VINT1 may be different from that of the second initializing voltage VINT2.

According to an embodiment, as shown in FIG. 11, the first voltage line VL1 may have a first portion VL1a and a second portion VL1b physically spaced apart from each other by the second area AR2. The first portion VL1a of the first voltage line VL1 may be connected to one side of the first initializing voltage supply line 11, and the second portion VL1b of the first voltage line VL1 may be connected to the other end of the first initializing voltage supply line 11. Each of the first portion VL1a and the second portion VL1b of the first voltage line VL1 may extend in a row direction (for example, an ±x direction).

First voltage lines VL1 connected to first pixels PX1 not arranged on the same row as the second pixels PX2 from among the first pixels PX1 may each extend in the row direction (for example, the ±x direction) without any gaps.

According to an embodiment, as shown in FIG. 11, the second voltage line VL2 may have a first portion VL2a, a second portion VL2b, and a third portion VL2c. The first portion VL2a of the second voltage line VL2 may connect the second portion VL2b of the second voltage line VL2 to the first initializing voltage supply line 12. The second portion VL2b of the second voltage line VL2 may surround at least a portion of the second area AR2. The third portion VL2c of the second voltage line VL2 may be connected to the second portion VL2b of the second voltage line VL2, and may extend in the row direction (for example, the ±x direction) to be connected to the second pixel circuit PC2 of the second pixel PX2. Because the third portion VL2c of the second voltage line VL2 extends in the row direction (for example, the ±x direction) to be connected to second pixels PX2 arranged on the same row, a plurality of third portions VL2c may be included.

Each of the first pixel circuit PC1 and the second pixel circuit PC2 may be connected to the first scan line SWL1 extending in the row direction (for example, the ±x direction). The first scan line SWL1 may sequentially transmit a first scan signal to the first pixel circuit PC1 and the second pixel circuit PC2. The first scan line SWL1 may be connected to the gate driving circuit arranged in the peripheral area PA.

In synchronization with the first scan signal transmitted by the first scan line SWL1, the first initializing voltage VINT1 may be applied to the gate of the first driving transistor of the first pixel circuit PC1 or may be applied to the anode of the first display element DE1. In synchronization with the first scan signal transmitted by the first scan line SWL1, the second initializing voltage VINT2 may be applied to the gate of the second driving transistor of the second pixel circuit PC2 or may be applied to the anode of the second display element DE2.

As such, the first initializing voltage VINT1 and the second initializing voltage VINT2 having different levels are applied to the first pixel circuit PC1 and the second pixel circuit PC2 having different sizes, so that luminance differences between frames in both the first pixel PX1 and the second pixel PX2 are reduced, thereby preventing visual recognition of flickering. In other words, flickering may be prevented from being visually recognized in both the first area AR1 and the second area AR2 having different resolutions.

Figure 12:
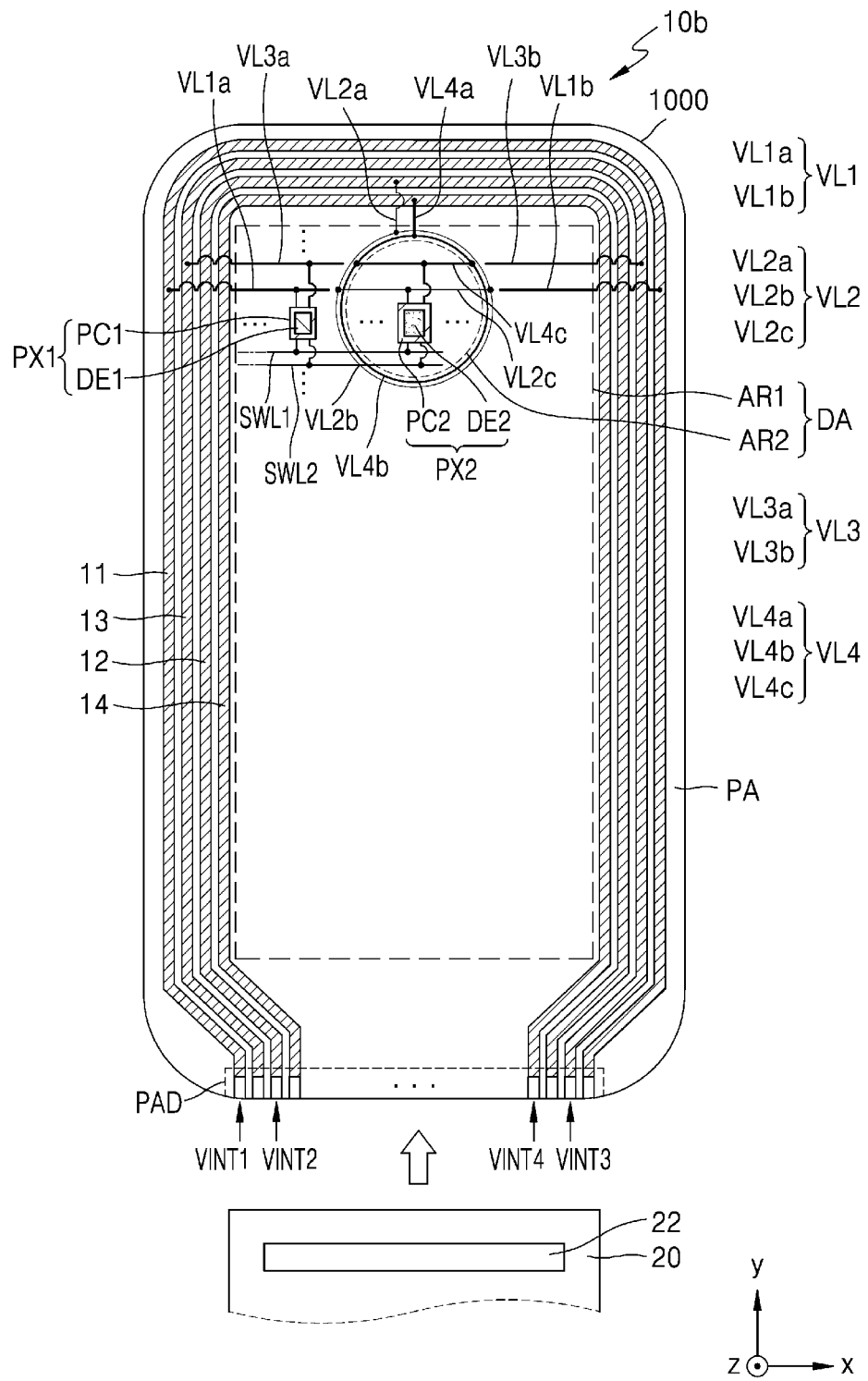
FIG. 12 is a schematic plan view of a display panel that may be included in the display apparatus of FIG. 9, according to another embodiment.

FIG. 12 is a schematic plan view of a display panel 10b that may be included in the display apparatus 1 of FIG. 9, according to another embodiment. FIG. 12 is a modification of FIG. 11, and is thus different therefrom in the structures of voltage wiring and an initializing voltage supply line. Hereinafter, overlapping contents therebetween will be replaced with the description of FIG. 11, and the differences will be mainly described for sake of brevity.

Referring to FIG. 12, a third initializing voltage supply line 13 and a fourth initializing voltage supply line 14 may be further arranged in the peripheral area PA of the display panel 10b. Each of the third initializing voltage supply line 13 and the fourth initializing voltage supply line 14 may have a loop shape of which one side is open, and may partially surround the display area DA.

FIG. 12 illustrates that the fourth initializing voltage supply line 14, the second initializing voltage supply line 12, the third initializing voltage supply line 13, and the first initializing voltage supply line 11 are sequentially adjacent to the display area DA. However, an arrangement order of the first through fourth initializing voltage supply lines 11, 12, 13, and 14 may vary.

The display driving unit 22 may supply the third initializing voltage VINT3 to the third initializing voltage supply line 13, and may supply the fourth initializing voltage VINT4 to the fourth initializing voltage supply line 14. The third initializing voltage VINT3 may be applied to the first pixel circuit PC1 of the first pixel PX1 via a first voltage line VL3 connected to the third initializing voltage supply line 13, and the fourth initializing voltage VINT4 may be applied to the second pixel circuit PC2 of the second pixel PX2 via a fourth voltage line VL4 connected to the fourth initializing voltage supply line 14. At this time, a level of the third initializing voltage VINT3 may be different from that of the fourth initializing voltage VINT4.

According to an embodiment, as shown in FIG. 12, the third voltage line VL3 may have a first portion VL3a and a second portion VL3b physically spaced apart from each other by the second area AR2. The first portion VL3a of the third voltage line VL3 may be connected to one side of the third initializing voltage supply line 13, and the second portion VL3b of the third voltage line VL3 may be connected to the other end of the third initializing voltage supply line 13. Each of the first portion VL3a and the second portion VL3b of the third voltage line VL3 may extend in a row direction (for example, an ±x direction).

Third voltage lines VL3 connected to first pixels PX1 not arranged on the same row as the second pixels PX2 from among the first pixels PX1 may each extend in the row direction (for example, the ±x direction) without gaps.

According to an embodiment, as shown in FIG. 12, the fourth voltage line VL4 may have a first portion VL4a, a second portion VL4b, and a third portion VL4c. The first portion VL4a of the fourth voltage line VL4 may connect the second portion VL4b of the fourth voltage line VL4 to the fourth initializing voltage supply line 14. The second portion VL4b of the fourth voltage line VL4 may surround at least a portion of the second area AR2. The third portion VL4c of the fourth voltage line VL4 may be connected to the second portion VL4b of the fourth voltage line VL4, and may extend in the row direction (for example, the ±x direction) to be connected to the second pixel circuit PC2 of the second pixel PX2. Because the third portion VL4c of the fourth voltage line VL4 extends in the row direction (for example, the ±x direction) to be connected to second pixels PX2 arranged on the same row, a plurality of third portions VL4c may be included.

Each of the first pixel circuit PC1 and the second pixel circuit PC2 may be connected to the second scan line SWL2 extending in the row direction (for example, the ±x direction). The second scan line SWL2 may sequentially transmit a second scan signal to the first pixel circuit PC1 and the second pixel circuit PC2. The second scan line SWL2 may be connected to the gate driving circuit arranged in the peripheral area PA.

The first initializing voltage VINT1 may be applied to the gate of the first driving transistor of the first pixel circuit PC1 in synchronization with the first scan signal transmitted by the first scan line SWL1, and may be applied to the anode of the first display element DE1 in synchronization with the second scan signal transmitted by the second scan line SWL2. The second initializing voltage VINT2 may be applied to the gate of the second driving transistor of the second pixel circuit PC2 in synchronization with the first scan signal transmitted by the first scan line SWL1, and may be applied to the anode of the second display element DE2 in synchronization with the second scan signal transmitted by the second scan line SWL2.

As another example, the first initializing voltage VINT1 may be applied to the anode of the first display element DE1 in synchronization with the first scan signal transmitted by the first scan line SWL1, and may be applied to the anode of the first driving transistor of the first pixel circuit PC1 in synchronization with the second scan signal transmitted by the second scan line SWL2. The second initializing voltage VINT2 may be applied to the anode of the second display element DE2 in synchronization with the first scan signal transmitted by the first scan line SWL1, and may be applied to the anode of the second driving transistor of the second pixel circuit PC2 in synchronization with the second scan signal transmitted by the second scan line SWL2.

As such, the first and second initializing voltages VINT1 and VINT2 and the third and fourth initializing voltage VINT3 and VINT4 having different levels are applied to the first pixel circuit PC1 and the second pixel circuit PC2 having different sizes, so that luminance differences between frames in both the first pixel PX1 and the second pixel PX2 are reduced, thereby preventing visual recognition of flickering. In other words, flickering may be prevented from being visually recognized in both the first area AR1 and the second area AR2 having different resolutions.

Figure 13:
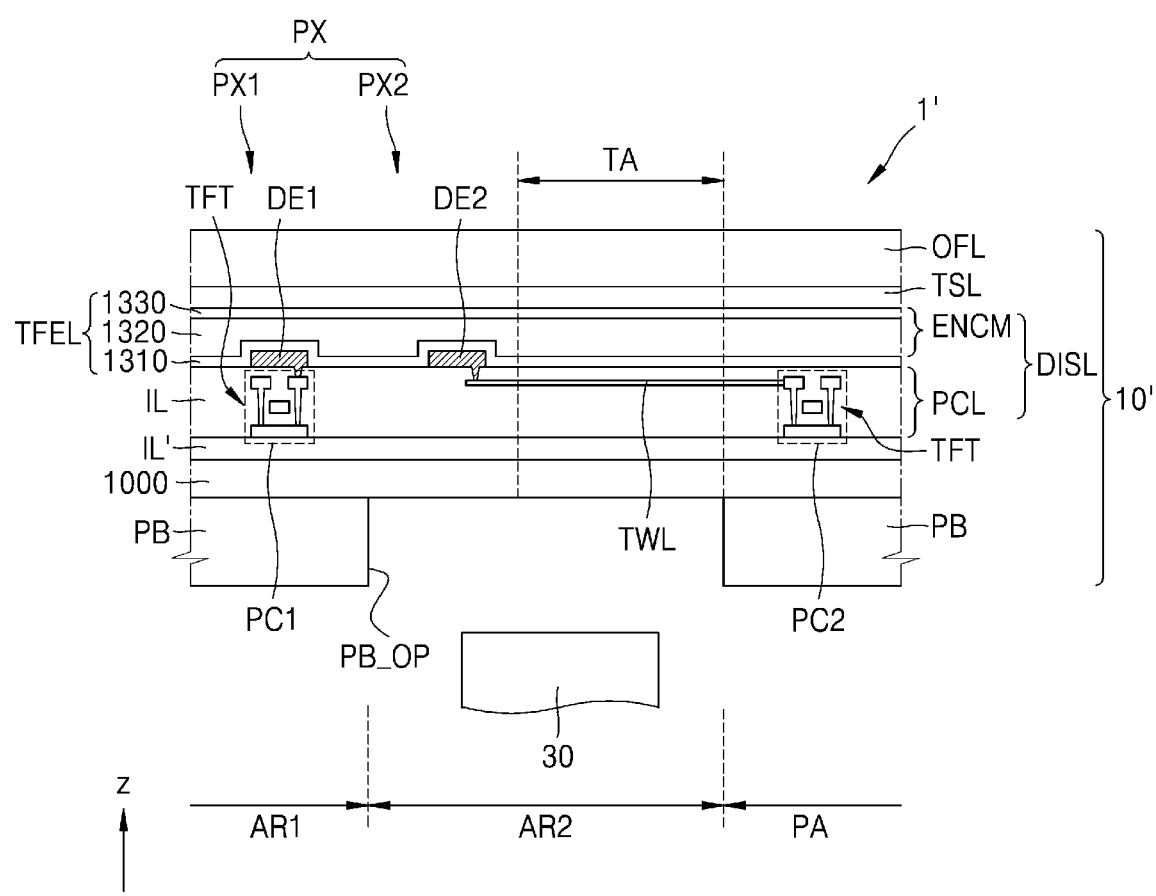
FIG. 13 is a schematic cross-sectional view of a portion of a cross-section of a display apparatus according to another embodiment.

FIG. 13 is a schematic cross-sectional view of a portion of a cross-section of a display apparatus 1' according to another embodiment. FIG. 13 is a modification of FIG. 10, and is thus different therefrom in the structure of a second pixel. Hereinafter, overlapping contents therebetween will be replaced with the description of FIG. 10, and the differences will be mainly described for sake of brevity.

Referring to FIG. 13, the display apparatus 1' may include a display panel 10' and the component 30 overlapped by the display panel 10'. A cover window may be further arranged over the display panel 10' to protect the display panel 10'.

The display panel 10' includes the second area AR2, which overlaps the component 30, and the first area AR1, on which a main image is displayed. The display panel 10' may include a substrate 1000, a display layer DISL, a touch screen layer TSL, and an optical functional layer OFL on the substrate 1000, and a protection member PB below the substrate 1000.

According to an embodiment, a second pixel circuit PC2 driving a second display element DE2 may not be arranged in the second area AR2 but may be arranged in the peripheral area PA. According to another embodiment, the peripheral area PA may be arranged between the first area AR1 and the second area AR2. In this way, various modifications may be made. In other words, the second pixel circuit PC2 may be arranged to not overlap the second display element DE2.

The second pixel circuit PC2 may include at least one thin-film transistor TFT, and may be electrically connected to the second display element DE2 by a connection line TWL. The second pixel circuit PC2 may control light emission of the second display element DE2. The second pixel PX2 may be implemented by light emission of the second display element DE2. The connection line TWL may include a transparent conductive material. Because the connection line TWL may include a transparent conductive material having high transmittance, even when the connection line TWL is arranged in the transmittance area TA, transmittance of the transmittance area TA may be secured.

The first display element DE1 and the second display element DE2, which are display elements, may be covered by a thin-film encapsulation layer TFEL or may be covered by an encapsulation substrate. According to some embodiments, the thin-film encapsulation layer TFEL may include at least one inorganic encapsulation layer and at least one organic encapsulation layer, as shown in FIG. 13. According to an embodiment, the thin-film encapsulation layer TFEL may include first and second inorganic encapsulation layers 1310 and 1330 and an organic encapsulation layer 1320 therebetween.

The first inorganic encapsulation layer 1310 and the second inorganic encapsulation layer 1330 may include at least one inorganic insulating material such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by chemical vapor deposition (CVD). The organic encapsulation layer 1320 may include a polymer-based material. Examples of the polymer-based material may include a silicon-based resin, an acryl-based resin, an epoxy-based resin, polyimide, and polyethylene.

The first inorganic encapsulation layer 1310, the organic encapsulation layer 1320, and the second inorganic encapsulation layer 1330 may each be integrally provided to cover the first area AR1 and the second area AR2.

The touch screen layer TSL may obtain coordinate information based on an external input, for example, a touch event. The touch screen layer TSL may include a touch electrode and touch wires connected to the touch electrode. The touch screen layer TSL may sense an external input according to a self capacitance method or a mutual capacitance method.

The touch screen layer TSL may be on the thin-film encapsulation layer TFE. Alternatively, the touch screen layer TSL may be separately provided on a touch substrate and then coupled to the upper surface of the thin-film encapsulation layer TFEEL via an adhesive layer such as an optically clear adhesive (OCA). According to an embodiment, the touch screen layer TSL may be provided directly on the thin-film encapsulation layer TFEL. In this case, no adhesive layers may be between the touch screen layer TSL and the thin-film encapsulation layer TFEL.

The optical functional layer 50 may include an anti-reflection layer. The anti-reflection layer may reduce reflectivity of light (external light) that is incident from an external source toward the display apparatus 1'. According to some embodiments, the optical functional layer OFL may be a polarization film. According to some embodiments, the optical functional layer OFL may be implemented using a filter plate including a black matrix and color filters.

Figure 14:
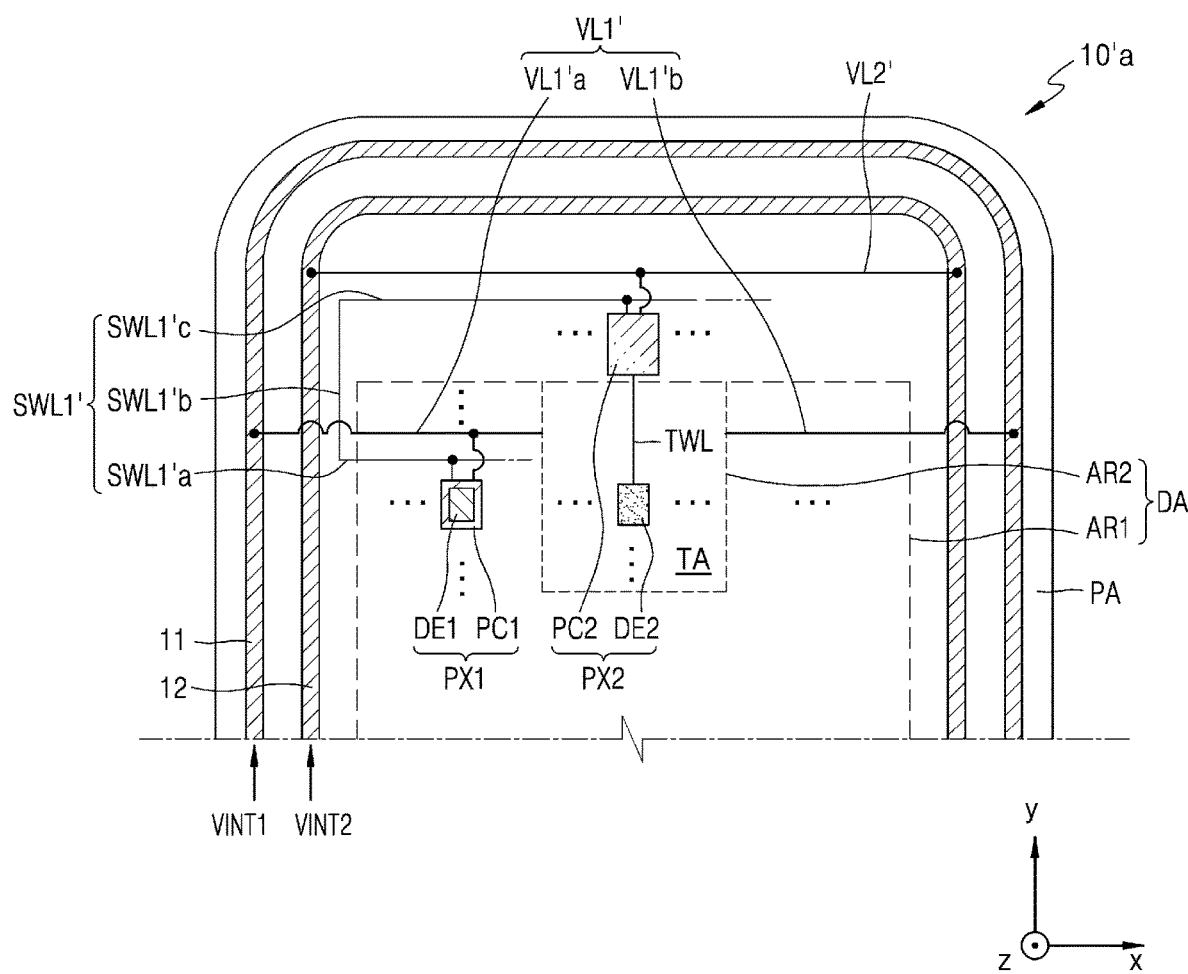
FIG. 14 is a schematic plan view of a display panel that may be included in the display apparatus of FIG. 9, according to another embodiment.

FIG. 14 is a schematic plan view of a display panel 10'a that may be included in the display apparatus 1 of FIG. 9, according to another embodiment. FIG. 14 is a modification of FIG. 11, and is thus different therefrom in the structure of a second pixel. Hereinafter, overlapping contents therebetween will be replaced with the description of FIG. 11, and the differences will be mainly described for sake of brevity.

Referring to FIG. 14, the display panel 10'a may include a display area DA including a second area AR2 and a first area AR1 surrounding at least a portion of the second area AR2, and a peripheral area PA surrounding at least a portion of the display area DA. In this case, one side of the second area AR2 may contact the peripheral area PA as shown in FIG. 14.

A first pixel PX1 including a first display element DE1 and a first pixel circuit PC1 may be arranged in the first area AR1. The first display element DE1 and the first pixel circuit PC1 may at least partially overlap each other.

A second display element DE2 of a second pixel PX2 may be arranged in the second area AR2, and a second pixel circuit PC2 of the second pixel PX2 may be arranged in the peripheral area PA. The second pixel circuit PC2, driving a second display element DE2, may not be arranged in the second area AR2 but may be arranged in the peripheral area PA. According to another embodiment, the peripheral area PA may be arranged between the first area AR1 and the second area AR2. In this way, various modifications may be made. In other words, the second pixel circuit PC2 may be arranged to not overlap the second display element DE2.

The second pixel circuit PC2 may be electrically connected to the second display element DE2 by a connection line TWL. The second pixel circuit PC2 may control light emission of the second display element DE2 via the connection line TWL. The second pixel PX2 may be implemented by light emission of the second display element DE2. The connection line TWL may include a transparent conductive material. Because the connection line TWL may include a transparent conductive material having high transmittance, even when the connection line TWL is arranged in the transmittance area TA, transmittance of the transmittance area TA may be secured.

The first pixel circuit PC1 of the first pixel PX1 may be connected to the first initializing voltage supply line 11 via a first voltage line VL1' to receive the first initializing voltage VINT1. The first voltage line VL1' may extend in the row direction (for example, the ±x direction) and may at least partially overlap the first area AR1.

The first voltage line VL1' may have a first portion VL1'a and a second portion VL1'b physically separated from each other by the second area AR2. The first portion VL1'a of the first voltage line VL1' may be connected to one side of the first initializing voltage supply line 11, and the second portion VL1'b of the first voltage line VL1' may be connected to the other end of the first initializing voltage supply line 11.

The second pixel circuit PC2 of the second pixel PX2 may be connected to the second initializing voltage supply line 12 via a second voltage line VL2' to receive the second initializing voltage VINT2. The second voltage line VL2' may be arranged in the peripheral area PA and extend in the row direction (for example, the ±x direction). Both ends of the second voltage line VL2' may be connected to one side and the other side of the second initializing voltage supply line 12, respectively.

The first pixel circuit PC1 and the second pixel circuit PC2 may be connected to a first scan line SWL1'. The first scan line SWL1' may have a first portion SWL1'a extending in the row direction (for example, the ±x direction), a second portion SWL1'b extending in the row direction (for example, a ±y direction), and a third portion SWL1'c extending in the row direction (for example, the ±x direction).

The first portion SWL1'a of the first scan line SWL1' may be connected to the first pixel circuit PC1, the third portion SWL1'c of the first scan line SWL1' may be connected to the second pixel circuit PC2, and the second portion SWL1'b of the first scan line SWL1' may connect the first portion SWL1'a to the third portion SWL1'c. The first portion SWL1'a of the first scan line SWL1' may at least partially overlap the first area AR1. The second portion SWL1'b and the third portion SWL1'c of the first scan line SWL1' may at least partially overlap the peripheral area PA.

The first scan line SWL1 may sequentially transmit a first scan signal to the first pixel circuit PC1 and the second pixel circuit PC2. In synchronization with the first scan signal transmitted by the first scan line SWL1', the first initializing voltage VINT1 may be applied to the gate of the first driving transistor of the first pixel circuit PC1 or may be applied to the anode of the first display element DE1. In synchronization with the first scan signal transmitted by the first scan line SWL1', the second initializing voltage VINT2 may be applied to the gate of the second driving transistor of the second pixel circuit PC2 or may be applied to the anode of the second display element DE2.

As such, the first initializing voltage VINT1 and the second initializing voltage VINT2 having different levels are applied to the first pixel circuit PC1 and the second pixel circuit PC2 having different sizes, so that luminance differences between frames in both the first pixel PX1 and the second pixel PX2 are reduced, thereby preventing visual recognition of flickering. In other words, flickering may be prevented from being visually recognized in both the first area AR1 and the second area AR2 having different resolutions.

Figure 15:
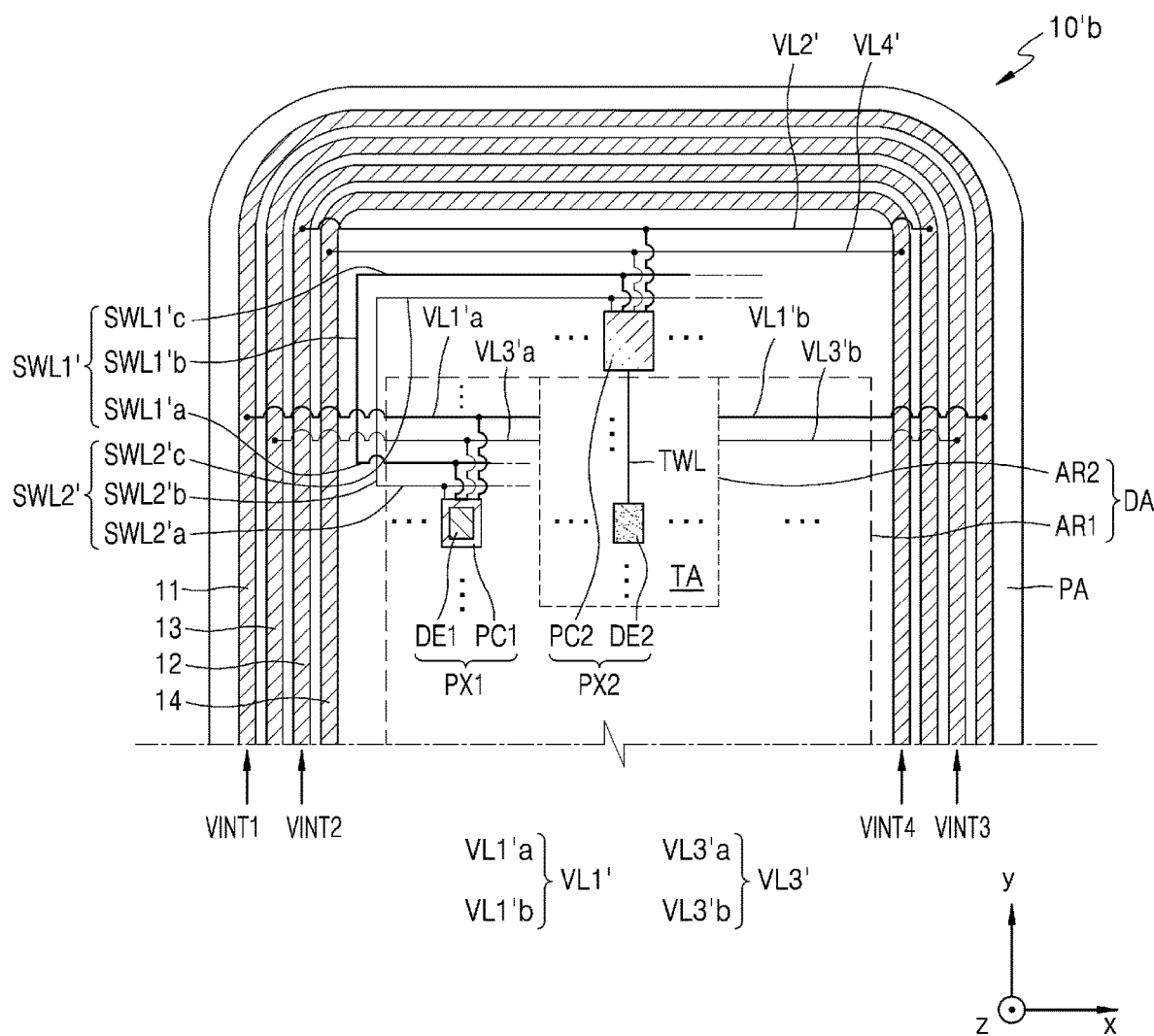
FIG. 15 is a schematic plan view of a display panel that may be included in the display apparatus of FIG. 9, according to another embodiment.

FIG. 15 is a schematic plan view of a display panel that may be included in the display apparatus of FIG. 9, according to another embodiment; FIG. 15 is a modification of FIG. 14, and is thus different therefrom in the structures of voltage wiring and an initializing voltage supply line. Hereinafter, overlapping contents therebetween will be replaced with the description of FIG. 14, and the differences will be mainly described for sake of brevity.

Referring to FIG. 15, a third initializing voltage supply line 13 and a fourth initializing voltage supply line 14 may be further arranged in the peripheral area PA of the display panel 10'b. Each of the third initializing voltage supply line 13 and the fourth initializing voltage supply line 14 may have a loop shape of which one side is open, and may partially surround the display area DA.

The first pixel circuit PC1 of the first pixel PX1 may be connected to the third initializing voltage supply line 13 via a third voltage line VL3' to receive the first initializing voltage VINT3. The third voltage line VL3' may extend in the row direction (for example, the ±x direction) and may at least partially overlap the first area AR1.

The third voltage line VL3' may have a first portion VL3'a and a second portion VL3'b physically separated from each other by the second area AR2. The first portion VL3'a of the third voltage line VL3' may be connected to one side of the third initializing voltage supply line 13, and the second portion VL3'b of the third voltage line VL3' may be connected to the other end of the third initializing voltage supply line 13.

The second pixel circuit PC2 of the second pixel PX2 may be connected to the fourth initializing voltage supply line 14 via a fourth voltage line VL4' to receive the fourth initializing voltage VINT4. The fourth voltage line VL4' may be arranged in the peripheral area PA and extend in the row direction (for example, the ±x direction). Both ends of the fourth voltage line VL4' may be connected to one side and the other side of the fourth initializing voltage supply line 14, respectively.

The first pixel circuit PC1 and the second pixel circuit PC2 may be connected to a second scan line SWL2'. The second scan line SWL2' may sequentially transmit a second scan signal to the first pixel circuit PC1 and the second pixel circuit PC2 arranged on the same row. The second scan line SWL2' may have a first portion SWL2'$a$ extending in the row direction (for example, the ±x direction), a second portion SWL2'$b$ extending in the row direction (for example, a ±y direction), and a third portion SWL2'$c$ extending in the row direction (for example, the ±x direction).

The first portion SWL2'$a$ of the second scan line SWL2' may be connected to the first pixel circuit PC1, the third portion SWL2'$c$ of the second scan line SWL2' may be connected to the second pixel circuit PC2, and the second portion SWL2'$b$ of the second scan line SWL2' may connect the first portion SWL2'$a$ to the third portion SWL2'$c$. The first portion SWL2'$a$ of the second scan line SWL2' may at least partially overlap the first area AR1. The second portion SWL2'$b$ and the third portion SWL2'$c$ of the second scan line SWL2' may at least partially overlap the peripheral area PA.

The first initializing voltage VINT1 may be applied to the gate of the first driving transistor of the first pixel circuit PC1 in synchronization with the first scan signal transmitted by the first scan line SWL1', and may be applied to the anode of the first display element DE1 in synchronization with the second scan signal transmitted by the second scan line SWL2'. The second initializing voltage VINT2 may be applied to the gate of the second driving transistor of the second pixel circuit PC2 in synchronization with the first scan signal transmitted by the first scan line SWL1', and may be applied to the anode of the second display element DE2 in synchronization with the second scan signal transmitted by the second scan line SWL2'.

As such, the first and second initializing voltages VINT1 and VINT2 and the third and fourth initializing voltage VINT3 and VINT4 having different levels are applied to the first pixel circuit PC1 and the second pixel circuit PC2 having different sizes, so that luminance differences between frames in both the first pixel PX1 and the second pixel PX2 are reduced, thereby preventing visual recognition of flickering. In other words, flickering may be prevented from being visually recognized in both the first area AR1 and the second area AR2 having different resolutions.

Figure 16:
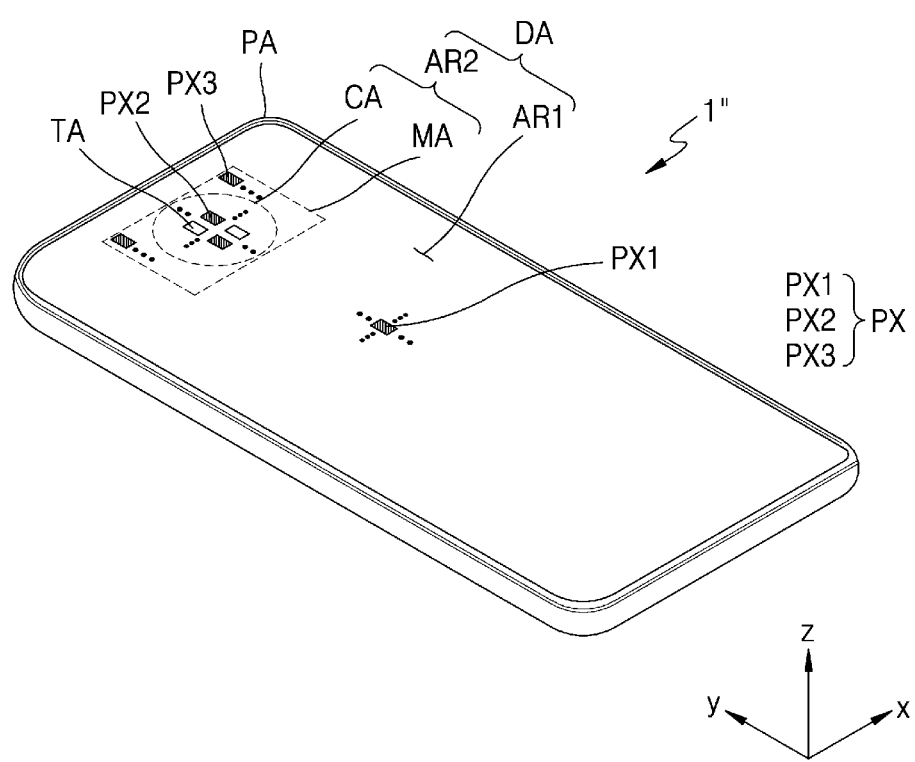
FIG. 16 is a schematic perspective view of a display apparatus according to another embodiment.

FIG. 16 is a schematic perspective view of a display apparatus 1'' according to another embodiment. FIG. 16 is a modification of FIG. 9, and is thus different therefrom in the structure of a second area. Hereinafter, overlapping contents therebetween will be replaced with the description of FIG. 9, and the differences will be mainly described for sake of brevity.

Referring to FIG. 16, a second area AR2 of the display apparatus 1'' may include a component area CA, and a middle area MA at least partially surrounding the component area CA. The middle area MA may be located between the component area CA and the first area AR1. In FIG. 16, the second area AR2 is located inside the first area AR1. However, according to another embodiment, one side of the second area AR2 may extend to contact the peripheral area PA.

Second pixels PX2 may be arranged in the component area CA of the second area AR2, and third pixels PX3 may be arranged in the middle area MA of the second area AR2. Each of the second pixels PX2 and the third pixels PX3 may provide a certain image by emitting light. An image displayed by the second area AR2 is an auxiliary image and thus may have lower resolution than an image displayed by the first area AR1.

Because the component area CA of the second area AR2 may include the transmission area TA capable of transmitting light and sound and no second pixels PX2 are arranged in the transmission area TA, the number of second pixels PX2 per unit area may be less than the number of first pixels PX1 per unit area.

Because the middle area MA of the second area AR2 includes no transmittance areas TA but a pixel circuit (for example, a second pixel circuit PC2 of FIG. 17) arranged on the middle area MA is included to drive a second pixel PX2 on the component area CA, the number of third pixels PX3 per unit area may be less than the number of first pixels PX1 per unit area.

Because resolution may be the same within the second area AR2, the number of second pixels PX2 per unit area may be equal to the number of third pixels PX3 per unit area.

Figure 17:
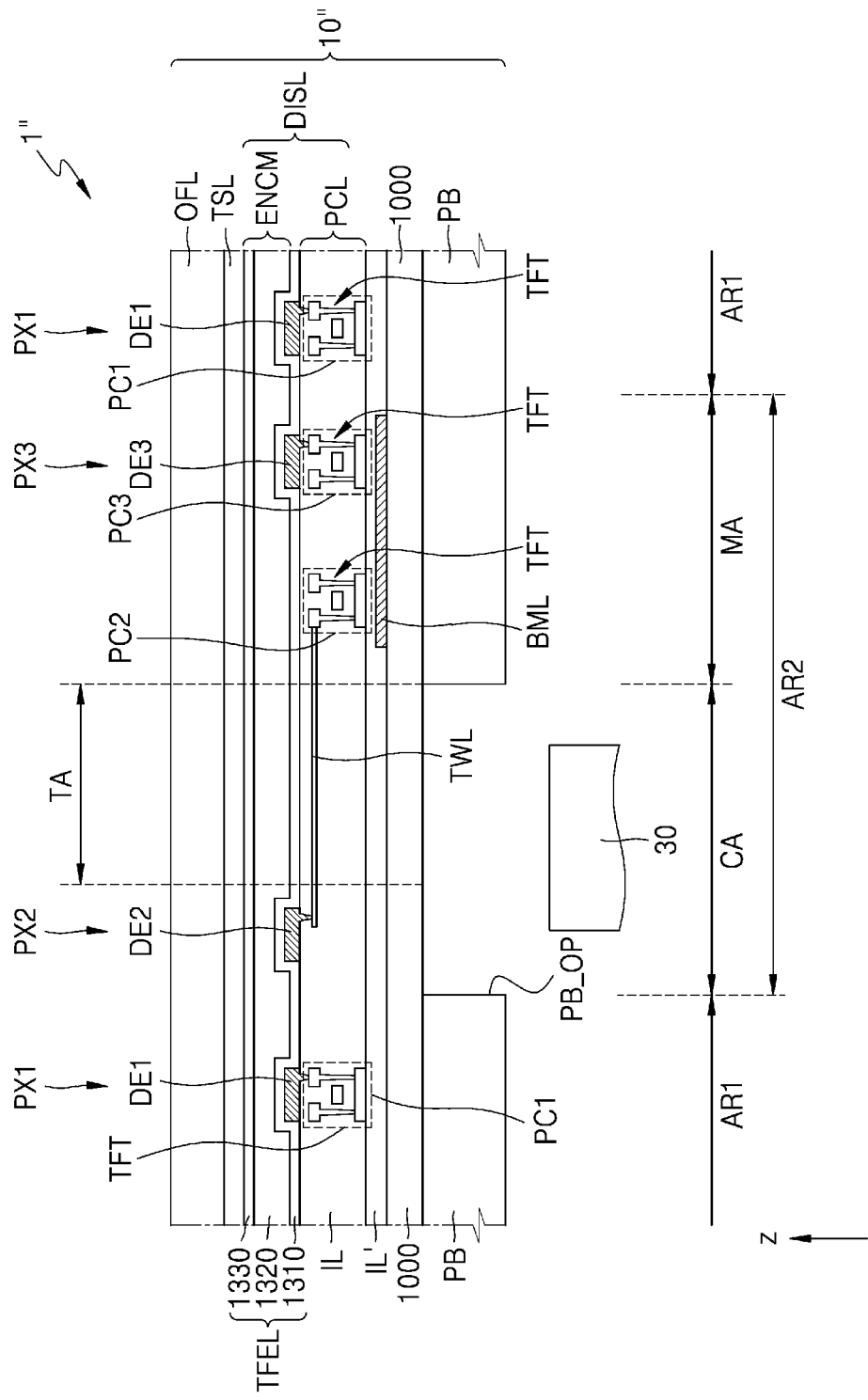
FIG. 17 is a schematic cross-sectional view of a portion of a cross-section of a display apparatus according to another embodiment.

FIG. 17 is a schematic cross-sectional view of a portion of a cross-section of the display apparatus 1'' according to another embodiment. FIG. 17 is a modification of FIG. 10, and is thus different therefrom in the structure of a second area. Hereinafter, overlapping contents therebetween will be replaced with the description of FIG. 10, and the differences will be mainly described for sake of brevity.

Referring to FIG. 17, the display apparatus 1'' may include a display panel 10'' and the component 30 overlapped by the display panel 10''. The display panel 10'' may include a second area AR2 on which an auxiliary image is displayed, and a first area AR1 on which a main image is displayed. The second area AR2 may include a component area CA, which is an area overlapping the component 30, and a middle area MA surrounding the component area CA.

A first display element DE1 and a first pixel circuit PC1 connected thereto may be arranged in the first area AR1 of the display panel 10''. The first pixel circuit PC1 may include at least one thin-film transistor TFT, and may control an operation of the first display element DE1. The first pixel PX1 may be implemented by light emission of the first display element DE1.

A second display element DE2 may be arranged in the component area CA of the display panel 10'' to implement the second pixel PX2. According to an embodiment, a second pixel circuit PC2 may be arranged to not overlap the second display element DE2. In other words, the second pixel circuit PC2 driving the second display element DE2 may not be arranged in the component area CA, but may be arranged in the middle area MA between the first area AR1 and the component area CA.

The second pixel circuit PC2 may include at least one thin-film transistor TFT, and may be electrically connected to the second display element DE2 by a connection line TWL. The connection line TWL may include a transparent conductive material. The second pixel circuit PC2 may control an operation of the second display element DE2. The second pixel PX2 may be implemented by light emission of the second display element DE2.

An area of the component area CA where no second display elements DE2 are arranged may be defined as a transmittance area TA. The transmission area TA may transmit a light/signal emitted by the component 30 arranged to correspond to the component area CA or a light/signal incident upon the component 30.

The connection line TWL connecting the second pixel circuit PC2 to the second display element DE2 may be arranged to at least partially overlap the transmittance area TA. Because the connection line TWL may include a transparent conductive material having high transmittance, even when the connection line TWL is arranged in the transmittance area TA, transmittance of the transmittance area TA may be secured. According to an embodiment, because no second pixel circuits PC2 are arranged in the component area CA, it may be easy to increase the area of the transmittance area TA, and light transmittance may be further improved.

A third display element DE3 and a third pixel circuit PC3 connected thereto may be arranged in the middle area MA of the display panel 10" to realize a third pixel PX3. The second pixel circuit PC2 and the third pixel circuit PC3 arranged in the middle area MA may be adjacent to each other and may alternate with each other.

As shown in FIG. 17, a bottom metal layer BML may be arranged under the second pixel circuit PC2 and the third pixel circuit PC3 of the middle area MA. The bottom metal layer BML may be arranged to overlap pixel circuits in order to protect the pixel circuits. According to an embodiment, the bottom metal layer BML may be arranged between a portion of the substrate 1000 facing the middle area MA and the second pixel circuit PC2 and the third pixel circuit PC3, to overlap the second pixel circuit PC2 and the third pixel circuit PC3. The bottom metal layer BML may prevent external light from reaching the second pixel circuit PC2 and the third pixel circuit PC3. According to another embodiment, the bottom metal layer BML may be arranged to correspond to the entire display area DA, and may include a bottom-hole corresponding to the component area CA. According to another embodiment, the bottom metal layer BML may be omitted.

Figure 18:
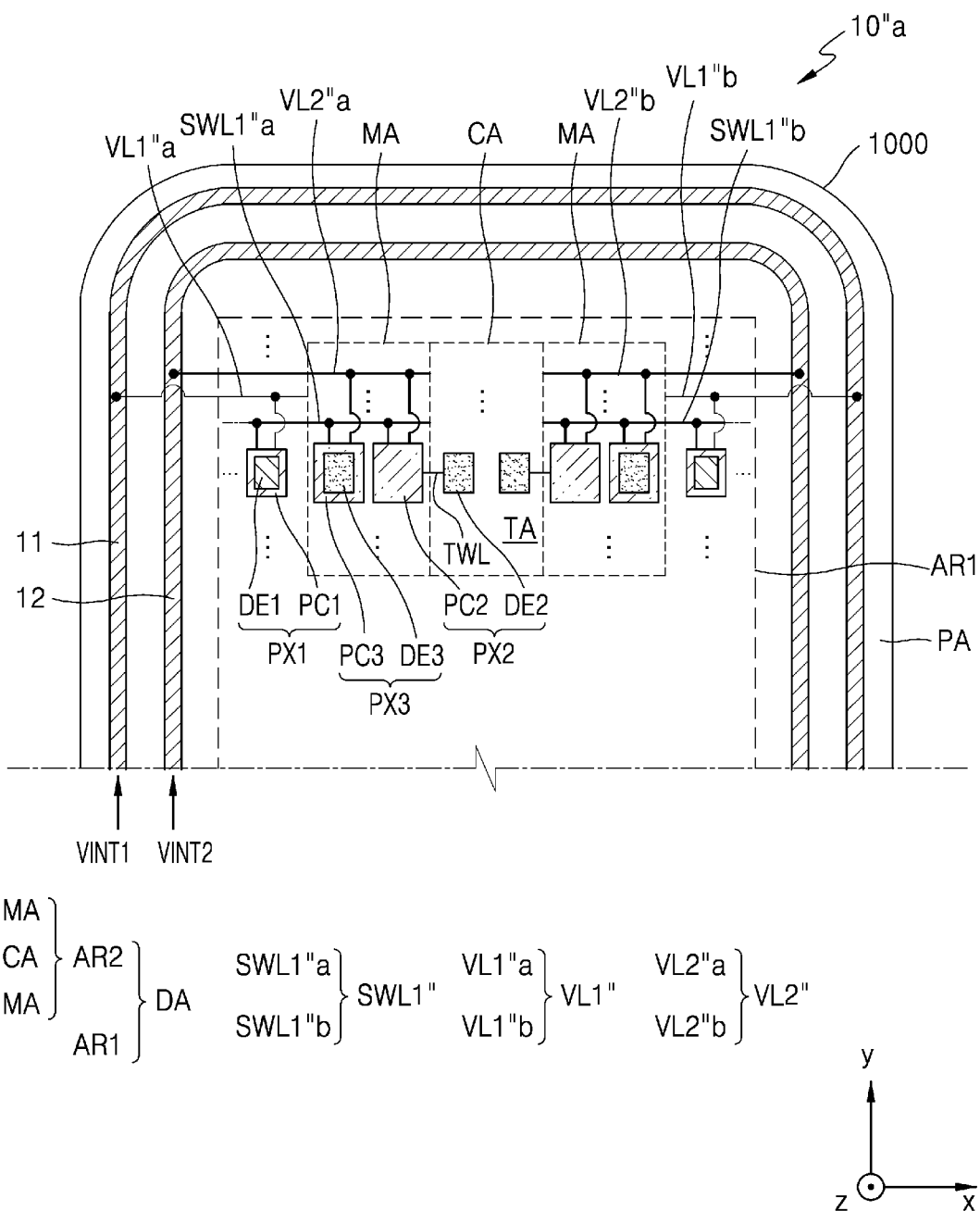
FIG. 18 is a schematic plan view of a display panel that may be included in the display apparatus of FIG. 16, according to an embodiment.

FIG. 18 is a schematic plan view of a display panel 10"a that may be included in the display apparatus 1" of FIG. 16, according to an embodiment. FIG. 18 is a modification of FIG. 11, and is thus different therefrom in the structures of a second pixel and a third pixel. Hereinafter, overlapping contents therebetween will be replaced with the description of FIG. 11, and the differences will be mainly described for sake of brevity.

Referring to FIG. 18, the display panel 10"a may include a display area DA including a second area AR2 and a first area AR1 surrounding at least a portion of the second area AR2, and a peripheral area PA surrounding at least a portion of the display area DA. The second area AR2 may include a component area CA, and a middle area MA surrounding at least a portion of the component area CA.

A first pixel PX1 including a first display element DE1 and a first pixel circuit PC1 may be arranged in the first area AR1. The first display element DE1 and the first pixel circuit PC1 may at least partially overlap each other.

The second display element DE2 may be arranged in the component area CA of the second area AR2, and a second pixel circuit PC2 and a third pixel PX3 including a third display element DE3 and a third pixel circuit PC3 connected thereto may be arranged in the middle area MA of the second area AR2. The second pixel circuit PC2 may be electrically connected to the second display element DE2 by a connection line TWL. The second display element DE2 and the second pixel circuit PC2 may not overlap each other, but the third display element DE3 and the third pixel circuit PC3 may at least partially overlap each other.

According to an embodiment, as shown in FIG. 18, an emission area of the second display element DE2 may be greater than that of the first display element DE1. The emission area of the second display element DE2 may be equal to that of the third display element DE3. A size (or an area) of the second pixel circuit PC2 may be greater than that of the first pixel circuit PC1. The size (or an area) of the second pixel circuit PC2 may be equal to that of the third pixel circuit PC3.

In other words, the emission area of the first display element DE1 and the emission area of the second display element DE2 may be different from each other, and the size of the first pixel circuit PC1 and the size of the second pixel circuit PC2 may be different from each other. The emission area of the first display element DE1 and the emission area of the third display element DE3 may be different from each other, and the size of the first pixel circuit PC1 and the size of the third pixel circuit PC3 may be different from each other. The third pixel circuit PC3 may be substantially the same as the second pixel circuit PC2. The third pixel circuit PC3 may have substantially the same configuration as the second pixel circuit PC2. For example, the third pixel circuit PC3 may correspond to the second pixel circuit PC2 of FIG. 5 or 8.

Because the component area CA of the second area AR2 may include the transmission area TA capable of transmitting light and sound and no second display elements DE2 are arranged in the transmission area TA, the number of second display elements DE2 per unit area may be less than the number of first display elements DE1 per unit area.

Because the middle area MA of the second area AR2 includes no transmittance areas TA but second pixel circuits PC2 are arranged on the middle area MA and no third display elements DE3 are arranged on the second pixel circuits PC2, the number of third display elements DE3 per unit area may be less than that of first display elements DE1 per unit area.

Because resolution may be the same within the second area AR2, the number of second display elements DE2 per unit area may be equal to the number of third display elements DE3 per unit area.

The first pixel circuit PC1 of the first pixel PX1 may be connected to the first initializing voltage supply line 11 via a first voltage line VL1" to receive the first initializing voltage VINT1. The first voltage line VL1" may extend in the row direction (for example, the ±x direction) and may at least partially overlap the first area AR1.

The first voltage line VL1" may have a first portion VL1"a and a second portion VL1"b physically separated from each other by the second area AR2. The first portion VL1"a of the first voltage line VL1" may be connected to one side of the first initializing voltage supply line 11, and the second portion VL1"b of the first voltage line VL1" may be connected to the other end of the first initializing voltage supply line 11.

The second pixel circuit PC2 of the second pixel PX2 and the third pixel circuit PC3 of the third pixel PX3 may be connected to the second initializing voltage supply line 12 via a second voltage line VL2" to receive the second initializing voltage VINT2. The second voltage line VL2" may extend in the row direction (for example, the ±x direction) and may at least partially overlap the first area AR1 and the middle area MA.

The second voltage line VL2" may have a first portion VL2"a and a second portion VL2"b physically separated from each other by the component area CA. The first portion VL2"a of the second voltage line VL2" may be connected to one side of the second initializing voltage supply line 12, and the second portion VL2"b of the second voltage line VL2" may be connected to the other end of the second initializing voltage supply line 12.

The first pixel circuit PC1, the second pixel circuit PC2, and the third pixel circuit PC3 arranged on the same row may be connected to a first scan line SWL1". The first scan line SWL1" may extend in the row direction (for example, the ±x direction) and may at least partially overlap the first area AR1 and the middle area MA.

The first scan line SWL1" may have a first portion SWL1"*a* and a second portion SWL1"*b* physically separated from each other by the component area CA. The first portion SWL1"*a* of the first scan line SWL1" may be connected to a gate driving circuit arranged on one side of the peripheral area PA, and the second portion SWL1"*b* of the first scan line SWL1" may be connected to a gate driving circuit arranged on the other side of the peripheral area PA.

The first scan line SWL1" may sequentially transmit a first scan signal to the first pixel circuit PC1, the second pixel circuit PC2, and the third pixel circuit PC3 arranged on the same row. In synchronization with the first scan signal transmitted by the first scan line SWL1", the first initializing voltage VINT1 may be applied to the gate of the first driving transistor of the first pixel circuit PC1 or may be applied to the anode of the first display element DE1. In synchronization with the first scan signal transmitted by the first scan line SWL1", the second initializing voltage VINT2 may be applied to the gate of the second driving transistor of the second pixel circuit PC2 or may be applied to the anode of the second display element DE2. In synchronization with the first scan signal transmitted by the first scan line SWL1", the second initializing voltage VINT2 may be applied to the gate of the third driving transistor of the third pixel circuit PC3 or may be applied to the anode of the third display element DE3.

As such, the first initializing voltage VINT1 and the second initializing voltage VINT2 having different levels may be applied to the first pixel circuit PC1 and the second pixel circuit PC2 having different sizes, and the same second initializing voltage VINT2 may be applied to the second pixel circuit PC2 and the third pixel circuit PC3 having the same sizes.

Figure 19:
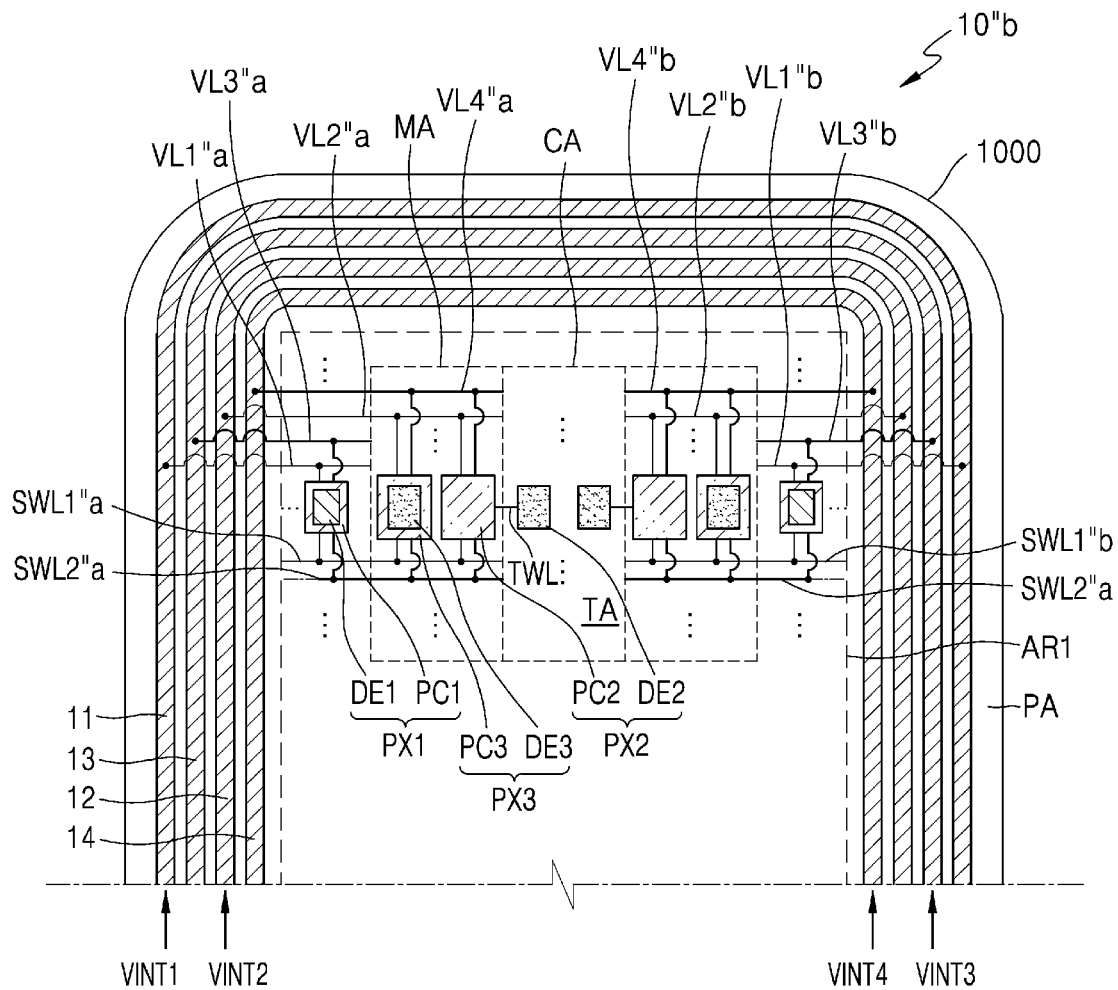
FIG. 19 is a schematic plan view of a display panel that may be included in the display apparatus of FIG. 16, according to another embodiment.
Figure 19:
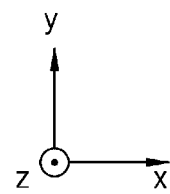

FIG. 19 is a schematic plan view of a display panel 10"*b* that may be included in the display apparatus 1" of FIG. 16, according to another embodiment. FIG. 19 is a modification of FIG. 18, and is thus different therefrom in the structures of voltage wiring and an initializing voltage supply line. Hereinafter, overlapping contents therebetween will be replaced with the description of FIG. 18, and the differences will be mainly described for sake of brevity.

Referring to FIG. 19, a third initializing voltage supply line 13 and a fourth initializing voltage supply line 14 may be further arranged in the peripheral area PA of the display panel 10"*b*. Each of the third initializing voltage supply line 13 and the fourth initializing voltage supply line 14 may have a loop shape of which one side is open, and may partially surround the display area DA.

The first pixel circuit PC1 of the first pixel PX1 may be connected to the third initializing voltage supply line 13 via a third voltage line VL3" to receive the first initializing voltage VINT3. The third voltage line VL3" may extend in the row direction (for example, the ±x direction) and may at least partially overlap the first area AR1.

The third voltage line VL3" may have a first portion VL3"*a* and a second portion VL3"*b* physically separated from each other by the second area AR2. The first portion VL3"*a* of the third voltage line VL3" may be connected to one side of the third initializing voltage supply line 13, and the second portion VL3"*b* of the third voltage line VL3" may be connected to the other end of the third initializing voltage supply line 13.

The second pixel circuit PC2 of the second pixel PX2 and the third pixel circuit PC3 of the third pixel PX3 may be connected to the fourth initializing voltage supply line 14 via a fourth voltage line VL4" to receive the fourth initializing voltage VINT4. The fourth voltage line VL4" may extend in the row direction (for example, the ±x direction) and may at least partially overlap the first area AR1 and the middle area MA.

The fourth voltage line VL4" may have a first portion VL4"*a* and a second portion VL4"*b* physically separated from each other by the component area CA. The first portion VL4"*a* of the fourth voltage line VL4" may be connected to one side of the fourth initializing voltage supply line 14, and the second portion VL4"*b* of the fourth voltage line VL4" may be connected to the other end of the fourth initializing voltage supply line 14.

The first pixel circuit PC1, the second pixel circuit PC2, and the third pixel circuit PC3 arranged on the same row may be connected to a second scan line SWL2". The second scan line SWL2" may sequentially transmit a second scan signal to the first pixel circuit PC1, the second pixel circuit PC2, and the third pixel circuit PC3 arranged on the same row. The second scan line SWL2" may extend in the row direction (for example, the ±x direction) and may at least partially overlap the first area AR1 and the middle area MA.

The second scan line SWL2" may have a first portion SW21"*a* and a second portion SWL2"*b* physically separated from each other by the component area CA. The first portion SWL2"*a* of the second scan line SWL2" may be connected to a gate driving circuit arranged on one side of the peripheral area PA, and the second portion SWL2"*b* of the second scan line SWL2" may be connected to a gate driving circuit arranged on the other side of the peripheral area PA.

The first initializing voltage VINT1 may be applied to the gate of the first driving transistor of the first pixel circuit PC1 in synchronization with the first scan signal transmitted by the first scan line SWL1", and may be applied to the anode of the first display element DE1 in synchronization with the second scan signal transmitted by the second scan line SWL2". The second initializing voltage VINT2 may be applied to the gate of the second driving transistor of the second pixel circuit PC2 in synchronization with the first scan signal transmitted by the first scan line SWL1", and may be applied to the anode of the second display element DE2 in synchronization with the second scan signal transmitted by the second scan line SWL2". The second initializing voltage VINT2 may be applied to the gate of the third driving transistor of the third pixel circuit PC3 in synchronization with the first scan signal transmitted by the first scan line SWL1", and may be applied to the anode of the third display element DE3 in synchronization with the second scan signal transmitted by the second scan line SWL2".

As such, the first initializing voltage VINT1 and the second initializing voltage VINT2 having different levels, and the third initializing voltage VINT3 and the fourth initializing voltage VINT4 having different levels may be applied to the first pixel circuit PC1 and the second pixel circuit PC2 having different sizes, and the second initializing voltage VINT2 and the fourth initializing voltage VINT4 may be applied to the second pixel circuit PC2 and the third pixel circuit PC3 having the same sizes.

Figure 20:
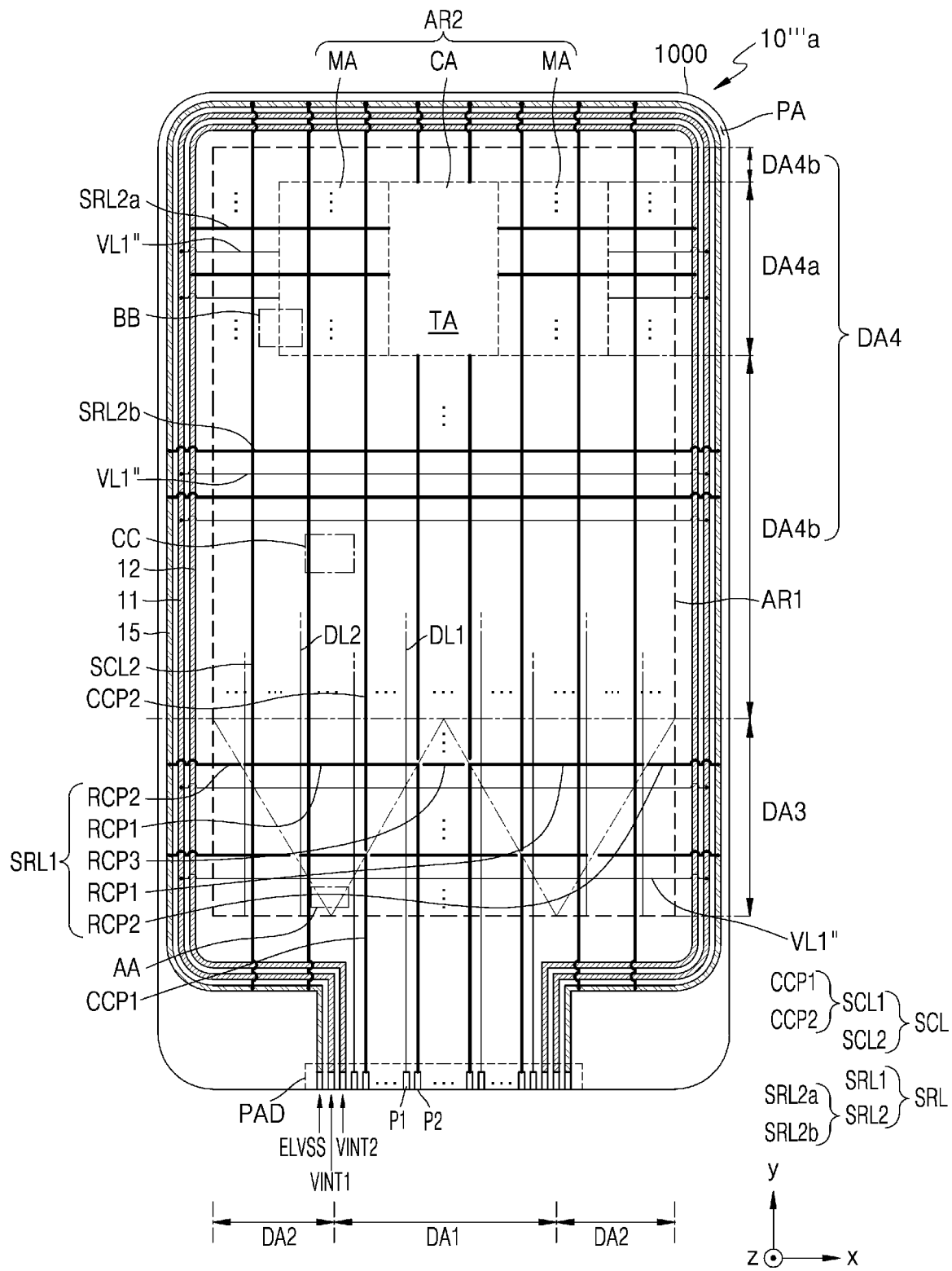
FIG. 20 is a schematic plan view of a display panel that may be included in the display apparatus of FIG. 16, according to another embodiment.
Figure 21:
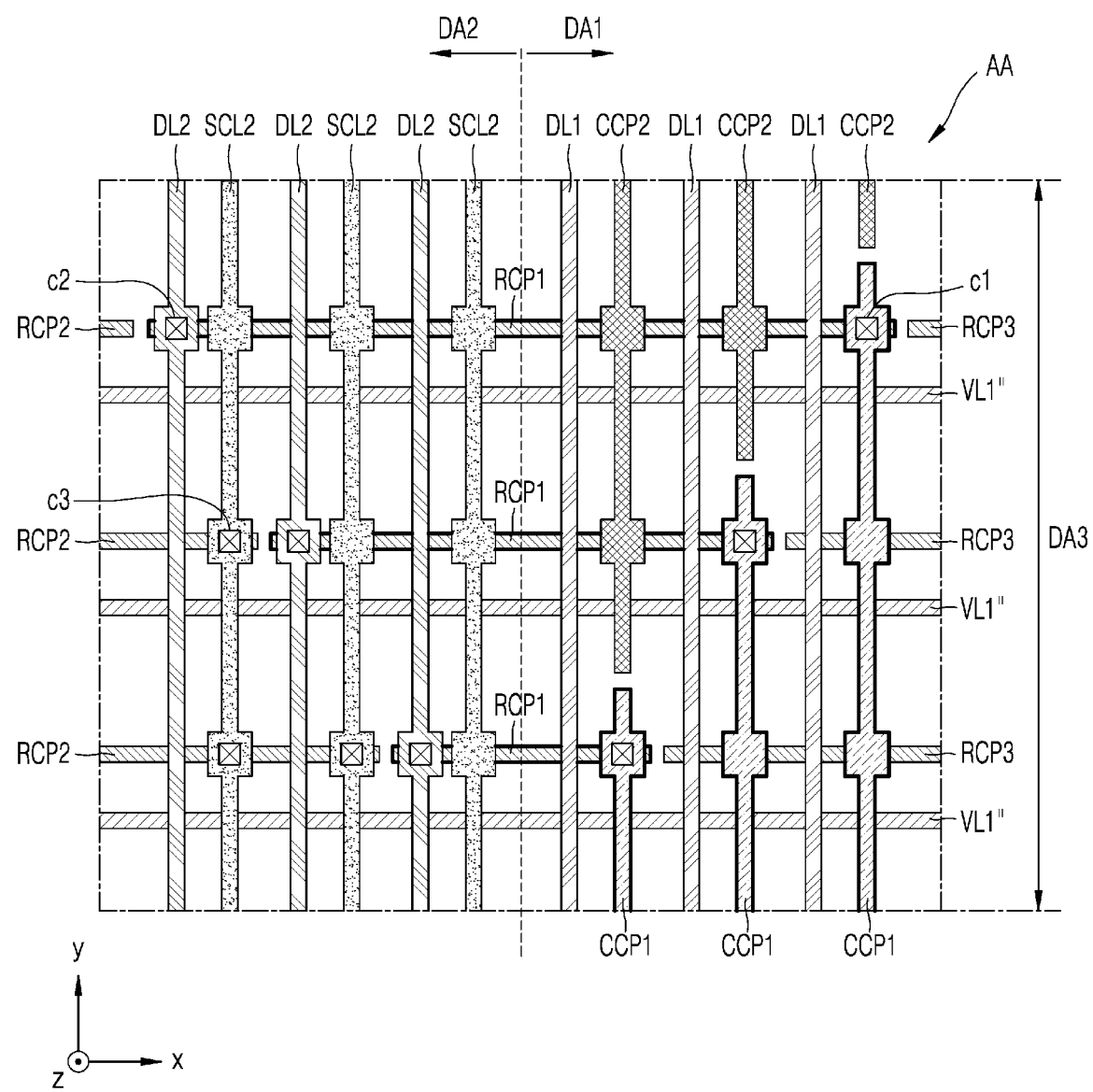
FIG. 21 is a magnified schematic plan view of a portion of the display panel of FIG. 20.
Figure 22:
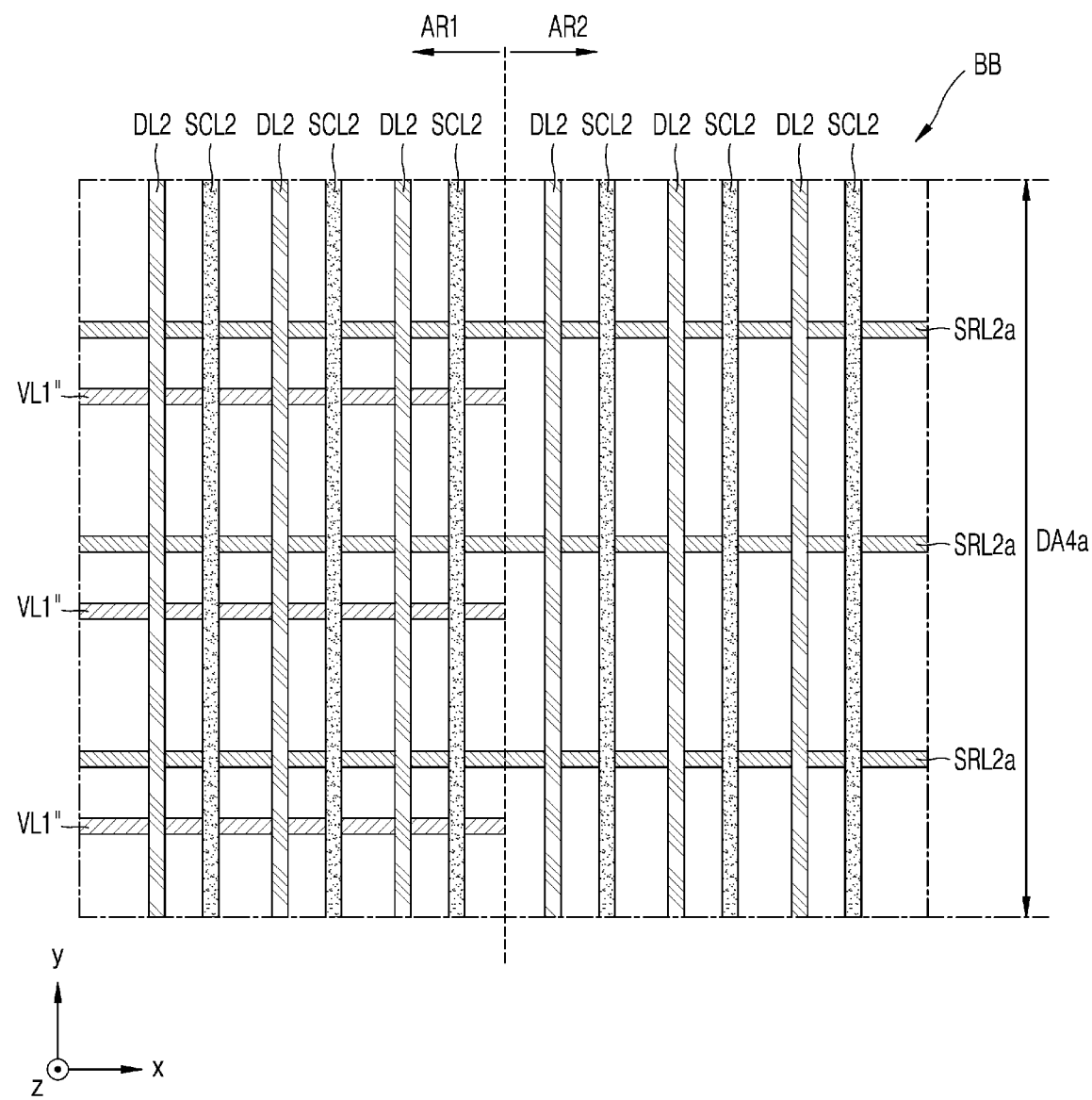
FIG. 22 is a magnified schematic plan view of another portion of the display panel of FIG. 20.
Figure 23:
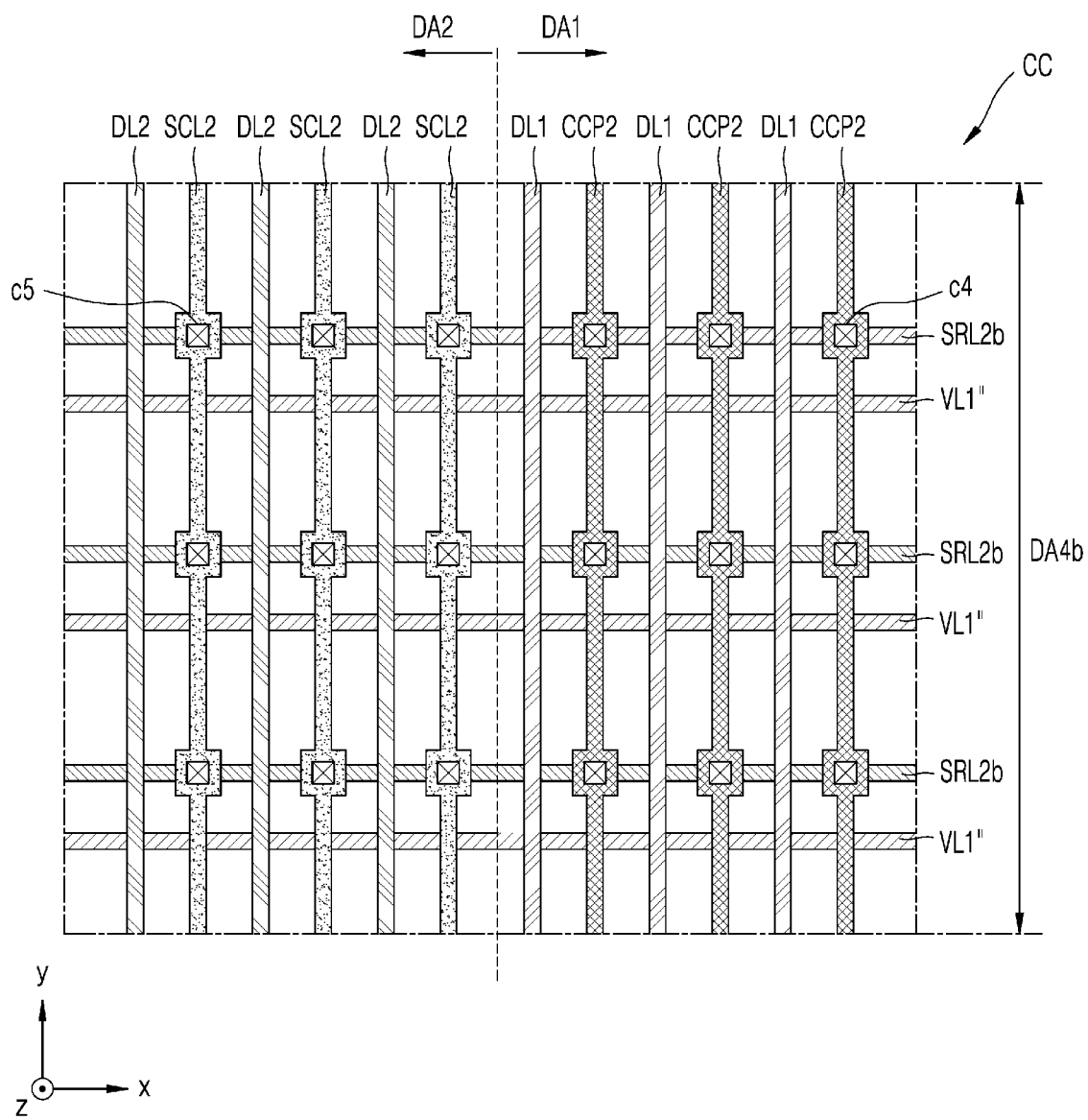
FIG. 23 is a magnified schematic plan view of another portion of the display panel of FIG. 20.

FIG. 20 is a schematic plan view of a display panel 10'"*a* that may be included in the display apparatus 1" of FIG. 16, according to another embodiment. FIG. 21 is a magnified schematic plan view of a portion AA of the display panel 10'''*a* of FIG. 20, FIG. 22 is a magnified schematic plan view of a portion BB of the display panel 10'''*a* of FIG. 20, and FIG. 23 is a magnified schematic plan view of a portion CC of the display panel 10'''*a* of FIG. 20. FIG. 20 is a modification of FIG. 18, and is thus different therefrom in the structures of an auxiliary column line and an auxiliary row line. Hereinafter, overlapping contents therebetween will be replaced with the description of FIG. 18, and the differences will be mainly described for sake of brevity.

Referring to FIG. 20, the display panel 10'''*a* may include a driving voltage supply line 15 arranged in the peripheral area PA. The driving voltage supply line 15 may have a loop shape of which one side is open, and may partially surround the display area DA. The second driving voltage ELVSS received from the display driving unit 22 of FIG. 11 may be applied to the driving voltage supply line 15. In other words, the display driving unit 22 may supply the second driving voltage ELVSS to the driving voltage supply line 15.

The display panel 10'''*a* may include a plurality of data lines DL, a plurality of first voltage lines VL1", a plurality of auxiliary row lines SRL, and a plurality of auxiliary column lines SCL. Some of the plurality of data lines DL may be referred to as first data lines DL1, and the others may be referred to as second data lines DL2. Some of the plurality of auxiliary row lines SRL may be referred to as first auxiliary row lines (also referred to herein as "a first set of the plurality of auxiliary row lines") SRL1, and the others may be referred to as second auxiliary row lines (also referred to herein as "a second set of the plurality of auxiliary row lines") SRL2. Some of the plurality of auxiliary column lines SCL may be referred to as first auxiliary column lines (also referred to herein as "a first set of the plurality of auxiliary column lines") SCL1, and the others may be referred to as second auxiliary column lines (also referred to herein as "a second set of the plurality of auxiliary column lines") SCL2.

A first display area DA1, and second display areas DA2 located on both sides of the first display area DA1 in the second direction (for example, the ±x direction) may be defined in the substrate 1000. A third display area DA3 and a fourth display area DA4 divided in the second direction (for example, the ±x direction) may be defined in the substrate 1000. The fourth display area DA4 may include a (4-1)$^{st}$ display area DA4*a* including the second area AR2, and (4-2)$^{nd}$ display areas DA4*b* located on both sides of the (4-1)$^{st}$ display area DA4*a* in the first direction (for example, the ±y direction).

The first data lines DL1 may each extend on the first display area DA1 in the first direction (for example, the ±y direction) and may be connected to first pads P1, respectively. The second data lines DL2 may each extend on the second display areas DA2 in the first direction (for example, the ±y direction).

Each of the first voltage lines VL1" may extend in the second direction (for example, the ±x direction) on the first display area DA1 and the second display areas DA2. At least some of the first voltage lines VL1" may have a plurality of portions spaced apart from each other by the second area AR2.

As described above with reference to FIG. 18, the first voltage lines VL1" may be connected to the first initializing voltage supply line 11 to receive the first initializing voltage VINT1. The first voltage lines VL1" may be connected to pixel circuits arranged in the first area AR1 to transmit the first initializing voltage VINT1 to the pixel circuits.

The first auxiliary row lines SRL1, which are some of the plurality of auxiliary column lines SCL, may be arranged on the third display area DA3. Each of the first auxiliary row lines SRL1 may include first row connection portions RCP1, second row connection portions RCP2, and a third row connection portion RCP3. The first row connection portions RCP1, the second row connection portions RCP2, and the third row connection portion RCP3 may be spaced apart from one another. The third row connection portion RCP3 may be arranged between the first row connection portions RCP1, and each of the first row connection portions RCP1 may be arranged between a second row connection portion RCP2 and a third row connection portion RCP3. Each of the first row connection portions RCP1, the second row connection portions RCP2, and the third row connection portion RCP3 may extend on the third display area DA3 in the second direction (for example, the ±x direction).

According to an embodiment, one end of each of the first row connection portions RCP1 may be connected to a first column connection portion CCP1, which will be described later, and the other end of each of the first row connection portions RCP1 may be connected to a second data line DL2. For example, as shown in FIG. 21, respective one ends of the first row connection portions RCP1 may be connected to the first column connection portions CCP1 via first connectors c1, and respective other ends of the first row connection portions RCP1 may be connected to second data lines DL2 via second connectors c2. The first connectors c1 and the second connectors c2 may be portions buried in contact holes formed in an insulating layer to connect an upper layer to a lower layer, or may be portions that connect one line and another line formed on the same layer to each other. Each of the first column connection portions CCP1 may be connected to a second pad P2 to receive an electrical signal. Accordingly, each of the second data lines DL2 may receive the electrical signal via each of the first row connection portions RCP1 connected with each of the first column connection portions CCP1.

According to an embodiment, the second driving voltage ELVSS may be applied to the second row connection portions RCP2. For example, as shown in FIG. 20, respective one ends of the second row connection portions RCP2 may be connected to the driving voltage supply line 15. Also/alternatively, as shown in FIG. 21, the second row connection portions RCP2 may be connected to second auxiliary column lines SCL2 to which the second driving voltage ELVSS is applied, via third connectors c3. The third connectors c3 may be portions buried in contact holes formed in an insulating layer to connect an upper layer to a lower layer, or may be portions that connect one line and another line formed on the same layer to each other.

In FIGS. 20 and 21, the second driving voltage ELVSS is applied to the second row connection portions RCP2. However, according to another embodiment, the first driving voltage ELVDD of FIG. 1 having a different level from the second driving voltage ELVSS may be applied to the second row connection portions RCP2. For example, the second row connection portions RCP2 may be connected to power lines to which the first driving voltage ELVDD is applied, via connectors.

According to an embodiment, the first driving voltage ELVDD or the second driving voltage ELVSS may be applied to the third row connection portions RCP3. For example, the third row connection portions RCP3 may be connected to the power lines to which the first driving voltage ELVDD is applied, via the connectors.

The second auxiliary row lines SRL2, which are the others of the auxiliary row lines SRL, may each extend on the fourth display area DA4 in the second direction (for example, the ±x direction). $(2\text{-}1)^{st}$ auxiliary row lines (also referred to herein as "a first subset of the second set of the plurality of auxiliary row lines") SRL2a, which are some of the second auxiliary row lines SRL2, may be arranged on the $(4\text{-}1)^{st}$ display area DA4a, and $(2\text{-}2)^{nd}$ auxiliary row lines (also referred to herein as "a second subset of the second set of the plurality of auxiliary row lines") SRL2b, which are the others of the second auxiliary row lines SRL2, may be arranged on the $(4\text{-}2)^{nd}$ display area DA4b. The $(2\text{-}1)^{st}$ auxiliary row lines SRL2a may have a plurality of portions spaced apart from one another by the component area CA of the second area AR2.

According to an embodiment, the second initializing voltage VINT2 may be applied to the $(2\text{-}1)^{st}$ auxiliary row lines SRL2a. For example, as shown in FIG. 20, the $(2\text{-}1)^{st}$ auxiliary row lines SRL2a may be connected to the second initializing voltage supply line 12 to receive the second initializing voltage VINT2. The $(2\text{-}1)^{st}$ auxiliary row lines SRL2a may be connected to pixel circuits arranged in the middle area MA of the second area AR2 to transmit the second initializing voltage VINT2 to the pixel circuits. The $(2\text{-}1)^{st}$ auxiliary row lines SRL2a may correspond to the second voltage lines VL2" described above with reference to FIG. 18. In other words, the second voltage lines VL2" may be omitted. In this case, even when no special voltage lines for transmitting the second initializing voltage VINT2 to the pixel circuits arranged in the middle area MA of the second area AR2 are arranged, the $(2\text{-}1)^{st}$ auxiliary row lines SRL2a may be utilized to transmit the second initializing voltage VINT2 to the pixel circuits.

Because the second initializing voltage VINT2 needs to be applied to the $(2\text{-}1)^{st}$ auxiliary row lines SRL2a, the $(2\text{-}1)^{st}$ auxiliary row lines SRL2a may not be connected to the second column connection portions CCP2 of the first auxiliary column lines SCL1 and/or the second auxiliary column lines SCL2, to which the second driving voltage ELVSS is applied, as shown in FIGS. 20 and 22.

According to an embodiment, the second driving voltage ELVSS may be applied to the $(2\text{-}2)^{nd}$ auxiliary row lines SRL2b. For example, as shown in FIG. 20, respective both ends of the $(2\text{-}2)^{nd}$ auxiliary row lines SRL2b may be connected to the driving voltage supply line 15. Also/alternatively, as shown in FIG. 23, the $(2\text{-}2)^{nd}$ auxiliary row lines SRL2b may be connected to the second column connection portions CCP2 of the first auxiliary column lines SCL1, to which the second driving voltage ELVSS is applied, via fourth connectors c4. Also/alternatively, the $(2\text{-}2)^{nd}$ auxiliary row lines SRL2b may be connected to the second auxiliary column lines SCL2 to which the second driving voltage ELVSS is applied, via fifth connectors c5. The fourth connectors c4 and the fifth connectors c5 may be portions buried in contact holes formed in an insulating layer to connect an upper layer to a lower layer, or may be portions that connect one line and another line formed on the same layer to each other.

In FIGS. 20 and 23, the second driving voltage ELVSS is applied to the $(2\text{-}2)^{nd}$ auxiliary row lines SRL2b. However, according to another embodiment, the first driving voltage ELVDD may be applied to the $(2\text{-}2)^{nd}$ auxiliary row lines SRL2b. For example, the $(2\text{-}2)^{nd}$ auxiliary row lines SRL2b may be connected to power lines to which the first driving voltage ELVDD is applied, via connectors.

The first auxiliary column lines SCL1, which are some of the plurality of auxiliary column lines SCL, may be arranged on the first display area DA1. Each of the first auxiliary column lines SCL1 may have a first column connection portion CCP1 and a second column connection portion CCP2. The first column connection portions CCP1 and the second column connection portions CCP2 may each extend on the first display area DA1 in the first direction (for example, the ±y direction). The second column connection portions CCP2 may be spaced apart from the first column connection portions CCP1, respectively. The first column connection portions CCP1 may be connected to the second pads P2, respectively. As described above, the first column connection portion CCP1 may be connected to the first row connection portion RCP1.

According to an embodiment, the second driving voltage ELVSS may be applied to the second column connection portions CCP2. For example, as shown in FIG. 20, respective one ends of the second column connection portions CCP2 may be connected to the driving voltage supply line 15. Also/alternatively, as shown in FIG. 23, the second column connection portions CCP2 may be connected to the $(2\text{-}2)^{nd}$ auxiliary row lines SRL2b via fourth connectors c4.

In FIGS. 20 and 23, the second driving voltage ELVSS is applied to the second column connection portions CCP2. However, according to another embodiment, the first driving voltage ELVDD may be applied to the second column connection portions CCP2. For example, the second column connection portions CCP2 may be connected to power lines to which the first driving voltage ELVDD is applied, via connectors. Also/alternatively, respective one ends of the second column connection portions CCP2 may be connected to voltage supply lines for supplying the first driving voltage ELVDD. The voltage supply lines may be arranged in the peripheral area PA.

The second auxiliary column lines SCL2, which are some of the auxiliary column lines SCL, may each extend on the second display area DA2 in the first direction (for example, the ±y direction). Respective both ends of the second auxiliary column lines SCL2 may be connected to the driving voltage supply line 15. The second auxiliary column lines SCL2 may be connected to the driving voltage supply line 15 to receive the second driving voltage ELVSS.

In FIG. 20, the second driving voltage ELVSS is applied to the second auxiliary column lines SCL2. However, according to another embodiment, the first driving voltage ELVDD may be applied to the second auxiliary column lines SCL2. For example, the second auxiliary column lines SCL2 may be connected to power lines to which the first driving voltage ELVDD is applied, via connectors. Also/alternatively, respective one ends of the second auxiliary column lines SCL2 may be connected to voltage supply lines for supplying the first driving voltage ELVDD. The voltage supply lines may be arranged in the peripheral area PA.

To increase a display area of the display panel 10'''a, the width of the driving voltage supply line 15 arranged in the peripheral area PA may be reduced. Heat generation due to a current concentrated in the driving voltage supply line 15 having a reduced width may occur in the display panel 10'''a. However, when the second row connection portion RCP2 of the first auxiliary row line SRL1, the second auxiliary row line SRL2, the second column connection portion CCP2 of the first auxiliary column line SCL1, and the second auxiliary column line SCL2b are electrically connected to the driving voltage supply line 15 as in an embodiment, the current may be distributed through lines having a grid shape (or a mesh structure). Consequently, heat generation due to a reduction in the width of the driving voltage supply line 15 may be prevented.

Figure 24:
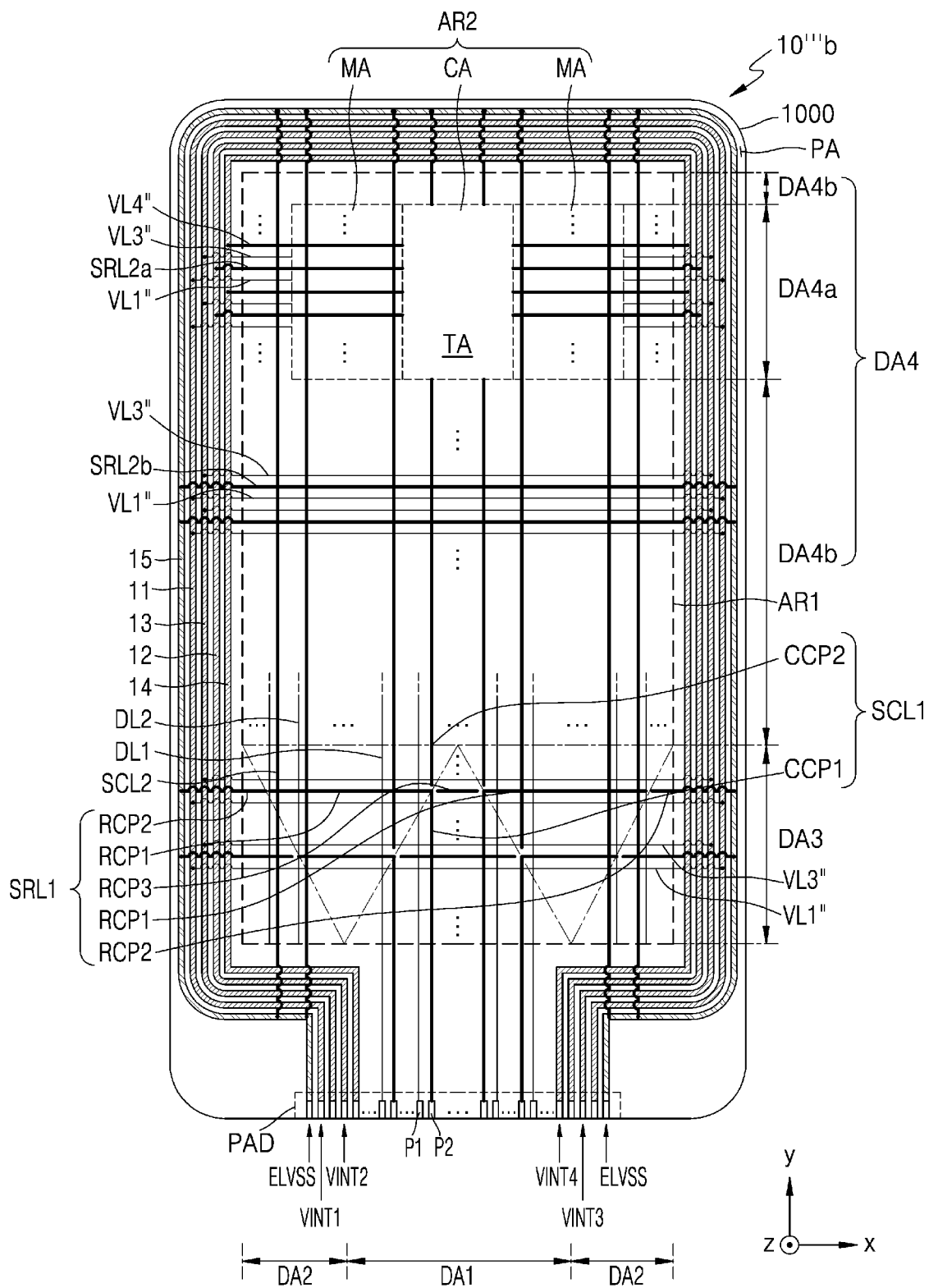
FIG. 24 is a schematic plan view of a display panel that may be included in the display apparatus of FIG. 16, according to another embodiment.
Figure 25:
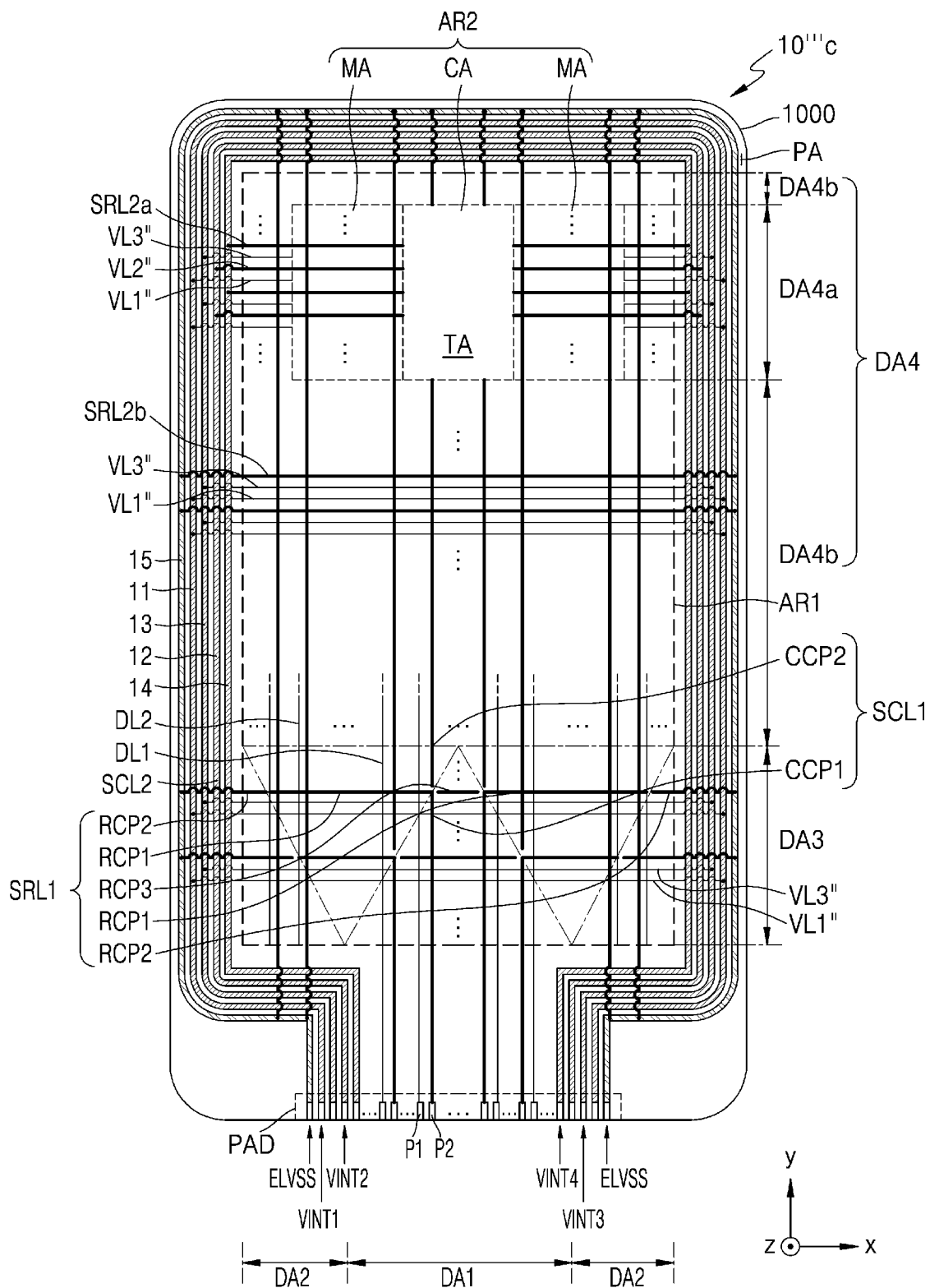
FIG. 25 is a schematic plan view of a display panel that may be included in the display apparatus of FIG. 16, according to another embodiment.

FIGS. 24 and 25 are schematic plan view of display panels 10'''b and 10'''c that may be included in the display apparatus 1" of FIG. 16, according to other embodiments. FIGS. 24 and 25 are modifications of FIGS. 19 and 20, and thus are different from FIGS. 19 and 20 in the structure of a $(2\text{-}1)^{st}$ auxiliary row line. Hereinafter, overlapping contents therebetween will be replaced with the description of FIGS. 19 and 20, and the differences will be mainly described for sake of brevity.

First, referring to FIG. 24, the second initializing voltage VINT2 that is used to initialize the gate of a driving transistor may be applied to the $(2\text{-}1)^{st}$ auxiliary row lines SRL2a. For example, the $(2\text{-}1)^{st}$ auxiliary row lines SRL2a may be connected to the second initializing voltage supply line 12 to receive the second initializing voltage VINT2. The $(2\text{-}1)^{st}$ auxiliary row lines SRL2a may be connected to pixel circuits arranged in the middle area MA of the second area AR2 to transmit the second initializing voltage VINT2 to the pixel circuits. The $(2\text{-}1)^{st}$ auxiliary row lines SRL2a may correspond to the second voltage lines VL2" described above with reference to FIGS. 18 and 19. In other words, the second voltage lines VL2" may be omitted. In this case, even when no special voltage lines for transmitting the second initializing voltage VINT2 to the pixel circuits arranged in the middle area MA of the second area AR2 are arranged, the $(2\text{-}1)^{st}$ auxiliary row lines SRL2a may be utilized to transmit the second initializing voltage VINT2 to the pixel circuits.

In FIG. 24, the second initializing voltage VINT2 is applied to the $(2\text{-}1)^{st}$ auxiliary row lines SRL2a. However, according to another embodiment, as shown in FIG. 25, the fourth initializing voltage VINT4 for use in initializing the anode of a display element may be applied to the $(2\text{-}1)^{st}$ auxiliary row lines SRL2a. For example, the $(2\text{-}1)^{st}$ auxiliary row lines SRL2a may be connected to the second initializing voltage supply line 14 to receive the fourth initializing voltage VINT4. The $(2\text{-}1)^{st}$ auxiliary row lines SRL2a may be connected to pixel circuits arranged in the middle area MA of the second area AR2 to transmit the fourth initializing voltage VINT4 to the pixel circuits. The $(2\text{-}1)^{st}$ auxiliary row lines SRL2a may correspond to the fourth voltage lines VL4" described above with reference to FIG. 19. In other words, the fourth voltage lines VL4" may be omitted. In this case, even when no special voltage lines for transmitting the fourth initializing voltage VINT4 to the pixel circuits arranged in the middle area MA of the second area AR2 are arranged, the $(2\text{-}1)^{st}$ auxiliary row lines SRL2a may be utilized to transmit the fourth initializing voltage VINT4 to the pixel circuits.

As shown in FIGS. 24 and 25, at least some of the auxiliary row lines SRL may be utilized to transmit the second initializing voltage VINT2 or the fourth initializing voltage VINT4 to the pixel circuits arranged in the middle area MA of the second area AR2. In this case, because no special voltage lines for transmitting the second initializing voltage VINT2 or the fourth initializing voltage VINT4 to the pixel circuits arranged in the middle area MA of the second area AR2 are arranged, the number of display elements arranged per unit area may further increase. Thus, a display panel having high resolution may be realized.

Although only a display apparatus has been described above, embodiments are not limited thereto. For example, a method of manufacturing such a display apparatus also belongs to the scope of the disclosure.

According to various embodiments, visual recognition of flicking may be prevented by applying initializing voltages having different levels to pixels arranged in display areas having different resolutions. Accordingly, a defect may be prevented from occurring in the display apparatus. Of course, the scope of the disclosure is not limited thereto.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a first pixel circuit;
    a first display element connected to the first pixel circuit;
    a second pixel circuit; and
    a second display element connected to the second pixel circuit;
    a substrate in which a first area and a second area are defined, the second area being at least partially surrounded by the first area;
    a first voltage line at least partially overlapping the first area and configured to transmit a first initializing voltage to the first pixel circuit; and
    a second voltage line at least partially overlapping the first area and the second area and configured to transmit a second initializing voltage to the second pixel circuit,
    wherein the first pixel circuit comprises:
        a first driving transistor configured to control a first current that flows to the first display element; and
        a first initializing transistor configured to apply the first initializing voltage to a gate of the first driving transistor in response to a first scan signal, and
    the second pixel circuit comprises:
        a second driving transistor configured to control a second current that flows to the second display element; and
        a second initializing transistor configured to apply the second initializing voltage having a level different from a level of the first initializing voltage to a gate of the second driving transistor in response to the first scan signal,
    wherein the first voltage line extends in a row direction and has a first portion and a second portion physically spaced apart from each other by the second area.

2. The display apparatus of claim 1, wherein a level of the first initializing voltage is higher than a level of the second initializing voltage.

3. The display apparatus of claim 1, wherein the first pixel circuit further comprises a third initializing transistor configured to apply a third initializing voltage to an anode of the first display element in response to a second scan signal, and the second pixel circuit further comprises a fourth initializing transistor configured to apply a fourth initializing voltage to an anode of the second display element in response to the second scan signal.

4. The display apparatus of claim 3, wherein a level of the third initializing voltage is higher than a level of the fourth initializing voltage.

5. The display apparatus of claim 3, wherein the first pixel circuit further comprises:
    a first scan transistor configured to transmit a first data voltage to the first driving transistor in response to a third scan signal;
    a first storage capacitor having a first electrode and a second electrode, the second electrode being connected to the gate of the first driving transistor; and a first compensating transistor configured to connect a drain of the first driving transistor to the gate of the first driving transistor in response to a fourth scan signal, and the second pixel circuit further comprises:
a second scan transistor configured to transmit a second data voltage to the second driving transistor in response to the third scan signal;
a second storage capacitor having a third electrode and a fourth electrode, the fourth electrode being connected to the gate of the second driving transistor; and
a second compensating transistor configured to connect a drain of the second driving transistor to the gate of the second driving transistor in response to the fourth scan signal.

6. The display apparatus of claim 5, wherein conductivity types of the first compensating transistor and the second compensating transistor are opposite to conductivity types of the first scan transistor and the second scan transistor, and are identical to conductivity types of the first initializing transistor and the second initializing transistor.

7. The display apparatus of claim 5, wherein the third scan signal and the fourth scan signal are substantially synchronized with each other.

8. The display apparatus of claim 1, wherein conductivity types of the first initializing transistor and the second initializing transistor are the same as each other and are opposite to conductivity types of the first driving transistor and the second driving transistor which are the same as each other.

9. The display apparatus of claim 1, wherein an emission area of the second display element is greater than an emission area of the first display element.

10. The display apparatus of claim 1, wherein the first display element and the second display element are each provided in plurality, and
a number of first display elements per unit area is greater than a number of second display elements per unit area.

11. The display apparatus of claim 1, wherein the second voltage line includes: a first portion surrounding at least a portion of the second area; and a second portion connected to the first portion and extending in a row direction,
the first portion of the second voltage line overlaps the first area, and
the second portion of the second voltage line overlaps the second area.

12. The display apparatus of claim 1, further comprising:
a third pixel circuit; and
a third display element connected to the third pixel circuit, wherein the third pixel circuit comprises:
a third driving transistor configured to control a third current that flows to the third display element; and
a third initializing transistor configured to apply the second initializing voltage to a gate of the third driving transistor in response to the first scan signal, and
wherein in a plan view, the second pixel circuit and the second display element are spaced apart from each other, and the third pixel circuit and the third display element at least partially overlap each other.

13. The display apparatus of claim 12,
wherein the second area comprises a component area and a middle area, the middle area being located between the first area and the component area,
the first pixel circuit and the first display element are arranged on the first area, the second display element is arranged on the component area of the second area, and
the second pixel circuit, the third pixel circuit, and the third display element are arranged on the middle area of the second area.

14. The display apparatus of claim 12, wherein the first pixel circuit further comprises a fourth initializing transistor configured to apply a third initializing voltage to an anode of the first display element in response to a second scan signal,
the second pixel circuit further comprises a fifth initializing transistor configured to apply a fourth initializing voltage to an anode of the second display element in response to the second scan signal, and
the third pixel circuit further comprises a sixth initializing transistor configured to apply the fourth initializing voltage to an anode of the third display element in response to the second scan signal.

15. The display apparatus of claim 14, wherein a level of the third initializing voltage is higher than a level of the fourth initializing voltage.

16. The display apparatus of claim 12, wherein an emission area of
the third display element is equal to an emission area of the second display element, and
the emission area of the third display element is greater than an emission area of the first display element.

17. The display apparatus of claim 12, wherein the first display element, the second display element, and the third display element are each provided in plurality, and
a number of second display elements per unit area is equal to the number of third display elements per unit area, and
a number of first display elements per unit area is greater than the number of second display elements per unit area.

18. A display apparatus comprising:
a first pixel circuit;
a first display element connected to the first pixel circuit;
a second pixel circuit;
a second display element connected to the second pixel circuit;
a substrate in which a first display area, second display areas located on both sides of the first display area in a row direction, and a peripheral area around the first and second display areas are defined;
a pad portion arranged in the peripheral area and comprising a plurality of first pads and a plurality of second pads;
a plurality of first data lines each extending on the first display area in a column direction and connected to the plurality of first pads, respectively;
a plurality of second data lines each extending on the second display areas in the column direction;
a plurality of auxiliary row lines each extending on the first display area and the second display areas in the row direction; and
a plurality of auxiliary column lines each extending on the first display area and the second display areas in the column direction;
wherein the first pixel circuit comprises:
a first driving transistor configured to control a first current that flows to the first display element; and
a first initializing transistor configured to apply a first initializing voltage to a gate of the first driving transistor in response to a first scan signal, and
the second pixel circuit comprises:

a second driving transistor configured to control a second current that flows to the second display element; and a second initializing transistor configured to apply a second initializing voltage having a level different from a level of the first initializing voltage to a gate of the second driving transistor in response to the first scan signal, wherein a first set of the plurality of auxiliary column lines have first column connection portions respectively connected to the plurality of second pads, a first set of the plurality of auxiliary row lines have first row connection portions respectively connecting the first column connection portions of the first set of the plurality of auxiliary column lines to the plurality of second data lines, the second initializing voltage is applied to at least a second set of the plurality of auxiliary row lines, and a driving voltage is applied to a second set of the plurality of auxiliary column lines.

19. The display apparatus of claim 18, wherein the second initializing voltage is applied to a first subset of the second set of the plurality of auxiliary row lines, and the driving voltage is applied to a second subset of the second set of the plurality of auxiliary row lines.

20. The display apparatus of claim 18, wherein the first set of the plurality of auxiliary column lines have second column connection portions to which the driving voltage is applied, respectively, and the second column connection portions of the first set of the plurality of auxiliary column lines are spaced apart from the first column connection portions of the first set of the plurality of auxiliary column lines, respectively.

21. The display apparatus of claim 18, wherein the first set of the plurality of auxiliary row lines have second row connection portions to which the driving voltage is applied, respectively, and the second row connection portions of the first set of the plurality of auxiliary row lines are spaced apart from the first row connection portions of the first set of the plurality of auxiliary row lines, respectively.

22. A display apparatus comprising:
a first pixel circuit;
a first display element connected to the first pixel circuit;
a second pixel circuit; and
a second display element connected to the second pixel circuit;
a substrate in which a first area and a second area are defined, the second area being at least partially surrounded by the first area;
a first voltage line at least partially overlapping the first area and configured to transmit a first initializing voltage to the first pixel circuit; and
a second voltage line at least partially overlapping the first area and the second area and configured to transmit a second initializing voltage to the second pixel circuit,
wherein the first pixel circuit comprises a first initializing transistor configured to apply the first initializing voltage to an anode of the first display element in response to a first scan signal, and
the second pixel circuit comprises a second initializing transistor configured to apply the second initializing voltage to an anode of the second display element in response to the first scan signal, and
wherein the first voltage line extends in a row direction and has a first portion and a second portion physically spaced apart from each other by the second area.

23. The display apparatus of claim 22, wherein a level of the first initializing voltage is higher than a level of the second initializing voltage.

24. The display apparatus of claim 22, wherein the first pixel circuit further comprises:
a first driving transistor configured to control a first current that flows to the first display element;
a first scan transistor configured to transmit a first data voltage to the first driving transistor in response to a second scan signal; and
a first storage capacitor having a first electrode and a second electrode, the second electrode being connected to a gate of the first driving transistor, and
the second pixel circuit further comprises:
a second driving transistor configured to control a second current that flows to the second display element;
a second scan transistor configured to transmit a second data voltage to the second driving transistor in response to the second scan signal; and
a second storage capacitor having a third electrode and a fourth electrode, the fourth electrode being connected to a gate of the second driving transistor.

25. The display apparatus of claim 22, wherein an emission area of the second display element is greater than an emission area of the first display element.

26. The display apparatus of claim 22, wherein the first display element and the second display element are each provided in plurality, and
the number of first display elements per unit area is greater than the number of second display elements per unit area.

27. The display apparatus of claim 22, wherein the second voltage line includes:
a first portion surrounding at least a portion of the second area; and
a second portion connected to the first portion and extending in a row direction,
the first portion of the second voltage line overlaps the first area, and
the second portion of the second voltage line overlaps the second area.

28. The display apparatus of claim 22, further comprising:
a third pixel circuit; and
a third display element connected to the third pixel circuit,
wherein the third pixel circuit comprises a third initializing transistor configured to apply the second initializing voltage to an anode of the third display element in response to the first scan signal, and,
in a plan view, the second pixel circuit and the second display element are spaced apart from each other, and the third pixel circuit and the third display element at least partially overlap each other.

29. The display apparatus of claim 28,
wherein the second area comprises a component area and a middle area, the middle area being located between the first area and the component area,
the first pixel circuit and the first display element are arranged on the first area,
the second display element is arranged on the component area of the second area, and
the second pixel circuit, the third pixel circuit, and the third display element are arranged on the middle area of the second area.

30. The display apparatus of claim 28, wherein an emission area of the third display element is equal to an emission area of the second display element, and the emission area of the third display element is greater than an emission area of the first display element.

31. The display apparatus of claim 28, wherein the first display element, the second display element, and the third display element are provided in plurality,
the number of second display elements per unit area is equal to the number of third display elements per unit area, and
the number of first display elements per unit area is greater than the number of second display elements per unit area.

32. A display apparatus comprising:
a first pixel circuit;
a first display element connected to the first pixel circuit;
a second pixel circuit; and
a second display element connected to the second pixel circuit;
a substrate in which a first display area, second display areas located on both sides of the first display area in a row direction, and a peripheral area around the first and second display areas are defined;
a pad portion arranged in the peripheral area and comprising a plurality of first pads and a plurality of second pads;
a plurality of first data lines each extending on the first display area in a column direction and connected to the plurality of first pads, respectively;
a plurality of second data lines each extending on the second display areas in the column direction;
a plurality of auxiliary row lines each extending on the first display area and the second display areas in the row direction; and
a plurality of auxiliary column lines each extending on the first display area and the second display areas in the column direction,
wherein the first pixel circuit comprises a first initializing transistor configured to apply a first initializing voltage to an anode of the first display element in response to a first scan signal,
wherein the second pixel circuit comprises a second initializing transistor configured to apply a second initializing voltage to an anode of the second display element in response to the first scan signal, and
wherein a first set of the plurality of auxiliary column lines have first column connection portions respectively connected to the plurality of second pads,
a first set of the plurality of auxiliary row lines have first row connection portions respectively connecting the first column connection portions of the first set of the plurality of auxiliary column lines to the plurality of second data lines,
the second initializing voltage is applied to at least a second set of the plurality of auxiliary row lines, and
a driving voltage is applied to a second set of the plurality of auxiliary column lines.

33. The display apparatus of claim 32, wherein the second initializing voltage is applied to a first subset of the second set of the plurality of second auxiliary row lines, and
the driving voltage is applied to a second subset of the second set of the plurality of second auxiliary row lines.

34. The display apparatus of claim 32, wherein the first set of the plurality of auxiliary column lines have second column connection portions to which the driving voltage is applied, respectively, and
the second column connection portions of the first set of the plurality of auxiliary column lines are spaced apart from the first column connection portions of the first set of the plurality of auxiliary column lines, respectively.

35. The display apparatus of claim 32, wherein the first set of the plurality of auxiliary row lines have second row connection portions to which the driving voltage is applied, respectively, and
the second row connection portions of the first set of the plurality of auxiliary row lines are spaced apart from the first row connection portions of the first set of the plurality of auxiliary row lines, respectively.

* * * * *